United States Patent [19]

Putatunda et al.

[11] Patent Number: 4,811,237

[45] Date of Patent: Mar. 7, 1989

[54] STRUCTURED DESIGN METHOD FOR GENERATING A MESH POWER BUS STRUCTURE IN HIGH DENSITY LAYOUT OF VLSI CHIPS

[75] Inventors: Rathindra N. Putatunda, Marlton; David C. Smith, Williamstown; Stephen A. McNeary, Somerville, all of N.J.

[73] Assignee: General Electric Company, Moorestown, N.J.

[21] Appl. No.: 65,998

[22] Filed: Jun. 24, 1987

[51] Int. Cl.$^4$ ............................................. G06F 15/46
[52] U.S. Cl. ................................... 364/491; 364/490; 364/489; 364/488
[58] Field of Search ................ 364/488, 489, 490, 491

[56] References Cited

U.S. PATENT DOCUMENTS

| | | | |
|---|---|---|---|
| H512 | 8/1988 | Borgini et al. | 357/42 |
| T935,003 | 6/1975 | Linville et al. | 364/490 |
| 3,617,714 | 11/1971 | Kernighan et al. | 235/150 |
| 3,653,072 | 3/1972 | Ballas et al. | 364/491 |
| 4,377,849 | 3/1983 | Finger et al. | 364/491 |
| 4,554,625 | 11/1984 | Otten | 364/491 |
| 4,577,276 | 3/1986 | Dunlop et al. | 364/491 |
| 4,584,653 | 4/1986 | Chih et al. | 364/491 |
| 4,593,363 | 6/1986 | Burstein et al. | 364/491 |
| 4,636,965 | 1/1987 | Smith et al. | 364/491 |
| 4,651,284 | 3/1987 | Watanabe | 364/491 |
| 4,656,592 | 4/1987 | Spaanenburg et al. | 364/490 |
| 4,688,072 | 8/1987 | Heath et al. | 364/491 |
| 4,698,760 | 10/1987 | Lembach et al. | 364/490 |

OTHER PUBLICATIONS

"Binary Decision Diagrams" by S. B. Akers, IEEE Transaction on Computers, vol. C-27, No. 6, Jun. 1978, pp. 509-516.
"Linear Ordering and Application to Placement" by Kang, published in conjunction with the ACM IEEE 20th Design Automation Conference, Jun. 27-29, 1983.
"A New Gridless Channel Router: Yet Another Channel Router the Second (YACR-II)" by Sangiiovanni--Vincentelli et al., published in conjunction with the IEEE International Conference on Computer Aided Design, Nov. 12-15, 1984.
"A Structured Design Method for High Diversity Standard Cell and Macrocell Layout of VLSI Chips", filed Jun. 19, 1987, R. N. Putatunda et al., copending patent application.
"The Genealogical Approach to the Layout Problem", by Szepieniec et al., published in conjunction with the 17th Design Automation Conference, Jun. 23-25, 1980.
"Happi: A Chip Compiler Based on Double-Level-Metal Technology" by Rathindra N. Putatunda et al., Design Automation Conference, Jun. 29, Jul. 2, 1986.
"Speeding Up Placement and Routing" by Naegale, p. 29 of the Jul. 10, 1986 issue of Electronics magazine.
"Happi: Fully Automatic Design for Submicron Subnanosecond IC Designs with from 50K to 400K Transistors", by Putatunda et al., published around Nov. 1985.

Primary Examiner—Parshotam S. Lall
Assistant Examiner—V. N. Trans
Attorney, Agent, or Firm—Clement A. Berard, Jr.; William H. Meise

[57] ABSTRACT

An automated LSI chip layout arrangement includes automated layout of the power bus distribution network. A complete interlocking mesh of buses is run in routing channels lying between groups of circuits to be powered. Each segment of the mesh powering net which affects the chip size is tested to see if it can be removed without adversely affecting the power distribution. If it can be removed, the segment is deleted. The next segment which is critical to the size of the chip is then tested, and the process is continued. Those segments of the power bus distribution network which do not affect the size of the chip are not eliminated. Thus, a low-resistance power distribution bus network is guaranteed, and chip size is minimized.

16 Claims, 31 Drawing Sheets

NUMBER OF CONNECTIONS FOR THIS NET
IS 3, CONNECTING 4 LOGIC ELEMENTS

ALL PLACEMENT CONFIGURATIONS FOR TYPE A SUBTREE WITH 3 LEAF NODES

STRUCTURED DESIGN METHOD FOR GENERATING A MESH POWER BUS STRUCTURE IN HIGH DENSITY LAYOUT OF VLSI CHIPS

BACKGROUND OF THE INVENTION

This invention relates to a method for laying out the power bus routing in an integrated circuit chip including intermixed fixed size and shape rectangular macrocells together with amorphous clusters of standard cells.

Modern integrated circuit technology is widely used for communications and control. Because of the advantages of reliability and operating speed, the complexity of integrated circuit chips has increased with time, notwithstanding the disadvantages of lower yields occasioned by such complex chips. At the current state of technology, up to one million transistors may be used on a single large-scale integrated circuit.

While such large integrated circuits are advantageous, the initial layout of such complex devices, and of the interconnections between the transistors presents problems in the length of time required to accomplish the layout of the interconnections, the total man-hours required, and in the high skill required of the layout personnel. Furthermore, human layout is subject to the problem of errors, and also is undesirably dependent upon human intuition, rather than upon rote evaluation of all possible permutations of the layout. Thus, layout by humans may not be optimum in terms of the chip size and operating speed of the resulting integrated circuit. The larger chip size resulting from human layout, in turn, results in lower yields during the manufacture of the integrated circuit, which increases the cost.

As a result of the limitations of human layout, it has become common to lay out the integrated circuits including the transistors and their interconnections by means of computer-aided design. These computerized layout systems accept as inputs an interconnection list between the logic elements. In this context, logic elements are relatively primitive electrical circuit such as AND gates, OR gates, and the like. Such logic elements are often standard cells having a fixed dimension and a variable dimension to aid in their placement. Other inputs to the computer layout program include the physical sizes associated with the standard cells, and the locations of the connection points (pins) around the peripheries of the standard cells.

Various methods have been devised for operating on this information to produce the desired layout. One method is described in U.S. Pat. No. 4,593,363 issued June 3, 1986 to Burstein et al. This method operates only with standard cells. This has the disadvantage that LSI layouts including macrocells cannot be conveniently handled except by the intervention of human layout experts. Macrocells, on the other hand, are relatively sophisticated circuits such as memories or multipliers, digital filters and the like, which have fixed dimensions, often because they were laid out by hand. In general, the structure of macrocells is regular. Another system is described in U.S. Pat. No. 4,577,276 issued Mar. 18, 1986 to Dunlop et al., which has the same disadvantages as Burstein et al.

Copending U.S. patent application Ser. No. 07/064,044, filed June 19, 1987 in the names of the inventors herein, and entitled "A Structured Design Method for High Density Standard Cell and Macrocell Layout of VLSI Chips," describes an automated chip layout system which advantageously lays out macrocells in a large scale integrated (LSI) circuit intermixed with standard logic cells. This method groups standard logic cells together in right-left or top-bottom (as viewed from the broad upper side of the chip) pairs to form low-level subdomains, and progressively combines the low-level subdomains together with standard logic cell or other low-level subdomains to produce higher-level, larger subdomains, until no advantage is achieved by further combinations. The remaining subdomains are designated as domains. Pairings of macrocells and domains are made in either top-bottom or right-left topological configurations to produce low-level superdomains, and the superdomains are paired with domains, macrocells or other superdomains to produce higher-level superdomains. This process continues until only one superdomain remains. This produces a topological layout in which domains, superdomains and macrocells are located on a rectangular grid with wiring or routing channels therebetween.

Once the layout of the logic elements and macrocells is established by any of the above methods, it is necessary to route the direct current (dc) power buses to all the elements requiring power. The dc power bus system must distribute positive (+) and negative (−), power. Often, one of the polarities is designated as ground, and the other as $V_{DD}$, B+ or B−. The dc power distribution system must provide low resistance paths between the power wire bonding pads and each circuit being powered, so that the voltage drops along the power bus in response to instantaneously high switching currents are insignificant and do not affect other circuits being powered from the same bus. The dc power distribution system must not bock or obstruct the paths of the signal wiring, and should be amenable to automatic layout. Some prior art dc power bus layouts use a single metallization layer, and begin with a single large bus, which is branched repeatedly to attempt to reach each and every element to be powered. However, because of the inability to cross one conductor over another, it is not possible to guarantee that all circuits can be powered. Also, the branching structure of the buses causes high currents to flow in some portions, and may result in high resistance and undesired circuit interaction. The single metal layer power bus structure tends to obstruct the signal wiring.

A power bus distribution structure is desired which is amenable to automated layout, tends to minimize the power bus resistance, and guarantees powering of all circuits.

SUMMARY OF THE INVENTION

A layout arrangement according to an embodiment of the invention uses two metallization layers. According to the method of layout, a complete mesh of power buses is laid out in each and every wiring channel between groups of elements to be powered.

The complete mesh of power buses includes a circumferential pair of primary power buses, one for the positive, and one for the negative supply. These primary power buses are at the upper metallization level, so that power bonding pads may be connected thereto at any point along the periphery of the chip. Ideally, several positive and several negative power bonding pads are located around the periphery and coupled to the appropriate primary buses. In one embodiment, four pairs of bonding pads are provided, one pair being located at each corner of the chip. A pair of circumferential secondary power buses is placed within the region bounded by the primary power bus pair, with vertically-extending secondary power buses at the upper metallization level and horizontally-extending power buses at the lower metallization level. Conductive through vias are used to connect the ends of upper and lower level buses together. A tertiary power bus pair network is then routed through all wiring channels, with vertically-extending members at the upper metallization level and with horizontally-extending members at the lower metallization level. Each tertiary bus is connected at its extreme end to a secondary power bus or to another tertiary power bus, by through vias if at different levels. The circuits to be powered are then connected to the mesh of secondary and tertiary buses, to form a complete mesh powering structure. In order to minimize the size of the chip, the wiring or routing channels which are critical to the size of the chip are identified. Each channel is considered in segments, and the effect of removing the power bus from that segment of the wiring channel is evaluated. If removal of the bus from that segment does not materially affect the performance of the bus, then it is permanently removed or pruned, and the remaining pruned power bus structure is evaluated further. Eventually, a mesh or net structure remains which cannot be further pruned at size-determining critical regions, but which contains extra paths in non-critical regions which aid in keeping the resistance of the bus system low.

DESCRIPTION OF THE DRAWING

FIGS. 11b–11q, referred to jointly as FIG. 11, represent the right-left, top-bottom physical layouts which are evaluated by the flowchart of FIG. 10 for a particular tree branching structure illustrated in FIG. 11a;

FIG. 28a illustrates signal wiring in a wiring or routing channel, and FIG. 28b is the corresponding signal wiring density profile;

DESCRIPTION OF THE INVENTION

Figure 1:
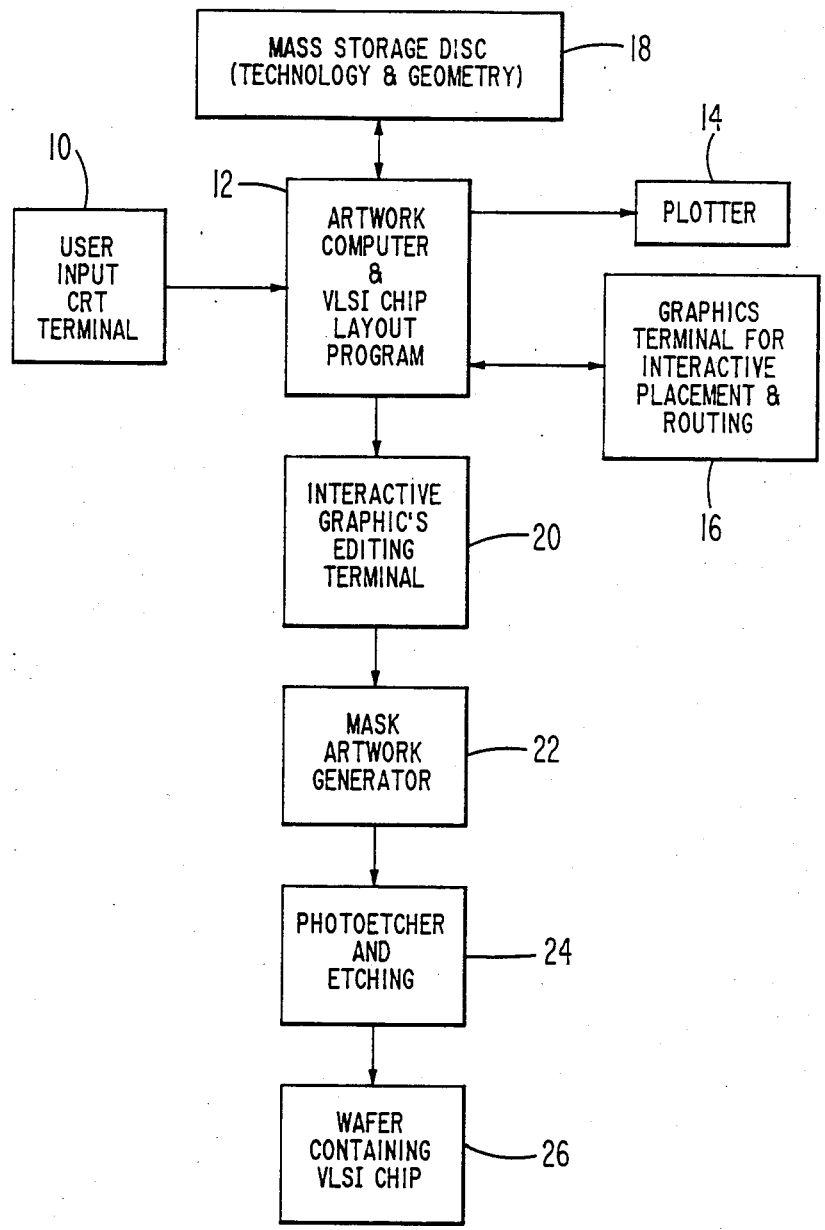
FIG. 1 is a general block diagram of a chip layout system including the invention.

FIG. 1 is a general block diagram of an arrangement for laying out integrated circuits in accordance with the invention. In FIG. 1, a block 10 represents a CRT or display terminal at which the user supplies inputs relating to the chip which is to be laid out. The terminal, under user control, provides control information for controlling the operation of the program described below, and also provides parameter information, which is detailed control information relating to the particular chip being laid out (such as the type of technology to be used, i.e., CMOS, NMOS, bipolar, SOS, etc.), and interconnection information, which is essentially a schematic diagram of the integrated circuit chip being laid out. The user input information is applied to a computer 20 in which a VLSI chip artwork generation program resides, which is described below. A plotter 14 is coupled to computer 12 for plotting the artwork produced as a result of the program, if desired. A mass storage disc is coupled to computer 12. Disc 18 includes technology information which includes predetermined design rule information relating to specific technologies, such as CMOS, SOS, or bulk, and geometry information for the standard cells and for the macrocells which are used in the layout. This technology and geometry information is made available to computer 12 when the information is required by the resident artwork generation program. A graphics terminal 16 for interactive placement and routing modification is coupled to computer 12. Graphics terminal 16 displays the layout generated by the program in an user-interactive manner to aid in viewing and monitoring the layout process. Graphics terminal 16 is shown as separate from user input CRT terminal 10 because it requires substantial graphics display capability. An interactive graphics editing terminal 20 is coupled with computer 12 for receiving the optimized chip circuit layout for controlling the final layout. Terminal 20 provides user control for the layout of chip-related details including the use of test transistors, various mask layers, and the like. Terminal 20 is connected to a mask artwork generator 22 which receives information from terminal 20 and generates commands for operating a photoetcher 24, which prepares the complete wafer including multiple chips and their various mask levels. Generator 22 may also produce a conventional hard copy artwork. Following the photoetching, the photoetcher also includes an arrangement for performing the etching, diffusion, and other processes required to generate the final finished wafer, illustrated as 26. The arrangement of FIG. 1 illustrates all the operations as interconnected, but those skilled in the art recognize that the information developed at any step or apparatus may be stored for later use in the next step.

Figure 2:
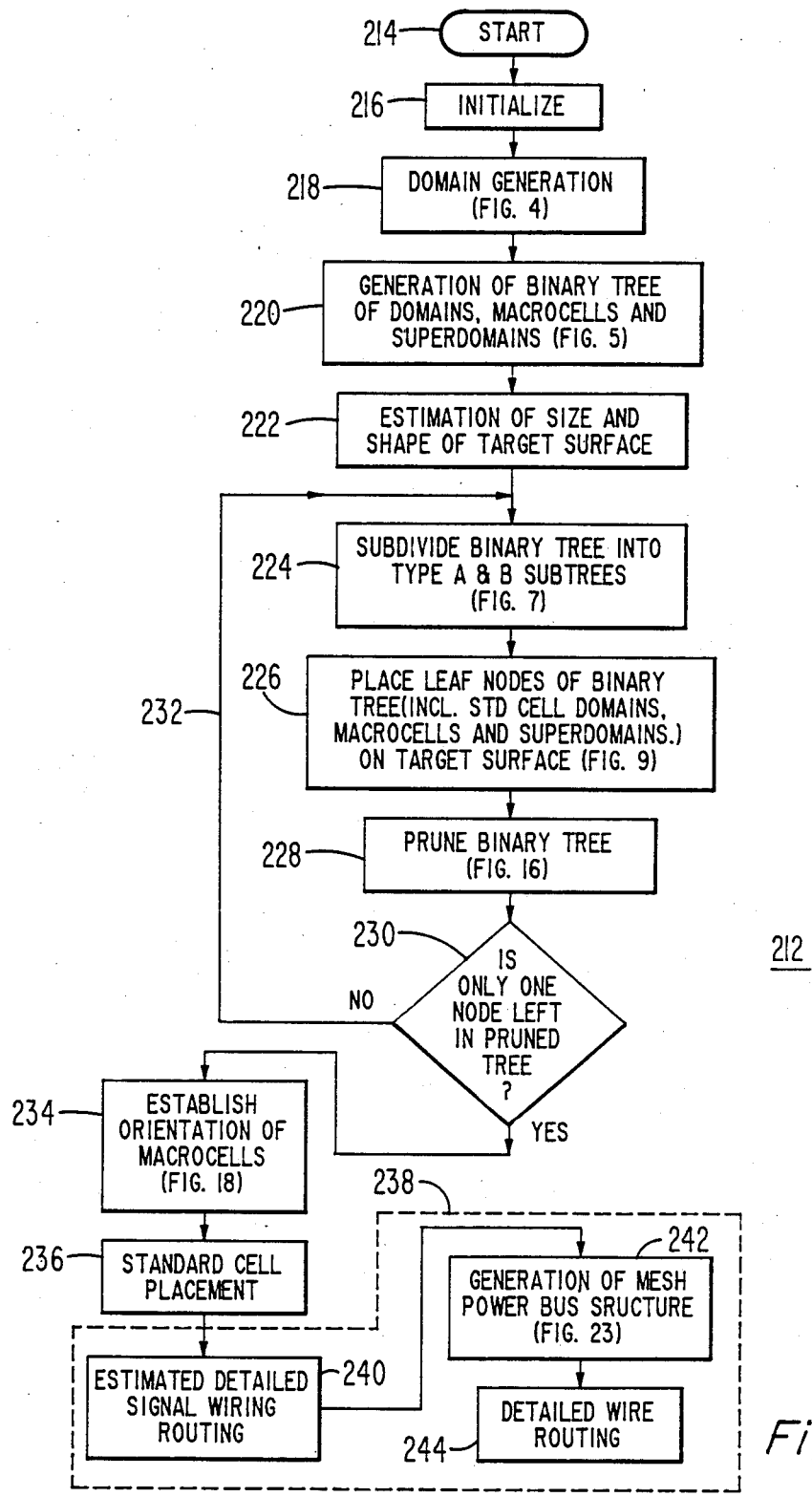
FIG. 2 is a general flowchart describing the operation of a chip artwork generation program similar to that described in the aforementioned Putatunda et al. patent application which may be included in the arrangement of FIG. 1.

FIG. 2 illustrates an overall logic flowchart or diagram 212 which describes, in general terms, the operation of the artwork layout program contained or resident in computer 12 of FIG. 1. In general, the flowchart of FIG. 2 accepts geometry information relating to macrocells and standard cells contained in the chip to be laid out, and interconnection information, and generates an artwork in which overall physical area of the chip is minimized, in which the total interconnection distance between the various standard cells and macrocells of the circuit are minimized for highest operating speed, and in which a mesh-type power bus distribution system is placed in accordance with the invention.

In FIG. 2, the process is begun with a start command 214, followed by an initialization step 216 which includes the reading of the user information, after which the logic flows to a block 218, in which domains are generated by higher-and-higher-order pairings of subdomains. These domains are groups of interconnected logic elements of the standard cell type. The domain generation step is detailed below in conjunction with FIG. 4. From the domain generation step, the logic flows to a block 220, which represents generation of a binary tree of domains, macrocells, and superdomains. As mentioned, domains are groupings of interconnected standard cells. Macrocells are predesigned groupings of logic elements which have a fixed size and aspect ratio as a result of the previous design. Most often, these are regular arrays produced by human designers of elements, such as memories, multipliers, ROMs, and the like. Standard cells, on the other hand, are more primitive or basic logic elements such as AND gates, OR gates, and the like, which are so small that they may almost be considered to be points from the point of view of layout, and which may be readily manipulated by the computer. The term superdomains, for this purpose, includes groupings of macrocells and standard cell domains, or groupings of lower-order superdomains with either macrocels or standard cell domains. Details of the logic of block 220 are described in conjunction with FIG. 5.

From block 220, the logic proceeds to a further block 222, in which estimation of the size and shape of the chip surface is performed based upon the size of the macrocells involved, and on the total area of the standard cell domains, plus an estimate of the interconnection conductor routing requirements. Steps 218, 220, and 222 taken together, group the standard cells into domains, and group domains and macrocells into superdomains, conceptually forming binary tree arrangements with leaves or nodes of higher and higher order.

Figure 9:
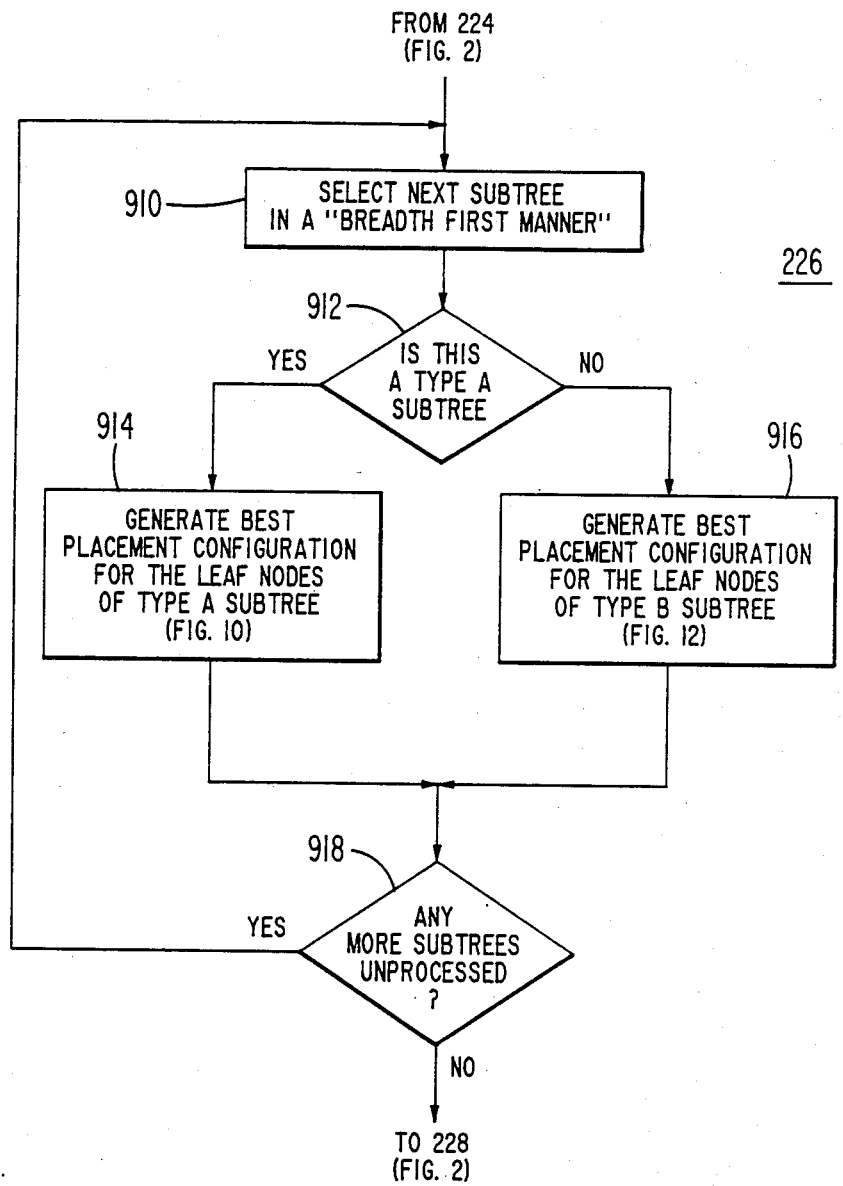
FIG. 9 is a more detailed flowchart of a portion of the flowchart of FIG. 2 which relates to placement on the chip surface of leaf nodes of the subtrees of the binary tree.
Figure 16:
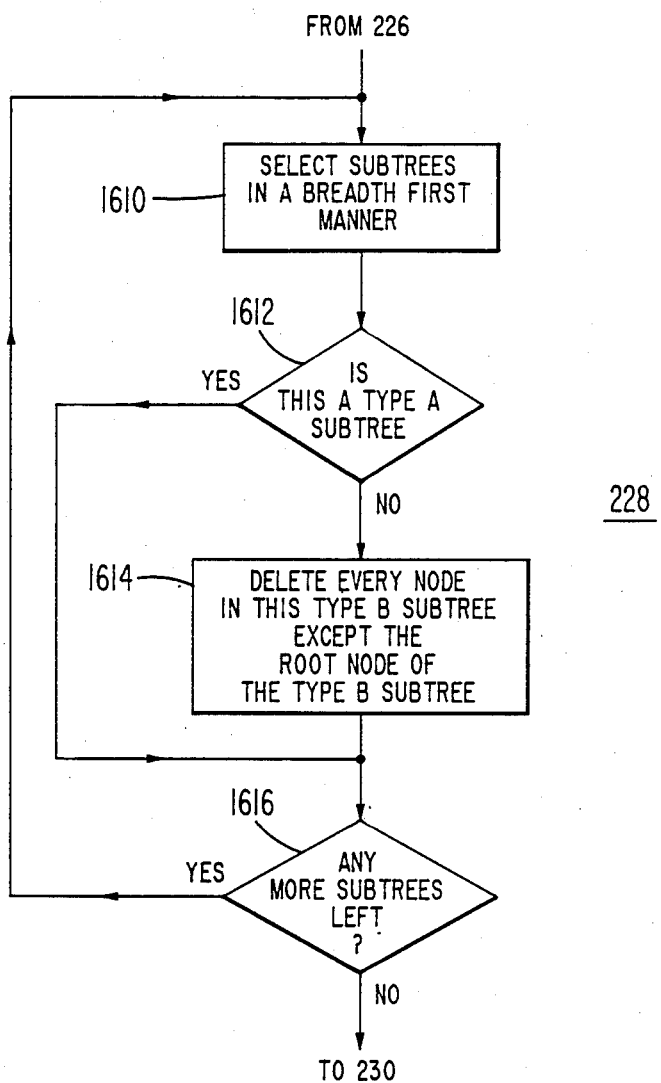
FIG. 16 is a more detailed flowchart which is a portion of the flowchart of FIG. 2, relating to pruning of the binary tree.
Figure 18:
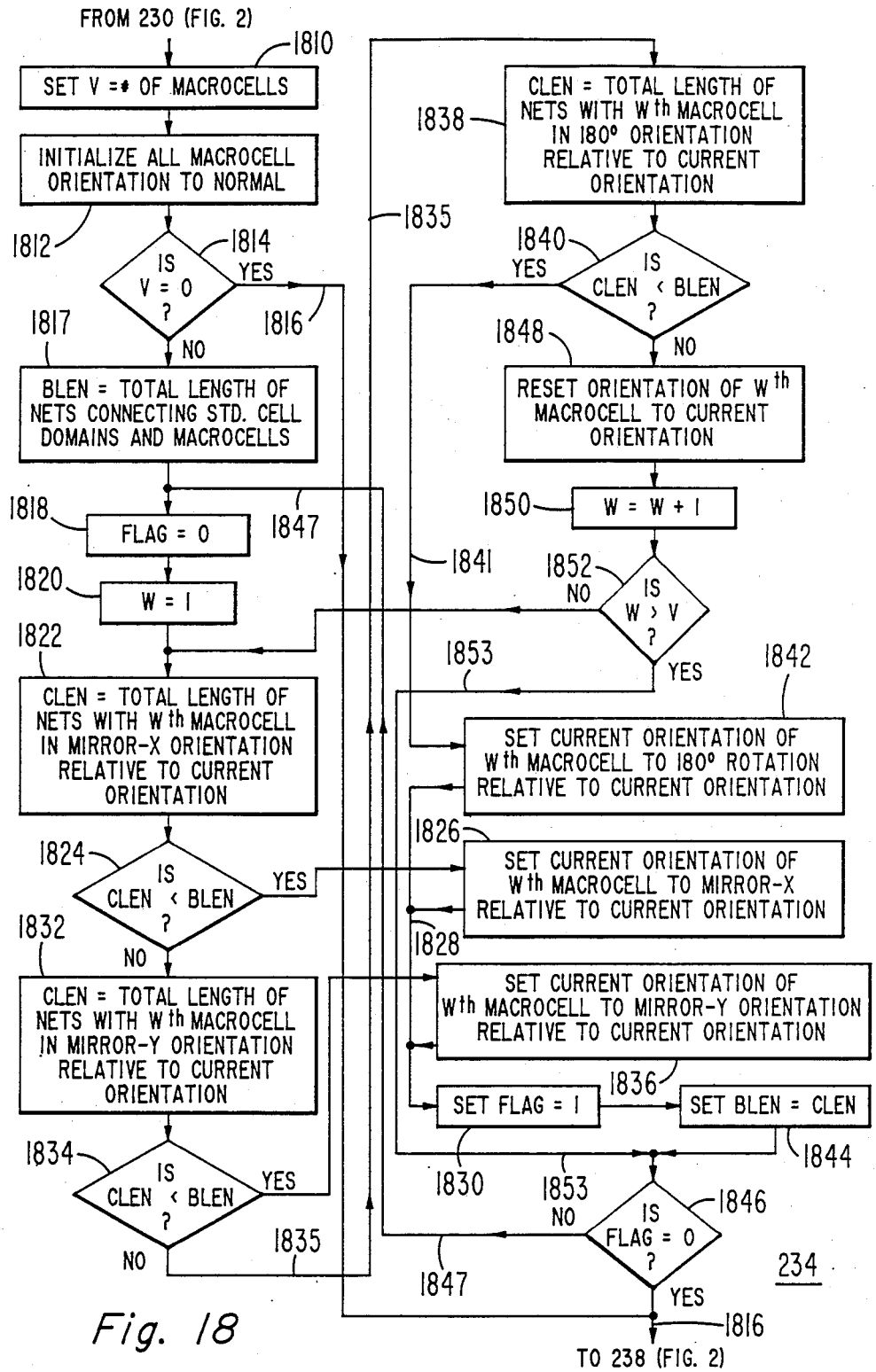
FIG. 18 is a more detailed flowchart of the flow diagram of FIG. 2, relating to optimizing the placement of macrocells in mirror-image or rotated positions.

The logic flows from block 222 to a block 224, in which the binary trees are subdivided into type A and type B subtrees. Type A subtrees are subtrees which have no more than a predetermined number of leaves. The predetermined number is based upon considerations relating to the amount of computer time required to consider all possible configurations or topological permutations of elements. In type A subtrees, the leaf nodes (nodes) are superdomains which have not yet been assigned actual X and Y dimensions. Type B subtrees are the lowest level of subtree, which have no more than a second predetermined number of leaf nodes. Each leaf node in a type B subtree has been assigned discrete X and Y dimensions, as described below in conjunction with FIG. 7. From logic block 224, the logic proceeds to a further block 226, which represents the placement on the chip target area or surface of leaf nodes of the binary tree. This step is described in greater detail below (FIG. 9). From block 226, the logic proceeds to a further block 228, which represents the pruning of the binary tree, also described below (FIG. 16). The logic then arrives at a decision block 230, in which the pruned binary tree is examined to determine the number of remaining nodes. If the number of remaining nodes exceeds unity, the logic returns by a path 232 to logic block 224. The logic iteratively traverses blocks 224–228, reducing the number of nodes in the primed binary tree at each traversal. When processing has proceeded to the point at which only one node remains, the logic proceeds by the YES output of decision block 230 to a further block 234, in which the orientation of the macrocells is established (FIG. 18). From block 234, the logic proceeds to a further block 236, which represents standard cell placement in the standard cell domains, as known in the prior art, for example, from a paper entitled "Linear Ordering and Application to Placement," by S. Kang, published in the *Proceedings of the ACM IEEE*, 20th Design Automation Conference, June 27–29, 1983, at Miami Beach, Fla. From block 236, the logic flows to a further block 238, which represents completion of the detailed routing.

Block 238 includes block 240, which represents an estimated signal wire routing, which is performed in accordance with the procedure described in the article "A New Gridless Channel Router: Yet Another Channel Router the Second (YACR-II)," by A. Santiovanni-Vincentelli et al., published in the *Digest of Technical Papers* of the IEEE International Conference on Computer Aided Design, Nov. 12–15, 1984 at Santa Clara, Calif. From block 240, the logic flows to block 240, which represents generation of a power distribution structure in accordance with the invention. This is explained further in conjunction with FIGS. 21–30. Once the power bus routing is accomplished, the logic performs a final detailed signal wire routing in block 244, in accordance with the above-mentioned Sangiovanni method or in other known manner.

Figure 3A:
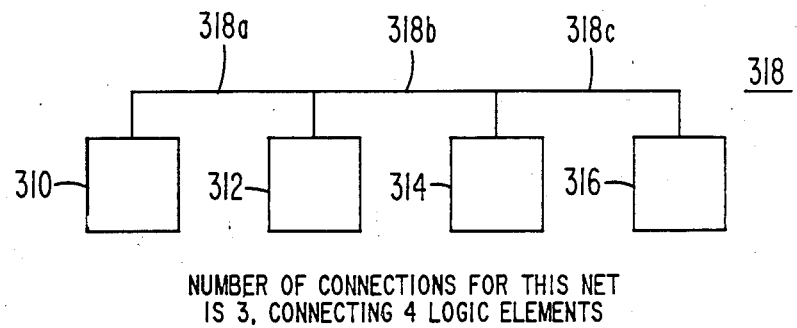
FIGS. 3a and 3b are depictions of interconnections between elements.

In FIG. 3a, a plurality of standard cell logic elements 310, 312, 314, and 316 are interconnected by a net 318. As mentioned, a standard cell logic element is a primitive logic element such as an AND gate, OR gate, or the like, which has at least one adjustable dimension. Net 318 is a single conductor. Net 318 is segmented into three "connection" portions (connections). Net 318 includes a first connection portion 318a, a second connection portion 318b and a third connection portion 318c, which together interconnect the four elements 310–316. Thus, the number of connections is three, one less than the number of logic elements which are interconnected. If there are only two logic elements interconnected by a net, the number of connections is therefore one. In general, if there are N logic elements, there are N−1 connections.

Figure 3B:
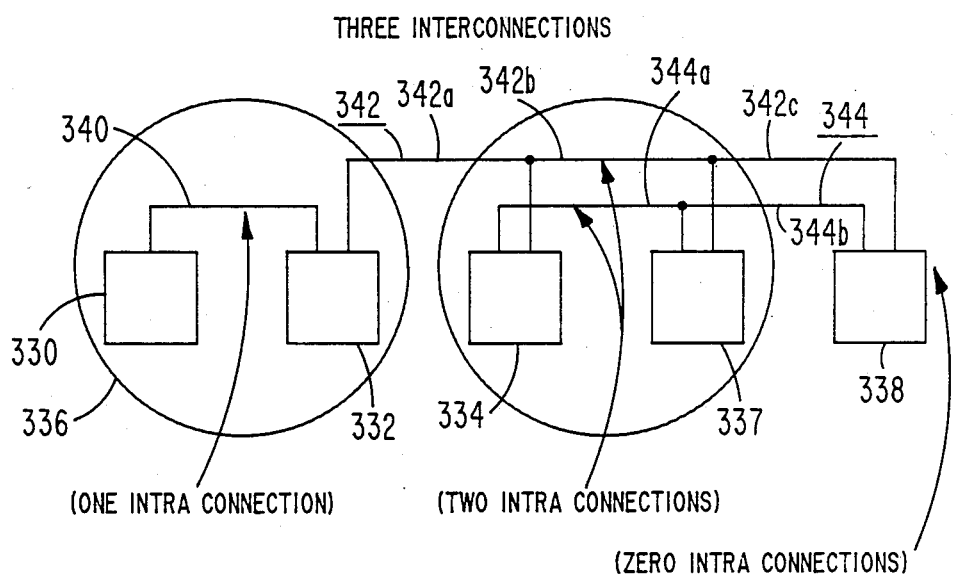

FIG. 3b illustrates the difference between interconnections and intraconnections. In FIG. 3b, logic elements 330 and 332 are grouped into a domain 336, and are interconnected by a net 340. Net 340 is termed an "intraconnection" because it is within domain 336. Logic element 332 is interconnected with further logic elements 334, 336, and 338 by a net designated generally as 342. Logic elements 334 and 336 are grouped into a domain 346. Net 342 includes a first portion 342a which extends from logic element 332 in domain 336 to logic element 334 in domain 346, and which is termed an "interconnection" because it interconnects domains. Net 342 includes a further connection 342b which extends from logic element 334 to logic element 336, both wholly within domain 346, and which is therefore an intraconnection. Net 342 includes a further connection portion 342c which interconnects logic element 336 with logic element 338, interconnects logic elements 334, 336, and 338. That portion 344a interconnecting logic elements 334 and 336, both lying within domain 36, constitutes an intraconnection, whereas that portion 344b interconnecting logic element 336 within domain 346 with logic element 338 without domain 346 is an interconnection.

Figure 4:
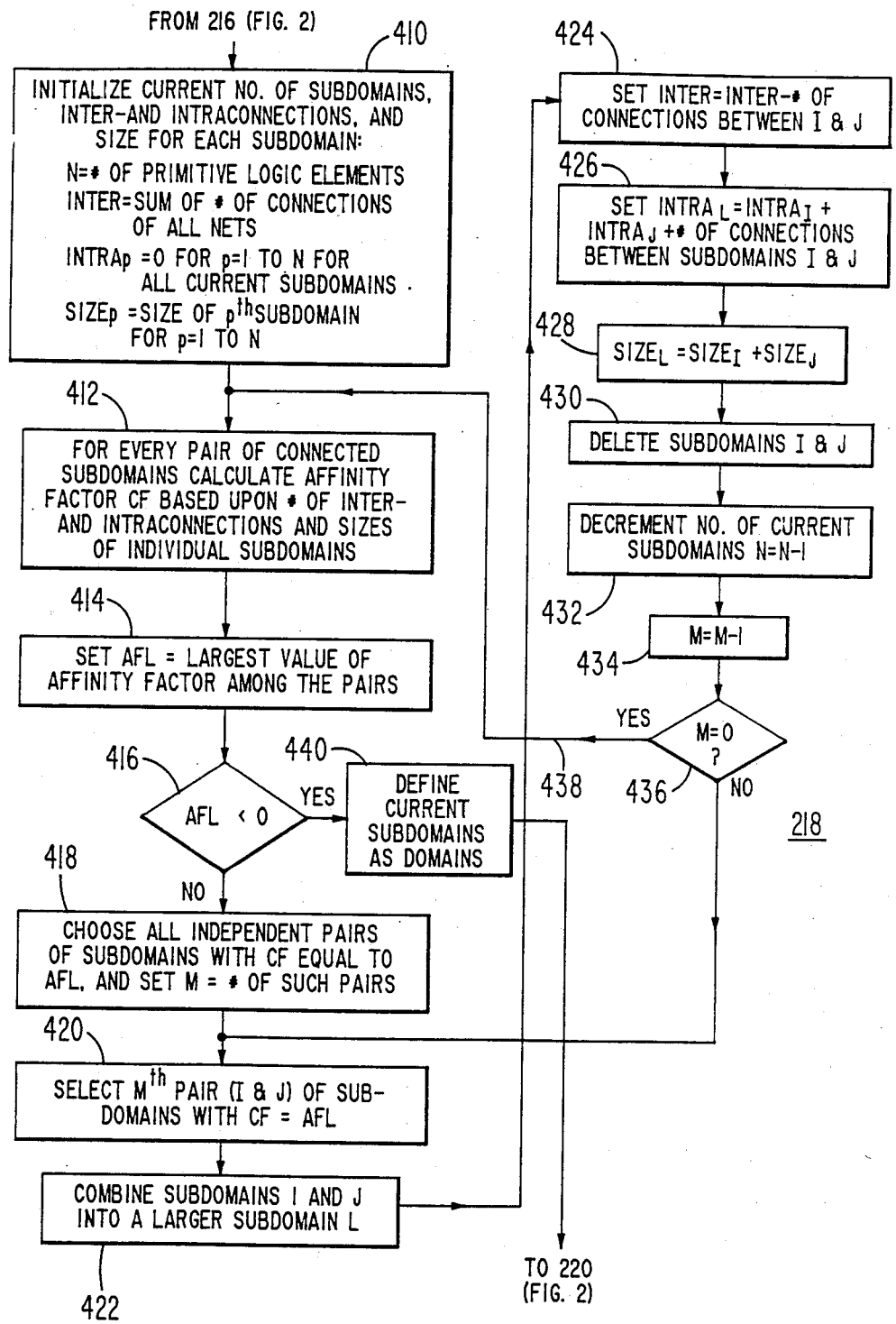
FIG. 4 is a more detailed flowchart of a portion of the flowchart of FIG. 2, relating to grouping of pairs of interconnected subdomains into subdomains of higher and higher order, based upon optimization of an affinity factor, until each subdomain becomes a domain.

FIG. 4 is a detailed flowchart illustrating the operation of block 218 of FIG. 2. In FIG. 4, completed information arrives at block 410 from initialization block 216. Block 410 represents initialization for the steps of FIG. 4. Step 410 includes the step of setting a running variable N equal to the number (#) of primitive logic elements to be placed in the layout. The number of logic elements N includes the number of standard cells but does not include the macrocells. Also in logic block 410, the variable INTER is set equal to the sum of the number of connections, including both interconnections and intraconnections, of all nets. A further variable INTRA$_p$ is set to zero for all values of p ranging from 1 to N. For ease of explanation, the logic elements (and the groupings of logic elements in additional steps described below) will be termed "subdomains" in order to distinguish them from domains and superdomains described in later stages of the process. A list is prepared of the areas of each of the subdomains currently existing (which at this first stage includes the areas of all standard cell elements) under the heading SIZE$_p$, which represents the area of the p$^{th}$ subdomain for all p ranging from p=1 to p=N. The logic then proceeds to a further block 412. Block 412 represents the calculation of affinity factors for every possible pair of connected subdomains. The calculation of affinity factor for every possible pair of connected subdomains is based upon the number of interconnections, the number of intraconnections, and the size of the individual subdomains which make up the pair of connected subdomains. The affinity factor is also known as the cost function (CF), and is expressed by Equation 1:

$$CF = (INTER - C) + \sum_{p=1}^{p=i-1}(INTRA_p \times SIZE_p) +$$

$$\sum_{p=i+1}^{p=j-1}(INTRA_p \times SIZE_p) + \sum_{p=j+1}^{p=N}(INTRA_p \times SIZE_p) +$$

$$(INTRA_i + INTRA_j + C) \times (SIZE_i + SIZE_j)$$

where:

N is the number of remaining elements, and equals the number of primitive logic elements at the first iteration;

INTER is equal to the sum of the number of connections including inter and intraconnections of all nets;

SIZE is the sum of the areas of all subdomains derived from SIZE$_p$ information;

C equals the number of intraconnections between the pair i, j of subdomains under consideration;

INTRA$_p$ is the number of intraconnections in the p$^{th}$ subdomain;

SIZE$_p$ is the size of the p$^{th}$ subdomain;

INTRA$_{i,j}$ is the number of interconnections in the i$^{th}$, j$^{th}$ subdomain under consideration; and SIZE$_{i,j}$ is the size of the i$^{th}$, j$^{th}$ subdomains under consideration.

Note that during the first iteration, when the intraconnections of the individual subdomains (i.e. the primitive logic elements) are zero, Equation 1 degenerates to Equation 2:

$$CF = (INTER - C) \times SIZE + (SIZE_i + SIZE_j) \times C$$

The affinity factor CF may have positive or negative values, and represents the advantage to be gained in overall size and path length by a combination of the elements into a pair. Once the affinity factor for each possible pair of connected subdomains has been prepared, the logic proceeds from block 412 to a further logic block 414, in which AFL (Affinity Factor Largest) is set equal to the largest (most positive) of the affinity factors found in the calculations in block 412. The logic then proceeds to a decision block 416 in which the value of the largest affinity factor is compared with zero. On initial iterations through the logic, all values of AFL will be positive. So long as the value of the largest affinity factor AFL remains positive, the logic remains within FIG. 4 and, as illustrated in FIG. 4, iteratively proceeds through a loop, reducing the positive value of the affinity factor with each pairing iteration. Decision block 416 compares AFL (the largest current value of the affinity factor) with zero, and so long as AFL is greater than zero, maintains the logic flow within the loop by directing the logic flow by the NO output to a further logic block 418.

Logic block 418 represents the selection of all independent pairs of subdomains having affinity factors equal to AFL. Pairs of subdomains having affinity factors equal to AFL which include a common logic element or subdomain are not independent. The logic must arbitrarily choose one of the two possible nonindependent pairs for further processing. A variable M is set equal to the number of pairs of independent subdomains having affinity factors equal to the current value of AFL. The logic proceeds from block 418 to a further block 420.

Logic block 420 is the first block of a logic loop which iteratively runs through all values from one to M, combining in pairs those interconnected logic elements and/or subdomain pairs having affinity factors equal to the current value AFL. Thus, block 420 represents, during the first iteration, the assignment of the first among the M possible pairs, and on the next following iteration represents the selection of the second among the M possible pairs, and so forth. To aid in describing further operation, the two logic elements or subdomains which are members of the $M^{th}$ pair are designated I and J. The logic proceeds to a further block 422, which represents the combination of the $M^{th}$ I and J subdomains or logic elements into a larger subdomain L. The logic proceeds to a further block 424 in which the variable INTER is updated to a value of INTER minus the number of connections between subdomains I and J. The variable INTER is used in Equation 1.

From block 424, the logic proceeds to a block 426, in which a variable $INTRA_L$ is set equal to the sum of $INTRA_I$ plus $INTRA_J$ plus the number of connections between subdomains I and J. The values of $INTRA_I$ and $INTRA_J$ were initially set to zero in block 10, together with the other $INTRA_p$. Thus, two lowest-level logic elements I and J are grouped into a subdomain L and are treated by the logic as being interconnected by a single net, meaning that they are thereafter treated as having a single intraconnection between them. In logic bock 428, the variable $SIZE_L$ is set equal to $SIZE_I + SIZE_J$. This means that the size of the subdomain L is made equal to the size of the logic element pair I, J (or lower-level subdomain pair I, J, depending upon the iteration) which make it up. The logic proceeds to a block 430, which represents deletion of subdomains I and J from further calculation, because they have been grouped into subdomain L. Logic block 432 represents the decrementing of the current number of subdomains N by one, because of the grouping of I and J into L. Block 434 represents decreasing the number M of pairs being considered by one in the pairing loop. The logic then arrives at a decision block 436 in which the value of M is compared to zero. So long as any pairs remain unprocessed which have the affinity value AFL, the logic returns to block 420 by the NO path. Eventually, all of the pairs of logic elements or subdomains having affinity factor AFL will have been grouped into larger or higher-level subdomains, and the logic then leaves decision block 436 by a path 438 and returns to logic block 412. In block 412, all remaining pairs of connected subdomains once again have their affinity factor calculated, and block 414 selects the next largest or most positive value of affinity factor from among the calculated values. So long as the affinity factors remain greater than zero, decision bock 416 causes the logic flow to continue in the processing as so far described in conjunction with FIG. 4. Eventually, the affinity factor will become zero or slightly negative in value, at which time decision block 416 causes the logic to exit from decision block 416 by the YES output to a further block 440.

At this point in the processing, with the affinity factor having decreased to zero, there is no further advantage to grouping together of the subdomains because grouping results in a combination which is of larger size and increased interconnection length than if the subdomains were treated individually. However, up to this point in the processing, the macrocells have not been taken into account. As an aid in explanation, the standard cell subdomains remaining at this stage of the process are renamed as standard cell domains. Block 440 represents the identification of the remaining subdomains as domains. Each macrocell existing (all macrocells, until further combining occurs) is also defined as a domain. The logic leaves block 440 and flows to logic block 220 (FIG. 2).

Figure 5:
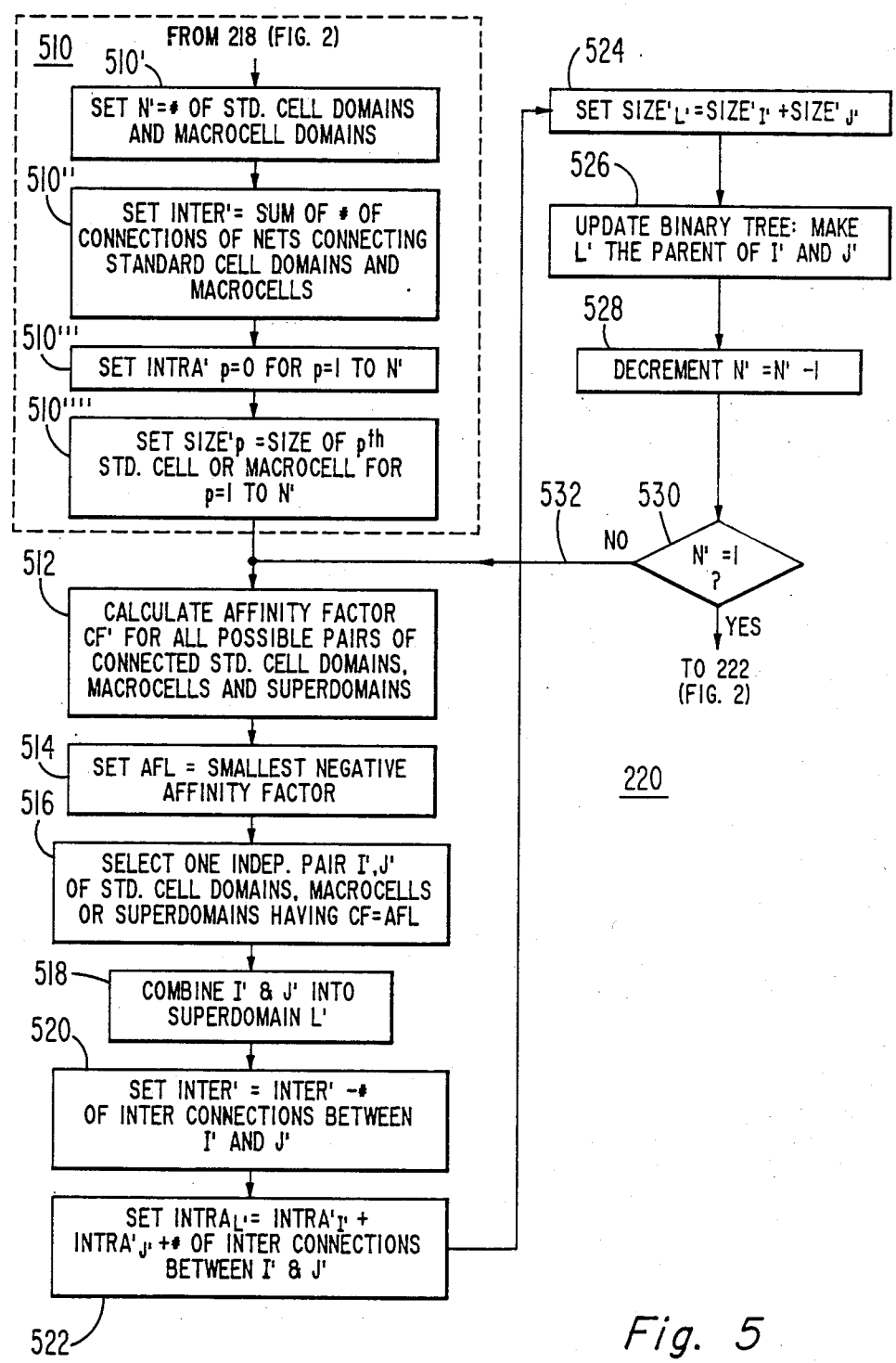
FIG. 5 is a more detailed flowchart of another portion of the flowchart of FIG. 2, relating to the grouping of pairs of interconnected domains and macrocells into superdomains of higher and higher order.

Logic block 220 of FIG. 2 is illustrated in detail in FIG. 5. In general, FIG. 5 represents the logic required for grouping of domains and macrocells into superdomains, and for the further grouping together of superdomains until only a single superdomain remains. This generates a binary tree structure, in which the lowest level leaves are standard cell domains and macrocells, and in which the root is the single remaining superdomain after all processing is completed.

In FIG. 5, logic block 510 represents generally the initialization of the variables to be used in the processing, and includes blocks 510' to 510'''. In block 510', a variable N' is set equal to the sum of the number of standard cell domains and macrocells to be processed. In block 510'', a variable INTER' is set equal to the sum of the number of connections of nets which connect any one of the standard cell domains with any other standard cell domain, any macrocell with a standard cell domain, or a macrocell with another macrocell. The variable $INTRA'_p$, representing the number of intraconnections for the $p^{th}$ domain or macrocell, is set equal to zero in bock 510''' for all values of p ranging from 1 to N', that is, for all standard cell domains and macrocells. The variable $SIZE'_p$ is set equal to the area of the $p^{th}$ standard cell domain or macrocell in block 510'''' for values of p ranging from 1 to N', that is to say, for all remaining standard cell domains and macrocells.

The logic flows from logic block 510 to a further logic block 512.

In logic block 512, the affinity factor is calculated, on the first iterative pass, for every possible pair of interconnected standard cell domains, macrocells, combinations of macrocells and domains, and on subsequent iterative passes, for every one of the above possible pairs, and also for pairings of superdomains with each other and with either a macrocell or a standard cell domain. For this purpose, a superdomain is the combination of two or more standard cell domains, the combination of one or more standard cell domains with one or more macrocells, or the combination of two or more macrocells. The affinity factor CF is given by Equation 3:

$$CF = (INTER' - C') + \sum_{p=1}^{p=i-1}(INTRA'_p \times SIZE'_p) +$$

$$\sum_{p=i+1}^{p=j-1}(INTRA'_p \times SIZE'_p) + \sum_{p=j+1}^{p=N'}(INTRA'_p \times SIZE'_p) +$$

$$(INTRA'_i + INTRA'_j + C') \times (SIZE'_i + SIZE'_j)$$

where:
N' is the number of cell domains and macrocells to be processed;
INTER' is total number of interconnections between all elements;
C' equals the number of interconnections between the pair i,j of standard cell domains, macrocells and/or superdomains under consideration;
$INTRA'_p$ is the number of intraconnections in the $p^{th}$ standard cell domain, macrocell or superdomain;
$SIZE'_p$ is the area of the $p^{th}$ standard cell domain, macrocell or superdomain;
$INTRA'_{i,j}$ is the number of intraconnections in the $i^{th}$, $j^{th}$ standard cell domain, macrocell or superdomain under consideration; and
$SIZE_{i,j}$ is the area of the $i^{th}$, $j^{th}$ standard cell domain, macrocell or superdomain under consideration.

At the completion of the processing in block 512, the affinity factors of all possible combinations of standard cell domains, macrocells, and superdomains have been evaluated. The affinity factors, in practice, are always negative at this stage of processing. Block 514 represents the selection of the most positive value among the calculated values. If there are no actual positive values, the most positive value is the smallest or lowest negative value of affinity factor among all of the affinity factors calculated in block 512.

Logic block 516 differs from the corresponding logic block described in conjunction with FIG. 4, in that only one of the pairs having the lowest negative value of affinity factor is selected for further evaluation during the remainder of the iteration. The elements of the selected pair are designated I' and J'.

The logic them reaches block 518, which represents the combining (in the first pass) of domains or macrocells I' and J' into a superdomain L'. During subsequent passes, the elements being combined in pairs may include superdomains as well as domains and macrocells. In block 520, the value of variable INTER' is set equal to INTER' minus the number of interconnections between elements I' and J' of the pair under consideration. In block 522, variable $INTRA'_L$ is set equal to $INTRA'_{I'}+INTRA'_{J'}$ plus the number of interconnections existing between I' and J'.

In logic block 52, variable $SIZE'_{L'}$ is set equal to $SIZE'_{I'}+SIZE'_{J'}$. The values of variables developed in blocks 522, 524, and 526 are used in logic block 512 during the next iteration of calculations.

In block 526, the binary tree is updated by making L' the root or father node of domains, macrocells, or superdomains I' and J'. The binary tree is further explained in conjunction with FIG. 6, which illustrates an example of a binary tree. The running variable N' is decremented in block 528 of FIG. 5, and the logic flows to decision block 530, in which the current value of variable N' is compared with unity. If N' is greater than one, not all elements have been processed by pairing, and the logic flows from decision block 530 by way of the NO output and a logic path 532 back to block 512 to begin another iteration. Eventually, all elements are combined into one superdomain, and N' becomes unity. Decision block 530 then allows the logic flow to leave FIG. 5 by the YES output and proceed to block 222 of FIG. 2.

Figure 6:
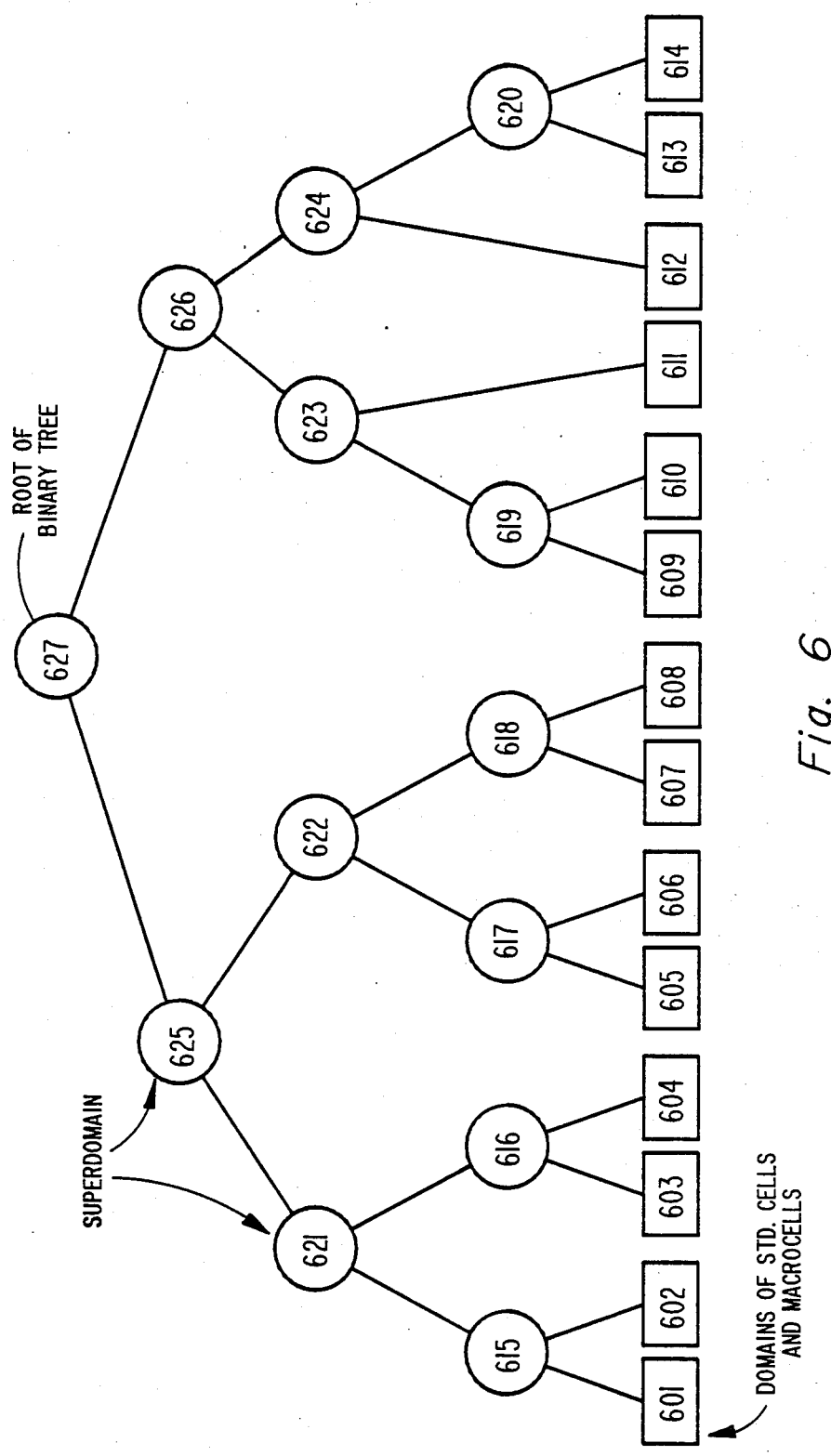
FIG. 6 is a depiction of a binary tree arising out of the operation of the flowchart of FIG. 5.

FIG. 6 illustrates a binary tree which may be constructed by the logic described in conjuction with the flowchart of FIG. 5. In FIG. 6, the lowest level of elements 601 to 614 are leaves or leaf nodes which are either domains of standard cell elements produced by operation of the logic circuit described in conjunction with FIG. 4, or macrocells. The next-to-the-lowest level of the binary tree of FIG. 6 (elements 615 to 620) represents superdomains formed from paired combinations of (a) macrocells, (b) standard cell domains, or (c) macrocells with standard cell domains. All elements of the binary tree of FIG. 6 above the lowest level are termed "superdomains." The tree of FIG. 6 is binary, because each element is composed of only two elements from the next lower level. Superdomain 627 is the root of the binary tree illustrated in FIG. 6. It is also the root or parent of leaves 625 and 626 of a subtree which includes elements 625, 626 and 627. Similarly, superdomain 625 is the root of a subtree which includes daughter superdomains 621 and 622.

Figure 19:
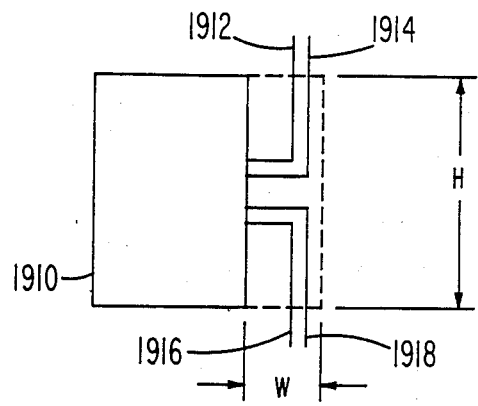
FIG. 19 illustrates a macrocell and adjacent wires to illustrate dimensions used for calculation of wire area.

Logic block 222 of FIG. 2 represents the estimation of the size and shape of the target surface or chip surface (strictly speaking, the layout proceeds with a target surface rather than a chip surface, which is represented by last block 26 of FIG. 1. The estimate of size or area is based upon summing together the areas of the macrocells and an estimated wire area for each macrocell to form a macrocell summed area, and summing together the areas of the standard cell domains and multiplying by a factor to take into account the estimated wire areas for each of the standard cell domains to form summed standard cell domain areas, and then adding together both the summed areas to form the estimate of the size of the target area. For this discussion, the inter and intraconnecting conductors are termed "wires," for ease of description, but those skilled in the art will understand that they may be formed as conductive paths formed on the surface of the integrated circuit chip. Referring now to FIG. 19, 1910 represents a rectangular macrocell on the target area. From the initial data, the number of wires associated with each side of the macrocell is known. As illustrated in FIG. 19, four wires 1912-1918 are associated with the right side of macrocell 1910. The assumption is made in forming the estimate of the requisite wire area that half of the total number of wires are routed in an upward direction and the remaining half are routed downward, as illustrated by the upward routing of wires 1912 and 1914, and the downward routing of wires 1916 and 1918. Consequently, the total area occupied by the wires on the right side of macrocell 1910 is the product of the height H of the macrocell multiplied by the width W of the wire channel. The width of the wire channel associated with the right side of macrocell 1910 is the product of the inter-wire pitch multiplied by the number of wires in the wiring channel. Naturally, wires entering the macrocell along the top or bottom of macrocell 1910 are assumed to be routed half to the left and half to the right. The wiring channel area is determined for all sides of the macrocell.

In the case of standard cells, the estimate of the wiring area is based upon historical estimates. A method which has been found to be effective uses two values, depending upon the total number of standard cell logic elements in the standard cell domain. For a number of standard cell elements in the domain less than 300, the area of the standard cells is calculated, and multiplied by 2.1 to get the total area of the standard cells plus the wiring area. For numbers of standard cells in excess of 300, the area is multiplied by 2.5 to get the total area.

Logic block 222 of FIG. 2 also represents estimation of the shape of the chip surface. The shape of the chip surface is accomplished by taking the square root of a quotient. The particular quotient is the quotient of the target area, calculated as described above, divided by the aspect ratio. The aspect ratio is the quotient of the target region height divided by the target region width, and is predetermined by the user information. It is desirable to provide a default value of 1.0 for the aspect ratio, if no aspect ratio is specified by the user. The height of the target region is simply the target area divided by the width of the target region.

Figure 7:
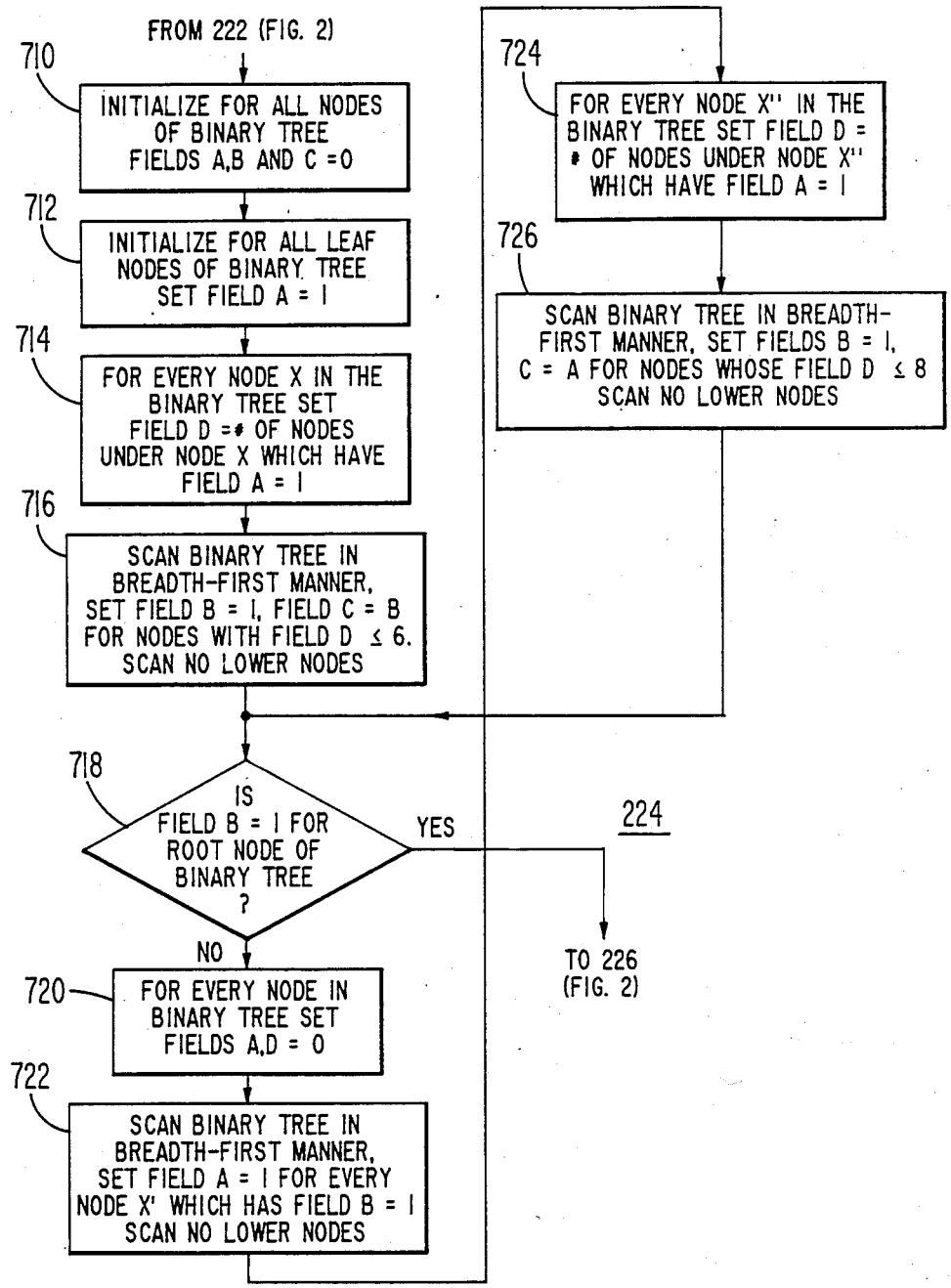
FIG. 7 is a more detailed flowchart which is a portion of the more general flowchart of FIG. 2, relating to subdivision of the binary tree of FIG. 6 into subtrees.

From block 222 of FIG. 2, the logic proceeds to a block 224 in which the binary tree is subdivided into type A and type B subtrees. FIG. 7 is a more detailed flowchart representing block 224. In general, the logic of FIG. 7 associates a digital word with each node of the binary tree. The word is divided into four fields designated A, B, C, and D. The A field identifies the node as a leaf node of the subtree (the lowest level node of any subtree). The A field of the digital word is assigned a logic zero level to indicate that it is not a leaf node, thus indicating that it has daughter nodes within the subtree, and the A field assumes a logic one level to indicate that it is a leaf node. The B field of the identification word includes a root flag indicative of the status of a node as a root of a subtree. A logic zero indicates that it is not a root, and a logic 1 indicates that it is a root. The C field identifies the subtree as a A or B subtree. The D field includes information relating to the number of leaves of the subtree.

In FIG. 7, blocks 710–716 identify the root nodes of type B subtrees. Block 710 initializes all nodes of the binary tree by setting the A, B, and D fields of the digital word equal to zero. Logic block 712 represents initialization for all leaf nodes of the binary tree by setting the A field equal to one. In effect, this takes the lowest-level leaves of the binary tree (601–614 of FIG. 6) and assigns them a leaf status. In block 714, field D is set, for every node X in the binary tree, equal to the number of nodes under node X which have field A set to one (thereby indicating its status as a leaf node). The logic flows from block 714 to a further block 716, which represents a scanning of the binary tree in a "breadth-first" manner, starting with the root node (627 of FIG. 6). The "breadth first" processing requires that all subtrees at the same level of descent from the root are processed before any of the next lower-level subtrees are evaluated. During the breadth-first scanning starting with root node 627, block 716 also represents setting the field B flag (root-not root) equal to one and the field C flag (type A, B subtree) equal to B for all nodes in which the D field is less than or equal to the previously mentioned second predetermined number selected for B subtrees. In one embodiment of the invention, the second predetermined number is six. Once a particular node has been identified as the root node (field B=1) of a B subtree (field C=B), further scanning for root nodes in that particular subtree can be ended, which means that no lower-level nodes in that subtree are evaluated.

From block 716, the logic flows to a decision block 718. Block 718 is the beginning of a logic loop which completes its activity when the one root node of the binary tree (node 627 of FIG. 6) has its field B set equal to one, thereby indicating that it has been selected as the root node of a subtree. Decision block 718 examines the B field of the root node on each iteration, and directs the logic by the NO output to logic block 720 so long as root node 627 has not been so designated by setting field B equal to logic 1.

As mentioned, blocks 710–716 of FIG. 7 identify the root nodes of the type B subtrees. The iterative loop beginning at logic block 718 starts anew to identify the root nodes of the A subtrees. For this purpose, block 720, for every node in the binary tree set, sets fields A (leaf node ID) and D (number of subtree leaves) to logic zero. This eliminates identification of the leaf nodes and of the number of leaves under each node.

In block 722, the binary tree is again scanned in a breadth-first manner, and for every node which has a field B equal to one (that is, for each previously identified root of a B subtree on the first iteration or for identified roots of A or B subtrees on subsequent iterations), field A (leaf node ID) is set equal to one. Thus, the roots of a subtree of a particular level are made equal to leaves of subtrees of the next higher level. In block 722, scanning of the binary tree is stopped for all nodes which are the daughters of a node in which the field A has been set to one. This results in higher and higher level evaluations on subsequent iterations.

The logic flows from block 722 to logic block 724, in which the number of leaf nodes under each node "X" is counted, and for each node "X" in the binary tree, field D (number of leaves) is set equal to the number of nodes of which it is the parent or source, and which have field A (leaf node ID) set to one. Block 726 represents a scanning of the binary tree in a breadth-first manner and the setting of field B (root) to a value of logic one, and the setting of field C equal to A for those nodes in which the field D is less than or equal to the first predetermined number, which in the above-mentioned embodiment is eight. This makes a root node for a type A subtree out of those nodes having less than the predetermined number of leaves thereunder (nine in the example given above). Scanning of nodes below those nodes identified as roots of the A subtree ends, so that other daughter nodes are not incorrectly identified as root nodes. From logic block 726, the logic flow loops back to decision block 718 and iteratively traverses blocks 720–726. Eventually, when all root nodes have been identified, the logic leaves decision block 718 by the YES output and flows to block 226 of FIG. 2.

Figure 8:
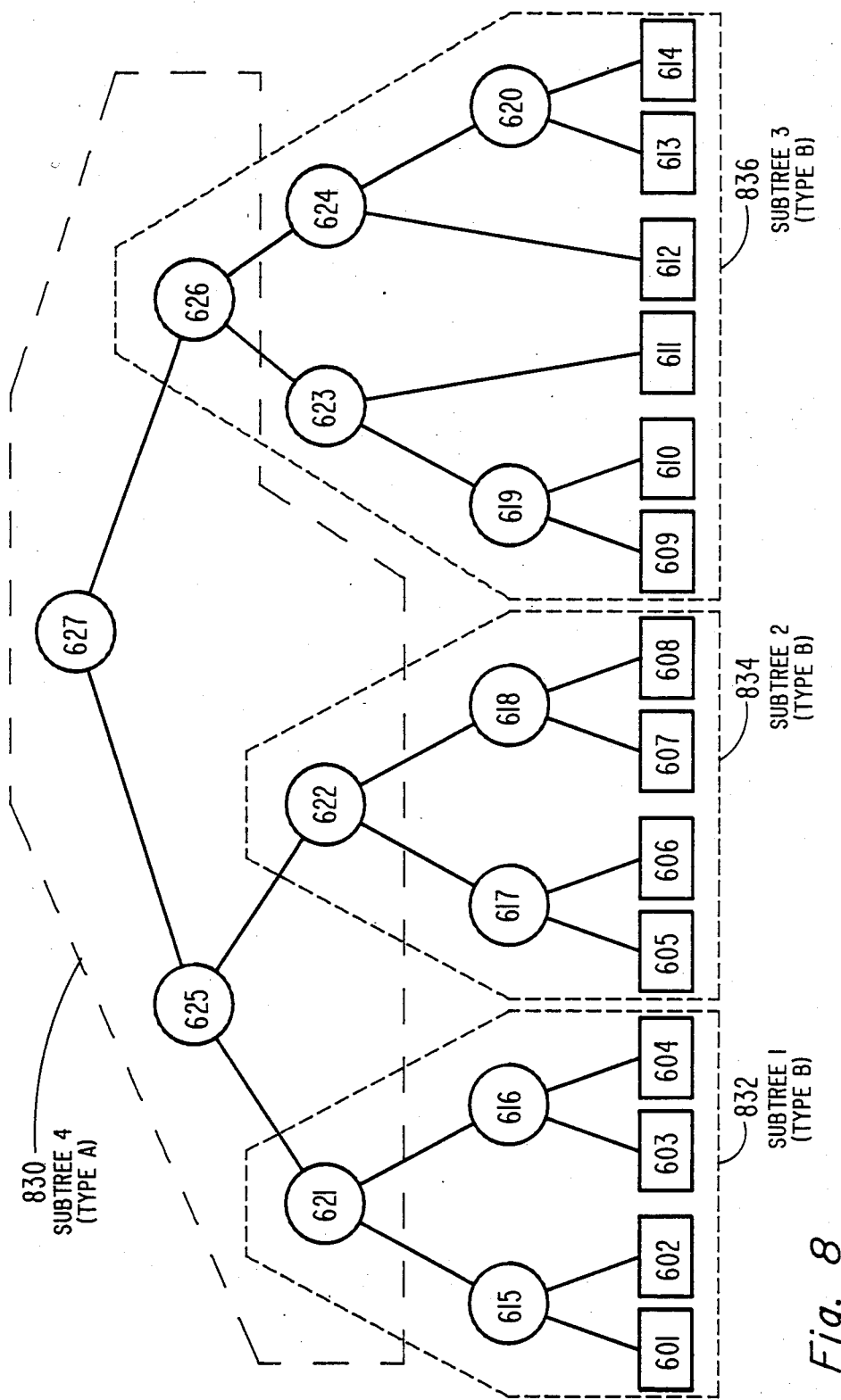
FIG. 8 illustrates the subdivision of the binary tree of FIG. 6 into type A and type B subtrees by the logic flow of FIG. 7.

FIG. 8 illustrates a binary tree similar to that of FIG. 6, subdivided into subtrees by the process described in conjunction with FIG. 7. Type A subtrees were required to have no more than eight leaf nodes, and type B subtrees were required to have no more than six leaf nodes in the processing. In FIG. 8, there is a single type A subtree, subtree 830. Also, there are three type B subtrees, 832, 834, and 836. Type B subtree 832 includes domains 601-604. These domains are combined into superdomains 615 and 616, and into higher level superdomain 621. If one were to attempt to extend subtree 832 to include any of domains 605-608, the subtree would have to include superdomain 625. However, if superdomain 625 were to be included in type B subtree 832, there would be a total of eight domains in the subtree (i.e., domains 601-608), which exceeds the allowable number, which is six. Type B subtree 836 includes domains 609-611, and if an attempt is made to extend subtree 836 to include domains 612-614, the subtree can be extended, thereby including superdomain 626, without exceeding the allowable number of six leaf nodes. Thus, superdomain 626 is the root of B subtree 836.

In the example of FIG. 8, only one type A subtree exists with leaf nodes 621, 622, and 626. Leaf nodes 621, 622, and 626 of the A subtree are root nodes of B subtrees 832, 834, and 836. Illustration of eight or more B subtrees, in order to illustrate more than one A subtree, would be difficult. Even if there were additional type B subtrees in FIG. 8, type A subtree 830 could be extended to include the root nodes of the additional type B subtrees, until a total of eight such root nodes were included. Further expansion would require an additional type A subtree of similar level and at least one higher-order subtree, to group the two lowest-level A subtrees.

From logic block 224 of FIG. 2, the logic proceeds to logic block 226 of FIG. 2, which represents the placement on the target surface of the leaf nodes of the binary tree. FIG. 9 illustrates details of the logic flow of block 226. Generally speaking, the logic of FIG. 9 starts at the root of the binary tree of FIG. 8 (node 627) and processes the highest level type A subtree first (subtree 830). The arrangement of FIG. 9 selects a subtree for evaluation, determines the type of subtree, and then directs the logic to the appropriate processing for that type of subtree. In FIG. 9, block 910 represents the selection of the next subtree in a "breadth first" manner, as defined above in conjunction with FIG. 7.

From block 910, the logic proceeds to a decision block 912 in which the type of subtree is evaluated. Type A subtrees are directed by the YES output to a further logic block 914, and the type B subtrees by default are directed to a logic block 916. The different logic processes for the type A and type B subtrees are described below. Once the processing is completed, the logic proceeds to a further decision block 918 to determine whether any subtrees remain to be processed. If subtrees remain to be processed, the logic leaves decision block 918 by the YES output and loops back to block 910, and the procedure is repeated. If all subtrees have been evaluated, the logic leaves block 918 by the NO output and proceeds to logic block 228 of FIG. 2.

Figure 10:
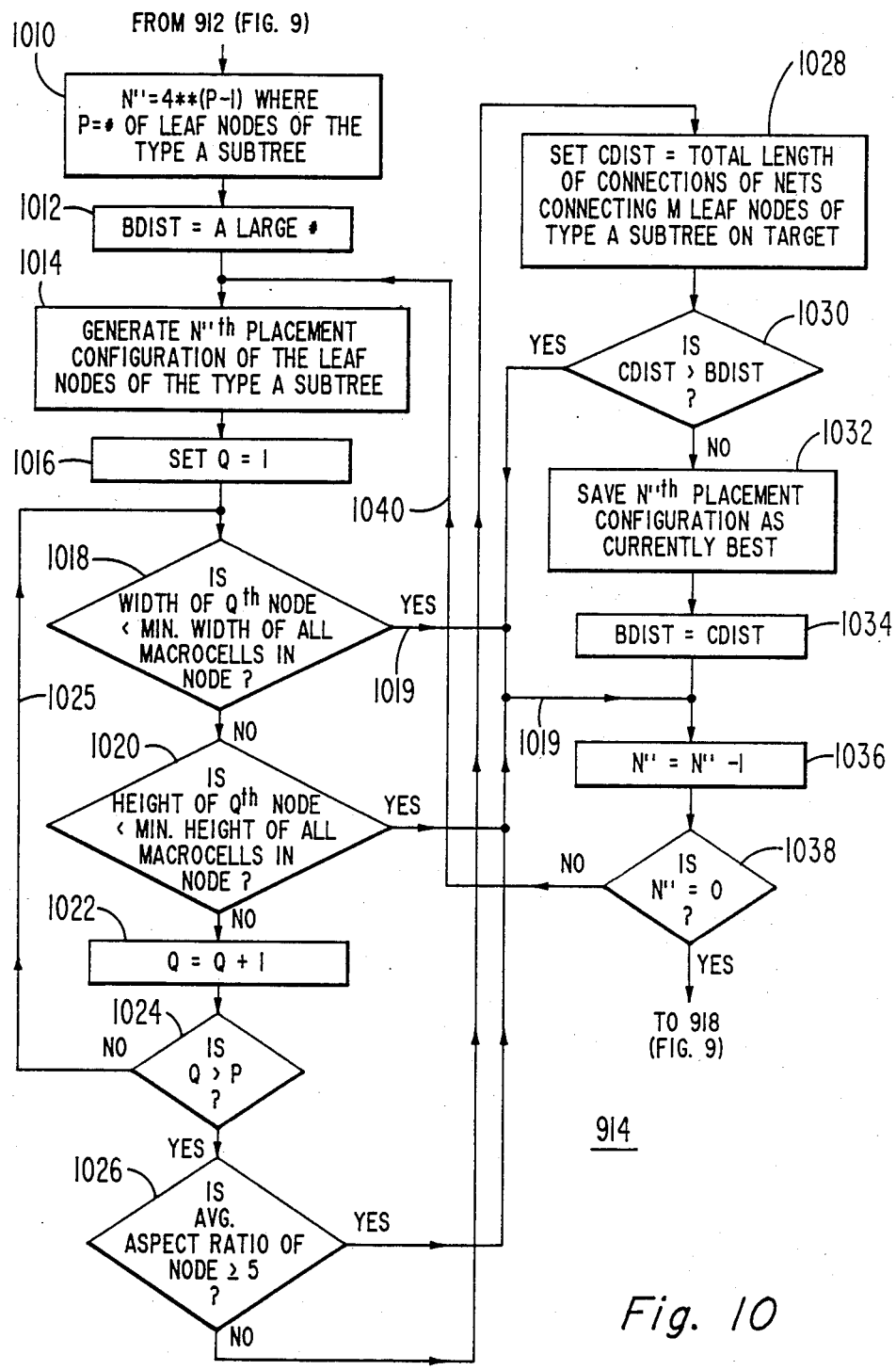
FIG. 10 is a detailed flowchart depicting a portion of the flowchart of FIG. 9 relating to type A subtrees.

FIG. 10 represents the processing required to process type A subtrees in block 914 of FIG. 9. The logic described in conjunction with FIG. 10 establishes relative physical locations for the elements of the superdomains which correspond to the leaf nodes of the A subtree by trying all possible placements of the various elements making up each leaf of the subtree.

In FIG. 10, initializing block 1010 initializes the value of N″ by setting it equal to $4^{(P-1)}$. The variable P is the number of leaf nodes of the type A subtree currently being processed. The number 4, which is the base of the exponent, represents the four possible permutation of right-left, top-bottom positionings of the two elements constituting each node. This is further described in conjunction with FIG. 11. The logic proceeds to a block 1012 in which the variable BDIST is set equal to an arbitrarily large number. Variable BDIST represents the best distance or length of the connecting net so far located, and the large number is a reference against which the number will be compared on successive iterations. The logic then proceeds to block 1014. Block 1014 represents the generation of the $N''^{th}$ placement configuration for the leaf nodes of the type A subtree. That is, the $N''^{th}$ right-left, top-bottom permutation is generated. In block 1016, the value of a variable is set equal to unity. Q is a running variable, and is the designation applied to one of the P leaf nodes currently being evaluated.

Logic blocks 1016 through 1026 represent the logic required to evaluate the placement configuration currently being reviewed in order to determine if the calculated width and calculated height are sufficiently large to accommodate any macrocells (which as mentioned have fixed, invariant dimensions) contained therein. In block 1018, the width of the $Q^{th}$ node is compared with the minimum width of all macrocells included in superdomains corresponding to the $Q^{th}$ node. If the width of the $Q^{th}$ node is less than the width of any macrocell, then the configuration is invalid, and the logic flows by the YES output and a logic path 1019 to a logic block 1036, and by way of the NO output of a further decision block 1038 and a logic path 1040 to block 1014, to begin evaluation of another configuration. If, on the other hand, the width of the $Q^{th}$ node is greater than the width of any of the macrocells contained therein, decision block 1018 directs the logic by way of the NO output to a further decision block 1020. Decision block 1020 performs the same function for the height of the $Q^{th}$ node relative to the heights of the macrocells contained therein as block 1018 does for the widths. If the height of the $Q^{th}$ node is insufficient to accommodate the heights of the macrocells contained therein, the logic returns to consider another configuration by way of the YES output of block 1020, path 1019, blocks 1036 and 1038, and path 1040. If the configuration is valid as to both height and width, the logic proceeds from block 1020 by the NO output to a block 1022, in which Q is incremented to the value Q+1. The value Q+1 represents proceeding to the evaluation of a further node of the subtree. From logic block 1022, the logic proceeds to a decision block 1024, which compares Q with P. When Q=P, all the leaves of the subtree have been evaluated. So long as all of the leaves have not been evaluated, the logic returns by way of the NO output of decision block 1024 and a path 1025 to block 1018, in which the validity of a further node is evaluated.

Eventually, the validity of all the leaf nodes of the particular placement have been evaluated and the logic proceeds by way of the YES output of decision block 1024 to a further decision block 1026. Decision block 1026 attempts to reduce the number of situations in which the aspect ratio of any particular element in a placement configuration of the subtree has an aspect ratio which is undesirably large. This is done not by expressly prohibiting aspect ratios having a value exceeding a predetermined amount, but rather by averaging the aspect ratios of all leaf nodes of the subtree as placed, and comparing the average with a value of aspect ratio which is judged to be undesirably large. A value which has been found to be a satisfactory limit in this regard is an average aspect ratio greater than or equal to 5, but other values may be satisfactory for various purposes. If the average aspect ratio exceeds 5, the logic returns by way of the YES output of block 1026, and path 1019 to perform further evaluations. If the aspect ratio is less than 5, the NO output of decision block 1026 directs the logic to a further block 1028. In block 1028, the total current lengths or distances of the connections of nets connecting the leaf nodes of the type A subtrees being evaluated in the particular placement configuration are calculated and made equal to the variable CDIST. The logic proceeds to a decision block 1030, in which CDIST is compared with BDIST, the current best distance or length. If the newly calculated CDIST is greater than or equal to BDIST, the particular configuration being evaluated is less desirable than a previously calculated placement, and the YES output of decision block 1030 directs the logic by way of block 1036 and decision block 1038 back to block 1014 to evaluate another configuration. If CDIST is not greater than or equal to BDIST, the logic proceeds to a further block 1032, in which the desirable $N'''^{th}$ placement configuration is saved as being the best current configuration. The logic then flows to a further block 1034, in which variable BDIST is set equal to CDIST. The logic then flows to block 1036, in which the variable $N''$ representing the number of remaining unevaluated placement configurations of the type A subtree is reduced by one. The logic proceeds therefrom to decision block 1038, which compares $N''$ with zero, and if configurations remain unevaluated, returns the logic to block 1014. Eventually, all the possible placement configurations of the type A subtree will have been evaluated, and the logic leaves FIG. 10 by the YES output of decision block 1038, and proceeds to block 918 of FIG. 9.

Figures 11, 11A:
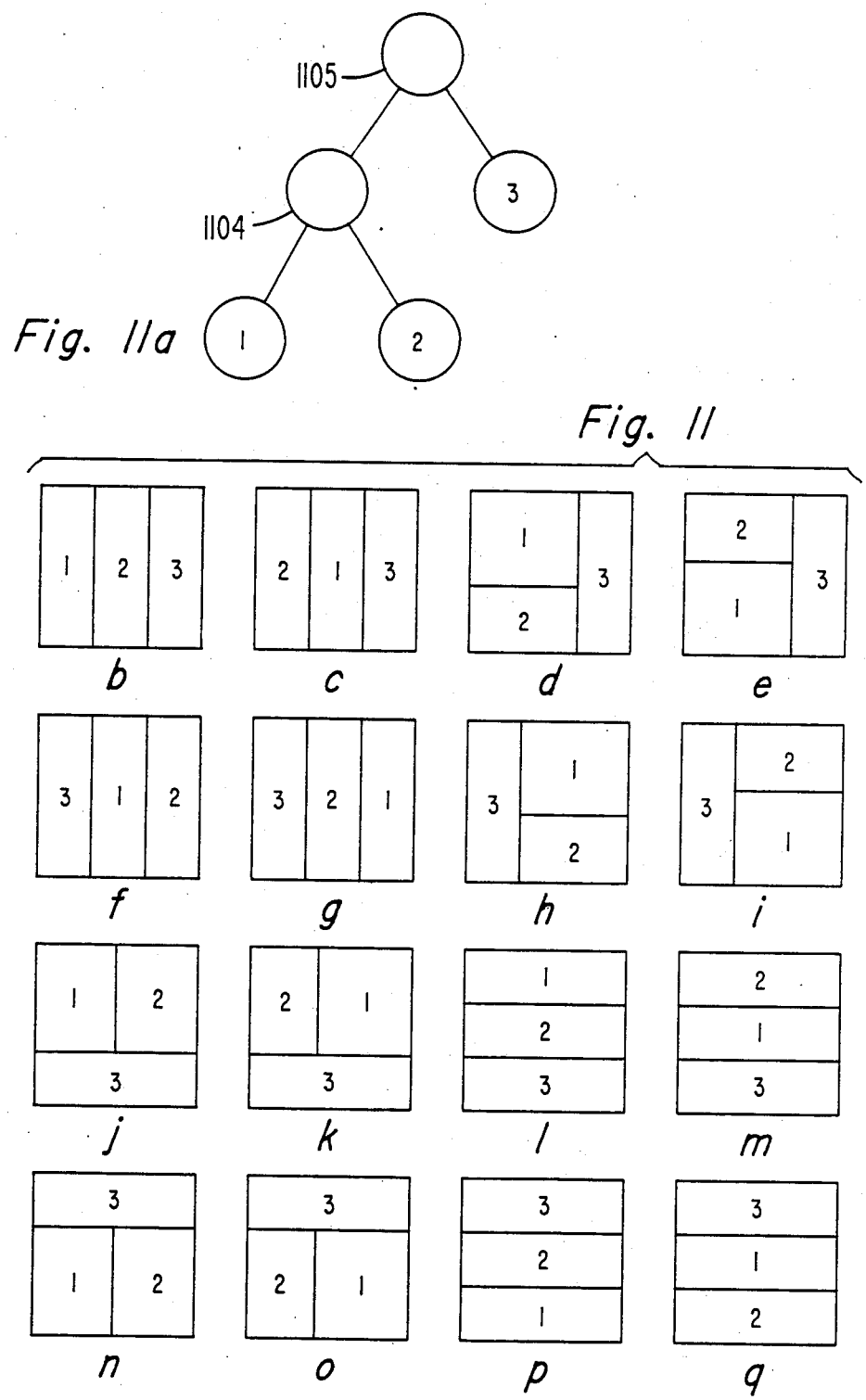
FIG. 11a represents a type A subtree with three leaf.

FIG. 11a represents a type A subtree with three leaf nodes numbered 1, 2 and 3. FIGS. 11b through 11q represent all possible variations or permutations of right-left, top-bottom placements of the three leaf nodes. As illustrated in FIGS. 11b-q, the aspect ratio of the target area of the root of the subtree happens to be square, but other aspect ratios are possible. Within the square target area, leaves 1, 2 and 3 can be placed side-by-side in that order, as illustrated by FIG. 11b, with their widths determined by their relative areas. FIG. 11c illustrates a permutation of the arrangement of FIG. 11b, with the positions of leaves 1 and 2 interchanged. FIG. 11f represents yet another permutation of right-left placement, and 11g represents the arrangement of 11f with the positions of leaves 1 and 2 interchanged. A configuration in which leaf element 3 is interposed between leaf elements 1 and 2 cannot occur for the binary tree illustrated in FIG. 11a, because of the arrangement of the binary tree. That is, leaf nodes 1 and 2 are always combined right-left or top-bottom, relative to each other to form parent node 1104, and their combination as represented by node 1104 itself is arranged left-right or top-bottom relative to leaf node 3 to form the root node 1105.

FIG. 11d illustrates a top-bottom placement of nodes 1 and 2 to form a left grouping, and the combination of the 1-2 grouping with node 3 on the right. FIG. 11e is the same as FIG. 11d, with the positions of nodes 1 and 2 interchanged FIG. 11h is similar to FIG. 11d, but with node 3 on the left rather than on the right. FIG. 11i is similar to FIG. 11e, but with node 3 on the left rather than on the right. FIG. 11j illustrates a left-right configuration of leaves 1 and 2, both placed above or on top of node 3, and FIG. 11k is the same as 11j but with the positions of nodes 1 and 2 interchanged right-left. FIG. 11l illustrates a vertical placement of leaves 1, 2 and 3 in that order, and FIG. 11m is similar but with the positions of leaves 1 and 2 reversed. FIG. 11n illustrates a placement similar to 11j, but with 3 at the top rather than at the bottom of the group 1-2 combination. FIG. 11o is a similar permutation of FIG. 11k. FIG. 11p is a 1, 2, 3 bottom-to-top placement of the leaves, and 11q is similar, but with 1 and 2 interchanged. As so far described, the various right-left, top-bottom layout permutations illustrated in FIG. 11 were generated by branch 914 of FIG. 9.

The leaves of the A subtree as so far described have relative positions, but do no have dimensions associated with their target areas. When all the leaves of the A subtrees have been placed and evaluated, the procedure continues to include the next lower level of the binary tree, which includes the lowermost leaves, which are the domains. This step applies actual dimensions to the leaf nodes of the A subtree, which are the root nodes of the B subtrees. This is done by placing the leaf nodes of the B subtrees (elements 601-614 of FIG. 8) within the roots of the B subtrees (601-604 within 622, 605-608 within 623, etc.). This is accomplished in block 916 of FIG. 9.

Figure 12:
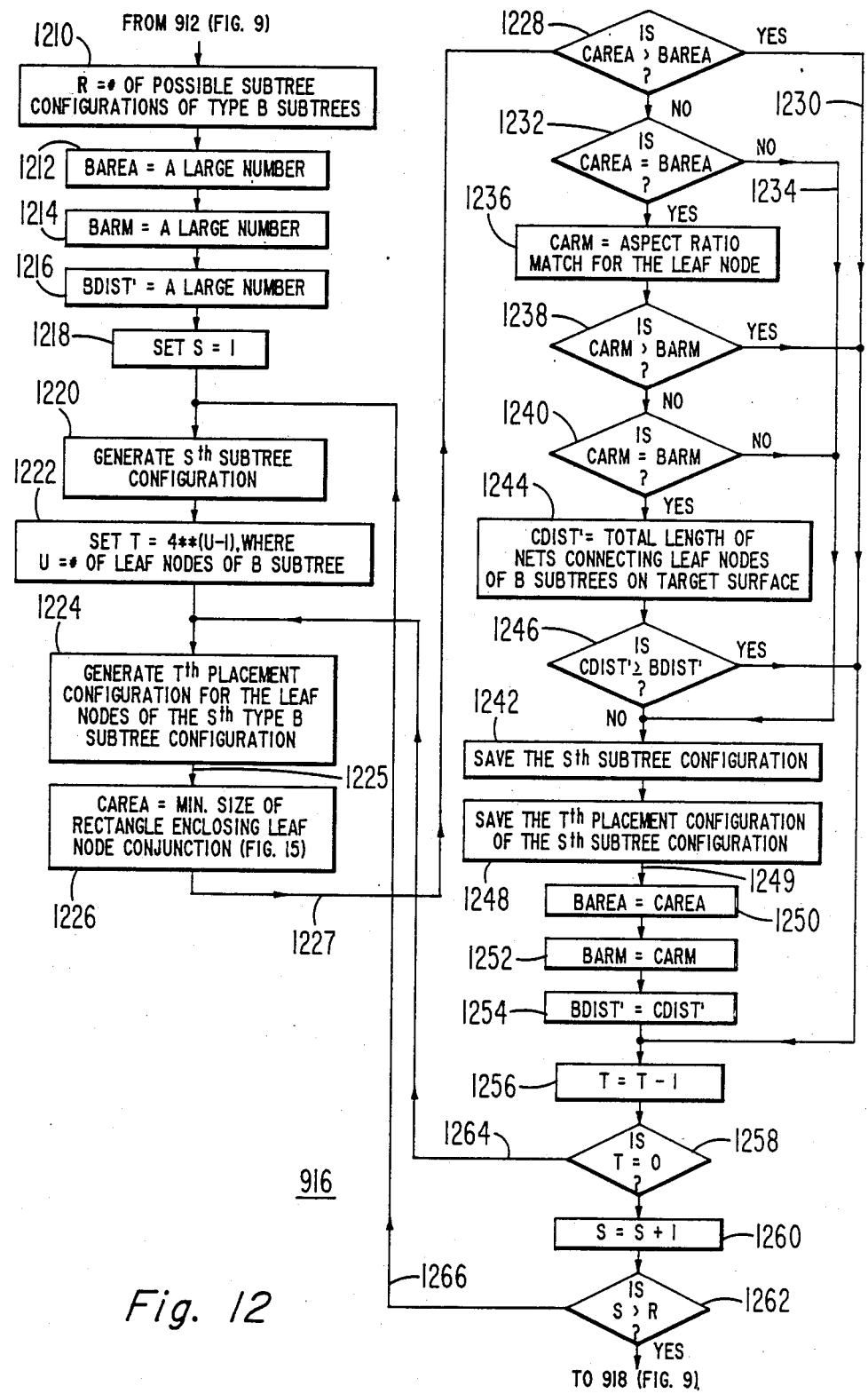
FIG. 12 is a more detailed flowchart of a portion of the flowchart of FIG. 9, relating to type B subtrees.

FIG. 12 is a detailed flow diagram of the logic represented by logic block 916 of FIG. 9. In block 1210, the variable R is set to equal the number of possible subtree configurations for the type B subtree. This is done according to Equation 4:

$$R = (1)(3) \ldots ([A-1][A-2]/2)([A][A-1]/2)$$

where A is the number of leaves of the B subtree under consideration.

Figure 13:
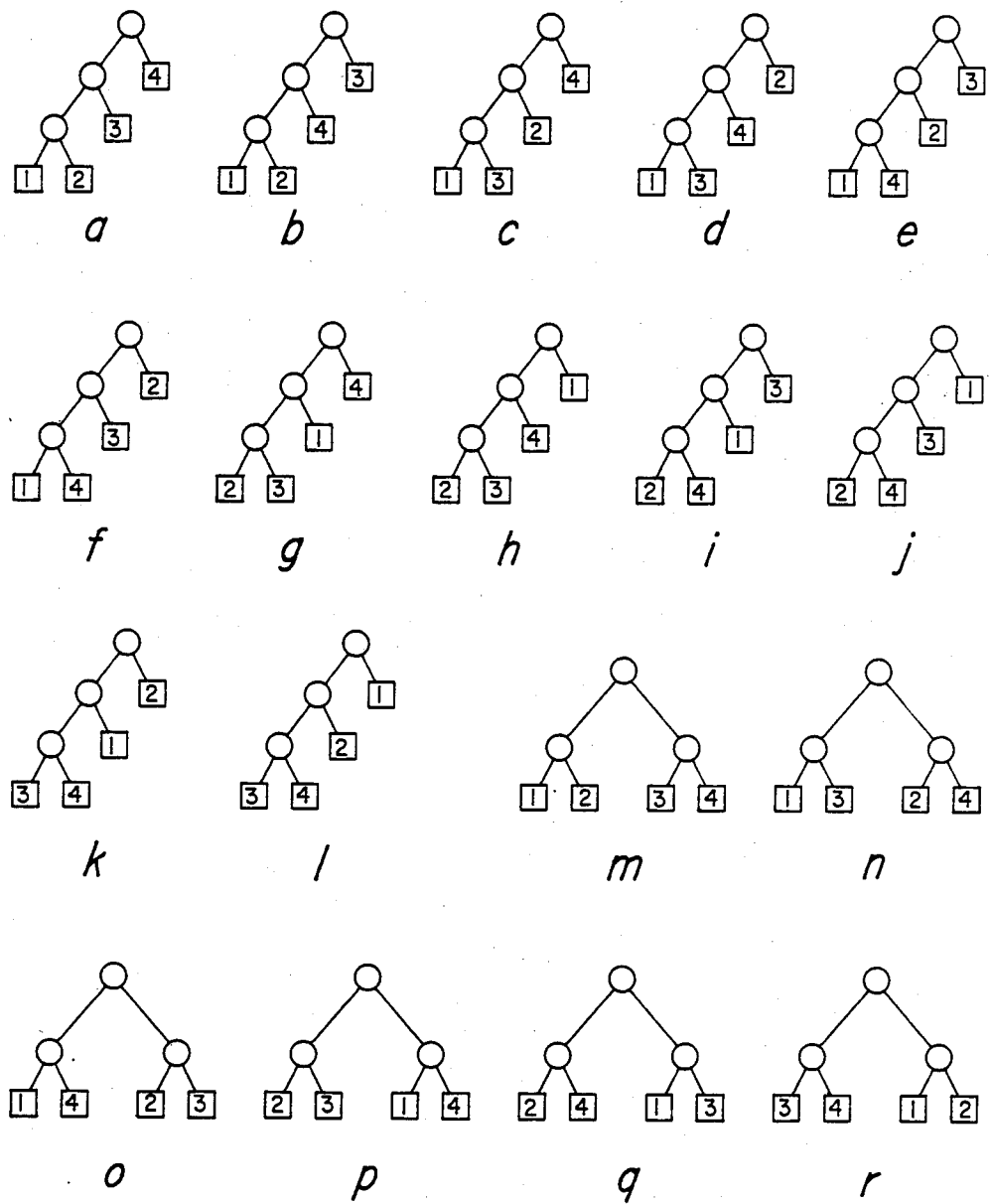
FIGS. 13a–13r, referred to jointly as FIG. 13, illustrate the type B binary subtree configurations which are evaluated by the flowchart of FIG. 12 when the subtree has four leaves.

FIG. 13 illustrates all possible subtree configurations (as opposed to placement configurations) for type B subtrees with four leaf nodes. The leaf nodes are numbered 1, 2, 3 and 4 and are placed in rectangles, and parent nodes are illustrated as circles. There are 18 such possible trees, even with only four nodes. There are many right-left, top-bottom placement configurations for each of the illustrated possible subtrees. No further explanation of FIG. 13 is believed necessary.

From block 1210 of FIG. 12, the logic proceeds to a block 1212. The variable BAREA, representing the best or least area so far found, is set equal to a large number. In logic block 1214, BARM, representing the best aspect ratio match factor, is set equal to a large number. The logic then flows to a block 1216, in which BDIST' is set equal to a large number. The logic then flows to a block 1218 in which a variable S is set equal to unity. S is a running variable used to keep track of how many configurations of B subtrees have been evaluated by the loop.

In block 1220, the $S^{th}$ subtree configuration is generated. As mentioned, FIG. 13 illustrates all possible subtree configurations for a type B subtree with four leaf nodes. Generally speaking, the logic associated with FIG. 12 generates all possible forms of subtree which can be generated with the given number of leaf nodes, and then for each of the possible configurations performs an evaluation of placement such as that described in conjunction with FIG. 11. Thus, the amount of computation required in the flowchart of FIG. 12 to perform the evaluations of FIGS. 13 and 11 greatly exceeds that which was required in the flow chart of FIG. 10 in order to perform the evaluation described in conjunction with FIG. 11. It is for this reason that the number of leaf nodes in a B subtree is maintained below the number of leaf nodes of the A subtrees. By controlling the number of leaf nodes in this fashion, the amount of computation for each type of subtree is comparable.

In block 1222, the variable T is set to the value $T = 4^{U-1}$ written as 4(U−1), where U is the number of leaf nodes of the type B subtree. This equation is similar to the equation evaluated in block 1010 of FIG. 10, but with different variable names to avoid confusion. From block 1222, the logic enters a loop which evaluates all possible placement configurations for one of the binary subtree configurations. This loop begins with block 1224, which generates the $T^{th}$ placement configuration for the leaf nodes of the $S^{th}$ subtree configuration of the the B subtree being evaluated. Block 1226 calculates variable CAREA, which is the area of the minimum sized rectangle which encloses the assembly of leaf nodes currently being evaluated. The calculation of CAREA is further detailed in conjunction with FIG. 15. From block 1226, the logic flows to a decision block 1228 in which CAREA is compared with variable BAREA. If the current area CAREA is greater than the best previous area, as measured by variable BAREA, the placement configuration is not satisfactory and is not considered further. In that event, the logic leaves decision block 1228 by the YES output and flows by a path 1230 to a block 1256 near the end of the loop for selection of another configuration and another attempt. However, if the current area CAREA is less than the previous best area, the logic leaves decision block 1228 by the NO output and flows to a further decision block 1232, in which CAREA is compared with BAREA. If CAREA is not equal to BAREA, this indicates the currently evaluated configuration is the best possible configuration among those tested, and this configuration is saved by taking logic path 1234 from the NO output of decision block 1232 to logic block 1242. On the other hand, if CAREA equals BAREA, further evaluation is performed in a block 1236. In block 1236**, a variable CARM is set equal to the aspect ratio match factor for the assembly of leaf nodes of the type B subtree. Aspect ratio match is calculated according to Equation 5:

$$ARM = 2 - (R_y + R_x)$$

where $$R_Y = Y_T/Y_A \text{ or } Y_A/Y_T,$$

and $$R_X = X_A/X_T \text{ or } X_T/X_A,$$

selected so that $(R_X)(R_Y) \geq 1$,
where:

$X_A$ and $Y_A$ are the X and Y dimensions, respectively, of the target area of the root node of the type B subtree, and $X_T$ and $Y_T$ are the actual X and Y dimensions, respectively, of the root nodes in the particular placement being evaluated, as illustrated in FIG. 14.

If the target area dimensions and actual dimension correspond, $Y_T/Y_A = 1$, and $X_A/X_T = 1$, whereupon $ARM = 2 - (1+1) = 0$. This is the perfect aspect ratio match. Therefore, best aspect ratio match corresponds to the lowest value of ARM.

Figure 14A:
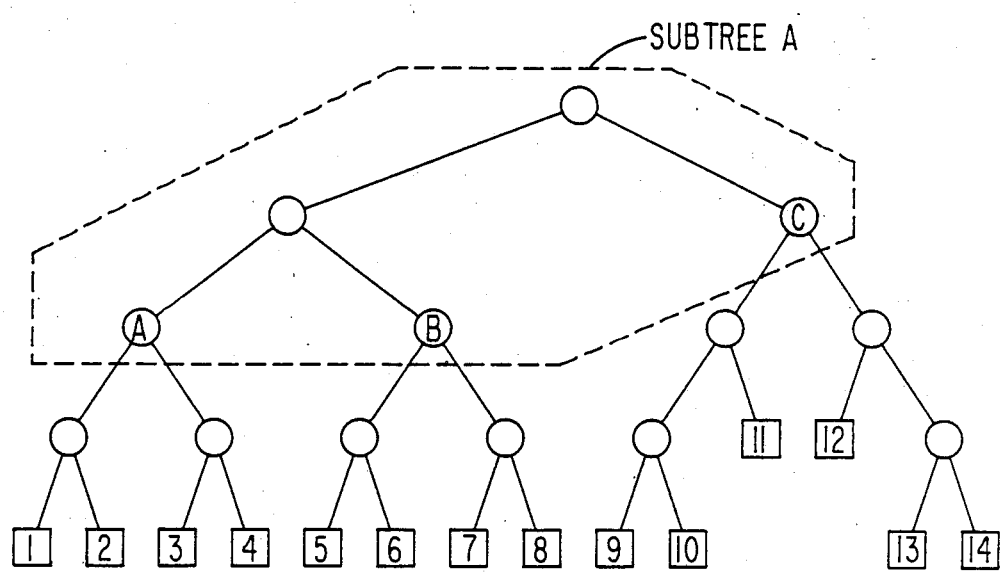
FIG. 14a–14c illustrates a chip surface and certain dimensions useful in understanding the aspect ratio match (ARM) criterion used in the evaluation performed by the flowchart of FIG. 12.
Figure 14B:
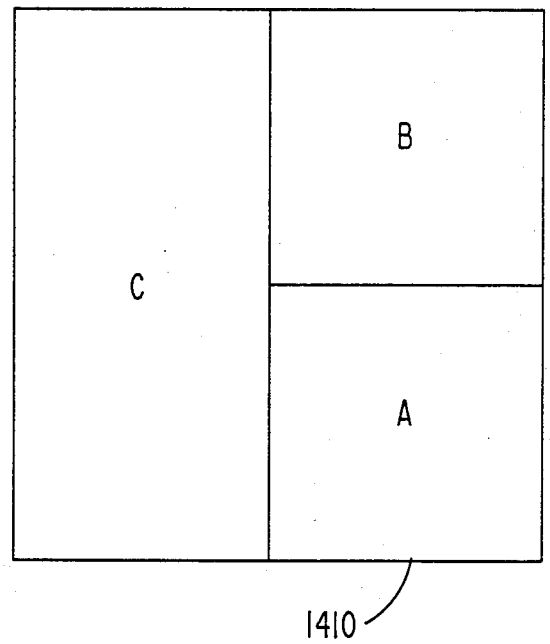
Figure 14C:
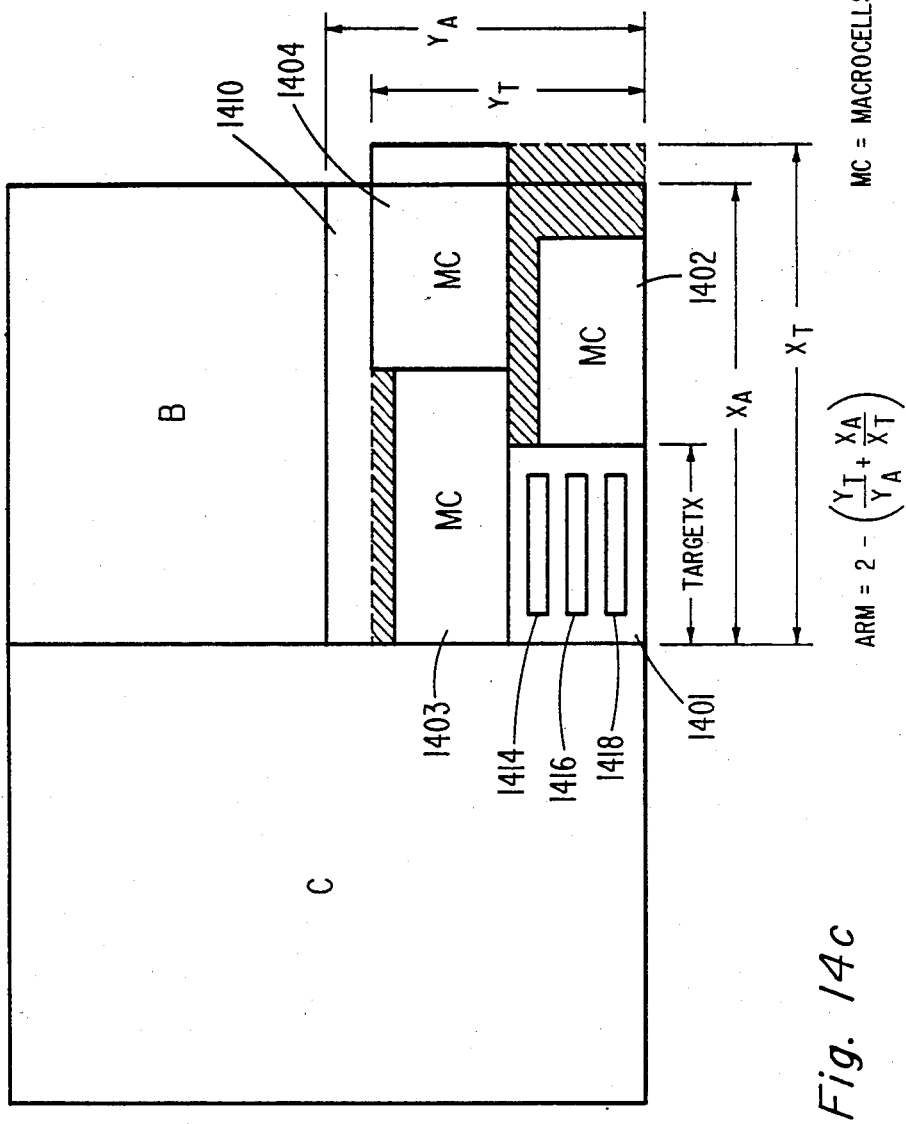

FIG. 14a illustrates the A subtree which is being evaluated, and FIG. 14b illustrates an example of a possible placement of the A, B and C leaf nodes of the A subtree. FIG. 14c illustrates one possible current configuration of the placement of the leaf nodes of the B subtree associated with the A leaf node of the A subtree. In FIG. 14c, domains 1401, 1402, 1403 and 1404 are being placed in target area 1410, corresponding to the A leaf node of the type A subtree of FIG. 14a. In the particular placement configuration here illustrated, 1401 is a standard cell domain to the left of macrocell domain 1402, and macrocell domain 1403 is to the left of macrocell domain 1404. The combination of 1403 and 1404 is at the top of the combination of 1401 and 1402. Since the areas and aspect ratios of the domains are already known, the aspect ratio of their combination in relationship to the aspect ratio of target area 1410 can be determined according to Equation 5.

After the evaluation of aspect ratio in logic block 1236 of FIG. 12, the logic flows to a decision block 1238 in which the current aspect ratio match CARM is compared with the previous best aspect ratio match BARM. If CARM is greater than BARM, the present configuration is not as good as a previously evalauted one, and the logic flows by the YES output of decision block 1238 and by path 1230 to begin another iteration. If CARM is not greater than BARM, the logic flows from decision block 1238 by the NO output to a further decision block 1240, in which CARM is again compared with BARM. If CARM is not equal to BARM, then it must be less than BARM and consequently the configuration is better than any previously evaluated configuration. In this event, the logic flow from decision block 1240 by the NO output to path 1234, bypassing blocks 1244 and 1246. If the current aspect ratio match equals the previous best aspect ratio match, the best configuration cannot be determined without further processing, in which case the logic leaves decision block 1240 by the YES output to a further block 1244, which computes the length CDIST' of net connecting the leaf nodes of the type B subtree in the particular placement configuration, and the logic flows to a further decision block 1246. In block 1246, the current length CDIST' is compared with the previous best distance BDIST'. If CDIST' is greater than or equal to BDIST', the configuration is less satisfactory than one previously evaluated, the logic flows by the YES output and path 1230 to the end of the iteration loop. If CDIST' is not greater than or equal to BDIST', the NO output of decision block 1246 directs the logic to block 1242.

As mentioned, block 1242 represents th saving of the $S^{th}$ subtree configuration as the best one so far evaluated. Block 1248 saves the $T^{th}$ placement configuration of the $S^{th}$ subtree configuration as the best.

From logic block 1248, the logic flows by a path 1249 to a further block 1250, representing the setting of the current value of BAREA to equal the newly found CAREA. Block 1252 represents the setting of variable BARM equal to CARM, and block 1254 represents the setting of BDIST' equal to CDIST'. Block 1256 reduces the value of variable T by unity, representing the reduction by one of the number of remaining placement configurations within a subtree configuration. Decision block 1258 compares the current value of T with zero to determine whether or not all the placement configurations (variations of T) of a particular subtree configuration have been evaluated. If not, the logic returns by a path 1264 to block 1224. Once all the placement configurations for a particular subtree have been evaluated, T becomes zero, and decision block 1258 directs the logic to a further block 1260, in which the value of S is incremented, and decision block 1262 compares the current value of S with R, the maximum possible number of subtree configurations. If S has not reached R, the logic flows by the line 1266 back to block 1220 to begin evaluation of another subtree. Eventually, all subtrees are evaluated and the logic flows from decision block 1262 to block 918 of FIG. 9.

Figure 15A:
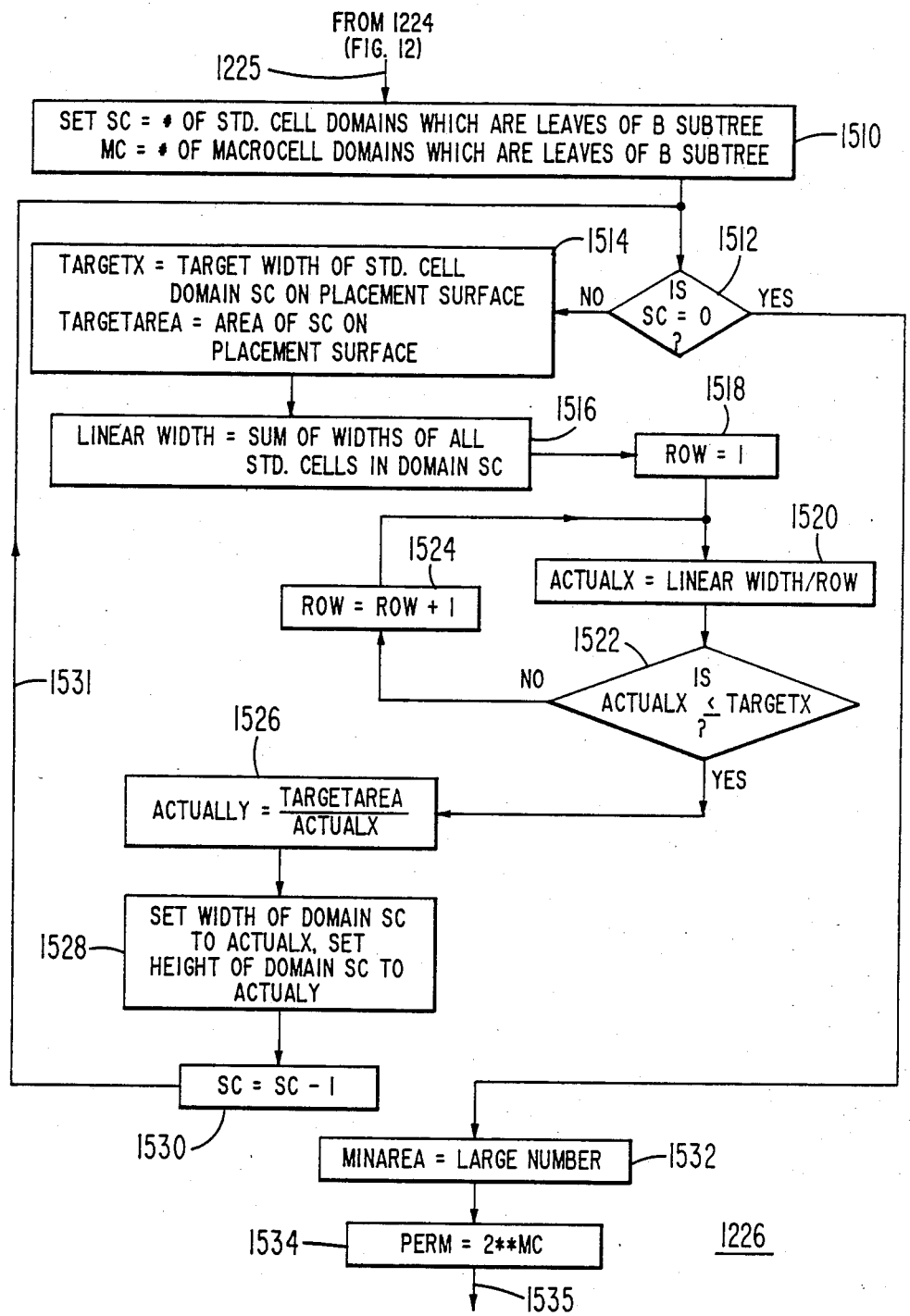
FIG. 15 is a more detailed flowchart which is a portion of the flowchart of FIG. 12 for selecting aspect ratios of standard cell domains and for selecting macrocell orientations for minimum area.
Figure 15B:
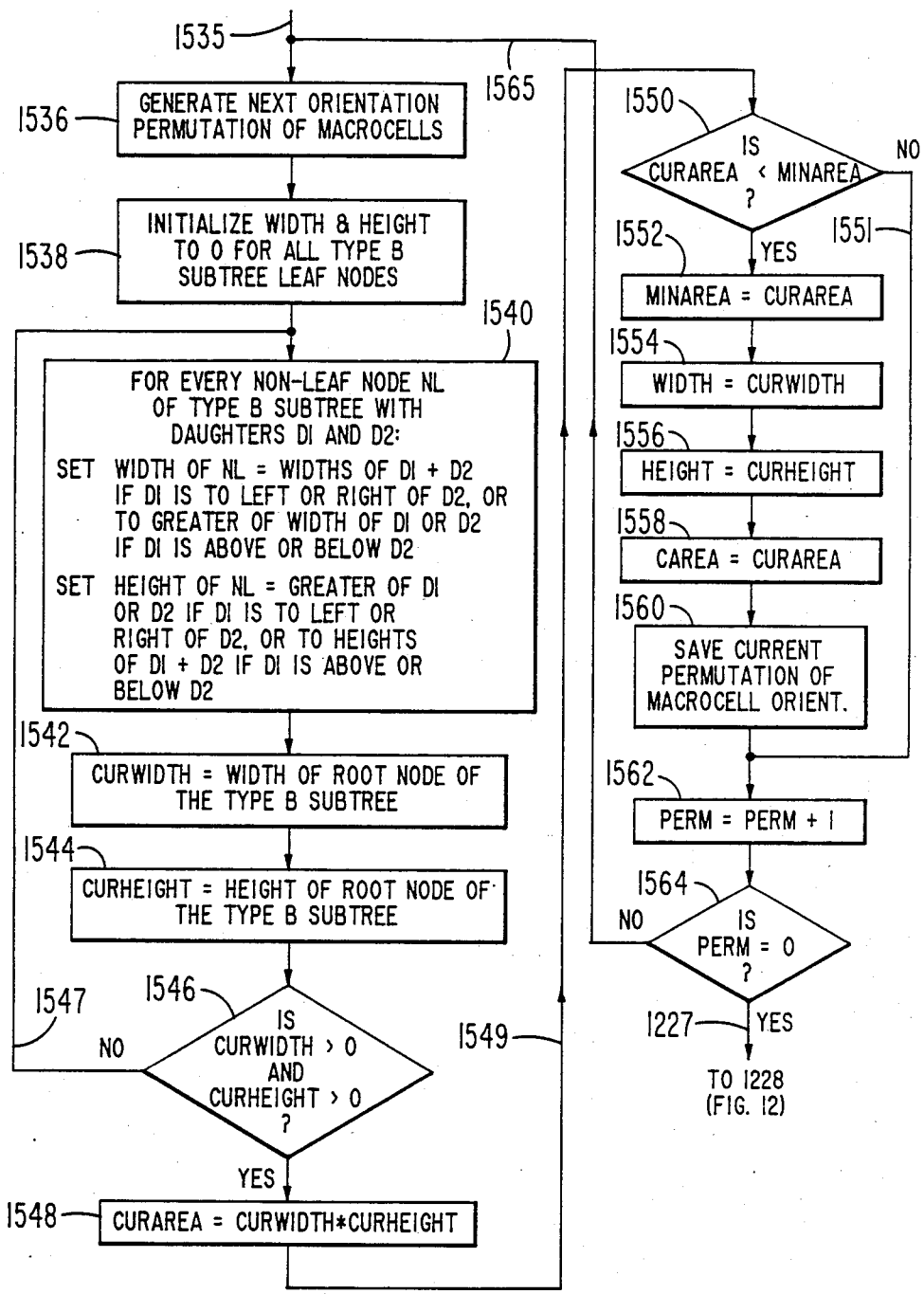

FIG. 15 illustrates details of the logic flow within block 1226 of FIG. 12. Block 1510 represents a setting of a variable SC to equal the number of standard cell domains in each leaf node of the type B subtree being evaluated, and also the setting of a variable MC equal to the number of macrocells which are leaves of the B subtree. The logic then flows to a decision block 1512, which is part of a logic loop. This iterative loop, for each standard cell domain, determines the number of rows of standard cells contained therein, which ultimately establishes the aspect ratio of the standard cell domain being placed. Decision block 1512 compares the value of variable SC with zero, to determine when processing has been completed. So long as processing remains to be done, the logic flows to block 1514 by way of the NO output of decision block 1512. In block 1514, a variable TARGETX is set equal to the target width of standard cell domain SC on the placement surface.

Referring to FIG. 14c, standard cell domain 1401 is illustrated as including three rows of standard cells 1414, 1416, and 1418, and as having a width TARGETX. While three rows of standard cells are illustrated in standard cell domain 1401, it should be emphasized that the logic loop of FIG. 15 is intended to establish the number of rows required for the target aspect ratio by beginning with all standard cells in one row, and progressively increasing the number of rows until the actual width of the standard cell domain is equal to or less than the width of the target area.

Block 1514 also sets a variable TARGETAREA equal to the area of standard cell domain SC (1401 of FIG. 14c) on the placement surface. From block 1514, the logic flows to a block 1516. In block 1516, a variable LINEARWIDTH is set equal to the sum of the widths of all standard cells in domain SC. From block 1516, the logic flows to a block 1518, which sets a variable ROW equal to one. The logic then enters a loop beginning with block 1520, in which the number of rows is progressively increased and the resulting width is evaluated. From logic block 1518, the logic flows to a block 1520, in which a variable ACTUALX is set equal to the quotient of the variable LINEARWIDTH divided by variable ROW. In decision block 1522, variable ACTUALX is compared with TARGETX, and so long as ACTUALX exceeds TARGETX, the logic flows by way of the NO output of block 1522 to a further block 1524, in which variable ROW is incremented, and the logic return to block 1520. The iterations of the loop including blocks 1520, 1522, and 1524 continually increments the number of rows until the actual width of the standard cells decreases below the available width of the TARGETAREA. Once the number of rows has been established, the logic leaves block 1522 by way of the YES output to a further block 1526, which sets a variable ACTUALY equal to the quotient of variable TARGETAREA divided by variable ACTUALX. This block simply determines the actual height of the standard cell domain, knowing the area and the width. Block 1528 sets the width of domain SC equal to ACTUALX, and sets the height of domain SC to ACTUALY. The logic them flows to a further block 1530, in which variable SC is decremented, and the loop returns to decision block 1512. This loop continues until all standard cell domains which are leaves of the B subtree are evaluated. Once the dimensions of all of the standard cell domains have been determined, the logic leaves decision block 1512 by the YES output and flows to a further block 1532.

The portion of the logic of FIG. 15 extending from logic block 1532 to logic block 1564 is intended to select the appropriate rotational position of the macrocells. Prior logic has determined the actual dimensions of the standard cell domains, and the fixed dimensions of the macrocells are also known. However, the rotational positioning of the macrocells can be selected. There are two allowable rotational positions of each macrocell, zero degrees and 90 degrees. For each possible position of each macrocell, each of the other macrocells may take one of two positions. The total number of possible permutations of the zero degree, 90 degree positions of the macrocells equals $2^{MC}$. Generally speaking, the logic extending from blocks 1532 to 1564 tries each possible rotational permutation and calculates the overall area. The overall area may change with changes in the rotation of a macrocell, because the dimensions of the standard cell domains change accordingly. That one positioning arrangement of the macrocells which minimizes the area is selected.

In block 1532, a variable MINAREA is set equal to a large number, and in block 1534 a further variable PERMutation is set equal to $2^{MC}$. The logic flows to a further block 1536 which generates the next permutation of the zero degree, 90 degree rotation of the macrocells. Block 1538 initially sets the width and height of all non-leaf nodes of the type B subtree equal to zero. The widths and heights of these non-leaf nodes will be updated further on in the loop. From block 1538, the logic flows to a block 1540.

In block 1540, the area of each non-leaf node NL, which is the parent of two daughter nodes, is evaluated by setting the width and height of NL. The width of a node NL is equal to the su of the widths of the daughter nodes if the daughter nodes are placed left-right. If the daughter nodes are placed top-bottom, the width of parent node NL is the width of that daughter node which has the greatest width. Also in block 1540, the height of parent node NL is established. The height of parent node NL is the sum of the heights of the two daughter nodes, if the daughter nodes are in a top-bottom configuration. If the daughter nodes are in a side-by-side configuration, the height of the parent node equals the greater of the heights of the daughter nodes. From block 1540, the logic flows to a further block 1542, in which the current width is set by setting a variable CURWIDTH equal to the widths of the root nodes of the type B subtree, as determined by repeated iterations through block 1540. Block 1544 sets the current height by setting a variable CURHEIGHT equal to the height of the root nodes of the type B subtree. A decision block 1546 forces iterative passes through blocks 1540, 1542 and 1544 by way of path 1547 so long as the root node dimensions are not greater than zero, indicating what the root node of the B subtree has not yet been calculated. Eventually, the root node area will be established and the logic exits block 1546 by the YES output path.

Block 1548 establishes the current area by setting variables CURAREA equal to the product of the variables CURWIDTH multiplied by CURHEIGHT. Decision block 1550 compares current area with the MINAREA, and if the currently calculated area is less than the previously calculated MINAREA, the logic flows by the YES output to block 1552. If the currently calculated area is greater than MINAREA, there is no need to save the current permutation, and the logic flows by the NO output of decision block 1550 and by way of a path 1551 to block 1562.

In block 1552, the value of MINAREA is updated to equal CURAREA. In block 1554, variable WIDTH is set equal to CURWIDTH, and variable HEIGHT is set equal to CURHEIGHT in block 1556. In block 1558, variable CAREA is set equal to CURAREA. Variable CAREA is used in FIG. 12. The logic flows to a block 1560, which represents the saving of the current permutation of the orientation of the macrocells. The number of permutations is decremented by one in block 1562, and the variable PERM is compared with zero in a decision block 1564. So long as variable PERM is greater than zero, the logic loops by the NO output and path 1565 back to block 1536. When all permutations have been evaluated, the logic flows from decision block 1564 to block 1226 of FIG. 12.

As so far described, all the leaf nodes of the A and B subtrees of the binary tree have been placed, together with dimensions assigned to the root nodes of the type B subtrees. The next step, accomplished in block 228 of the logic flow of FIG. 2, prunes the type B subtrees, except for their root nodes, from the remainder of the binary tree structure. The logic flow contained within block 228 of FIG. 2 is detailed in FIG. 16. In FIG. 16, block 1610 represents the sequential selection of subtrees beginning with the highest order subtrees and proceeding in a breadth-first manner, as described above, to lower-order subtrees. In decision block 1612, the type of subtree is identified. If it is not a type A subtree (i.e., if it is a B subtree), the logic proceeds to block 1614 in which every node of the type B subtree except for the root node is deleted. The logic then flows to decision block 1616. On the other hand, if the subtree is identified in decision block 1612 as being a type A subtree, the logic flows directly to decision block 1616. In decision block 1616, the need to process further subtrees is established, and when further subtrees are to be processed, the logic loops by way of the YES output back to block 1610. When all of the subtrees have been evaluated and pruned as required, the logic flows from the NO output of decision block 1616 to decision block 230 of FIG. 2.

Figure 17:
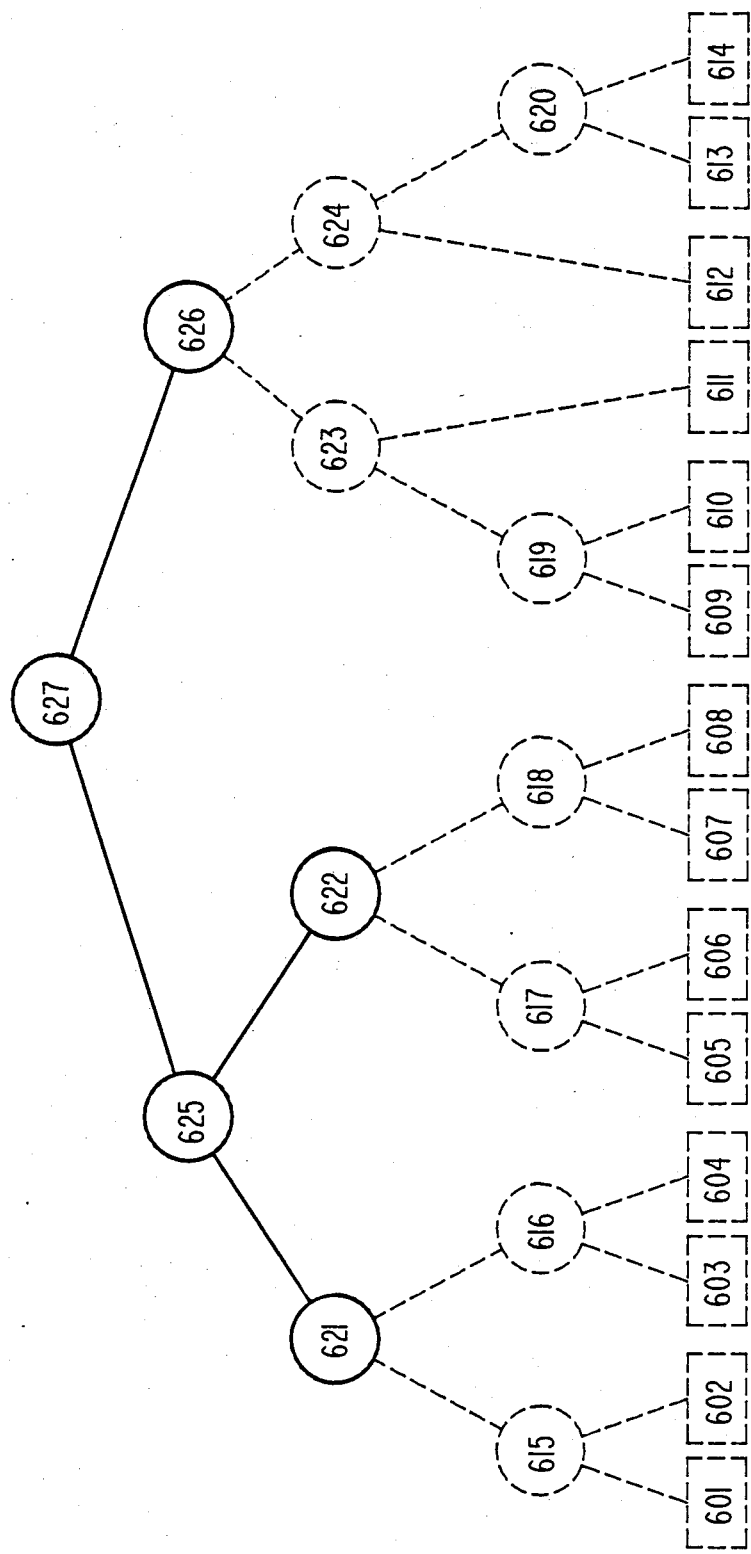
FIG. 17 illustrates a pruned binary tree which results from the operation described in conjunction with the flowchart of FIG. 16.

The process described in conjunction with FIG. 16 deletes the lowest level subtrees, leaving only their roots. FIG. 17 illustrates a binary tree similar to that of FIG. 6, in which the portions pruned during the first pass are illustrated in phantom. The roots of the B subtrees (621, 622, 626 of FIG. 17) then become leaves of the remaining binary tree. The next higher-level subtrees then become the B subtrees. In this case, with only one A subtree, it becomes the sole B subtree.

Decision block 230 of FIG. 2 determines whether there is only one node left in the pruned binary tree. If there is only one node remaining, the pruning process is finished. If more than one node remains, as in the case of FIG. 17, the logic proceeds by way of the NO output of block 230 and a logic path 232 back to block 224, to once again begin the process of placing the leaves of the pruned binary tree for optimum area and net lengths, followed by further pruning. Eventually, all the ascending levels of placement and pruning have been accomplished, whereby only a single node remains. At that time, decision block 230 routes the logic by the YES output to a further logic block 234, which establishes the orientation of macrocells, as detailed in conjunction with FIG. 18. The types of orientation evaluated and selected by the logic of FIG. 18 are illustrated in FIG. 20.

Figure 20:
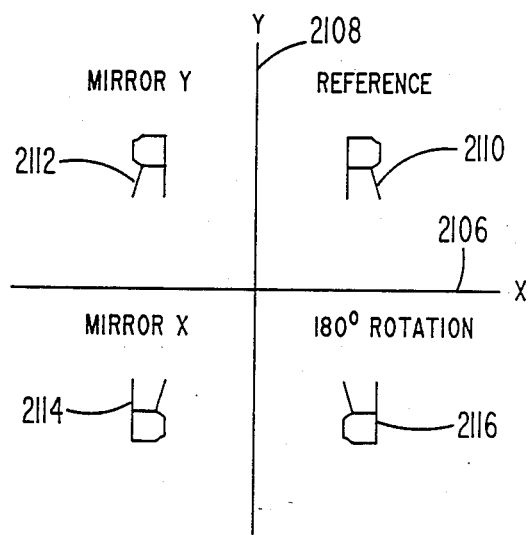
FIG. 20 illustrates the mirror and rotated images considered in the logic of FIG. 18.

In FIG. 20, an X axis 2106 and a Y axis 2108 are illustrated, together with the reference letter R illustrated as 2110 in a normal or reference position. A mirror image about the Y axis of normal position 2110 is illustrated as 2112 and is designated "mirror-Y". A mirror image of normal position 2110 about the X axis is illustrated as 2114 and designated "mirror-X", and a 180° rotation is illustrated as 2160.

In FIG. 18, block 1810 sets a variable V equal to the total number of macrocells. The logic flows from block 1810 to a further block 1812, which initializes the orientations of all macrocells to an arbitrary "normal" orientation. The logic then flows to a decision block 1814, which compares the value of variable V with zero to determine whether any macrocell orientations remain to be tested. If V=0, the logic flows by the YES output of decision block 1814 and a path 1816 to the output of FIG. 18, which is the output of block 234 of FIG. 2. If macrocell orientations are available to be tested, the logic flows by the NO output of decision block 1814 to a further block 1817. Block 1817 represents the assignment or setting of the best length (variable BLEN) to equal the total lengths of all nets connecting standard cell domains and macrocells. The logic then flows to a further block 1818, in which a variable FLAG is set equal to zero. The variable FLAG represents by a logic zero condition that the orientation of a macrocell has not changed as a result of the iteration, and a logic one indicates that the orientation has changed. A running variable W is set equal o one in a further block 1820. Variable W represents the number of macrocells which have been processed. Logic flows from block 1820 to a further block 1822 which assigns the current length CLEN to equal the total lengths of nets connecting standard cell domains and macrocells, with the $W^{th}$ macrocell in the mirror-X orientation relative to the current orientation. The logic then flows to a decision block 1824, in which the current length CLEN is compared with the previous best length BLEN. If CLEN is less than BLEN, the logic leaves decision block 1824 by the YES output and arrives at a block 1826, in which the current orientation of the $W^{th}$ macrocell is set to the mirror-X orientation, and the logic then flows by a logic path 1828 to a further block 1830, which sets the FLAG=1.

If the current length as evaluated in decision block 1824 is greater than the previous best length, the NO output of decision block 1824 directs the logic to block 1832, in which the current length CLEN is set equal to the total length of nets connecting standard cell domains and macrocells with the $W^{th}$ macrocell oriented in the mirror-Y orientation relative to the previously current orientation. Decision block 1834 compares CLEN with BLEN. If CLEN is less, the logic then flows by the YES outset of block 1834 to block 1836. Block 1836 sets the current orientation of the $W^{th}$ macrocell to the mirror-Y orientation, and directs the logic by path 1828 to block 1830.

If decision block 1834 finds that the current length is greater than the previous best length, its NO output directs the logic to a block 1838. In block 1838, the value of CLEN is determined with the $W^{th}$ macrocell in a 180° rotation relative to the current orientation of the macrocell. Decision block 1840 compares the net lengths as described above, and if the current orientation of the macrocell is the best (CLEN < BLEN), the YES output of decision block 1840 directs the logic to block 1842, in which the 180° rotation is established as the current orientation. The logic then flows to block 1830, in which FLAG is set to 1, as mentioned. From block 1830, the logic flows to block 1844, in which the value of best-length variable BLEN is set equal to the value of CLEN. The logic one, logic 0 state of FLAG is evaluated in block 1846. As mentioned, A FLAG condition of logic one represents reorientation of any one macrocell during the iteration. So long as a macrocell has changed orientation as a result of the iteration, further iterations are called for, and decision block 1846 directs the logic back to block 1818 to begin another iteration. If the iteration has resulted in no change in the position of any macrocell, then the orientation optimization procedure is finished, whereby the logic exits by the YES output of block 1846, and returns to block 238 of FIG. 2.

If CLEN is greater than or equal to BLEN as evaluated in decision block 1840 of FIG. 18, the NO output directs the logic to block 1848, which represents retention of the original orientation of the $W^{th}$ macrocell at the beginning of the iteration of that macrocell. The logic then flows to block 1850, representing the updating of variable W to W+1, which in turn represents selection of the next macrocell for orientation evaluation. Decision block 1852 compares the value of W with V, the total number of macrocells, to determine if all the macrocells have been evaluated. If macrocells remain to be evaluated, the logic loops by way of the NO output of decision block 1852 back to block 1822, whereas if all the macrocells have been evaluated for orientation, the logic flows to decision block 1846.

From block 234 of FIG. 2, the logic flows to a further block 236, which represents standard cell placement in the domains, and to a block 240, which represents estimated detailed wire routing between the standard cells and macrocells as placed on the target surface, as for example in accordance with the above-mentioned Sangiovanni article.

Figure 21:
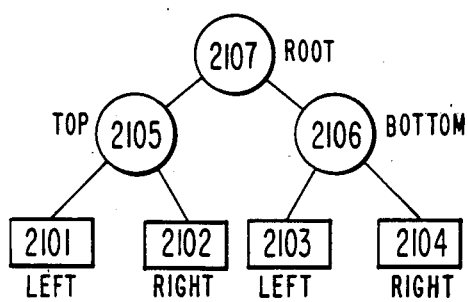
FIG. 21 illustrates a binary tree structure which is the basis for a layout used as an example for power bus layout according to the invention.
Figure 22:
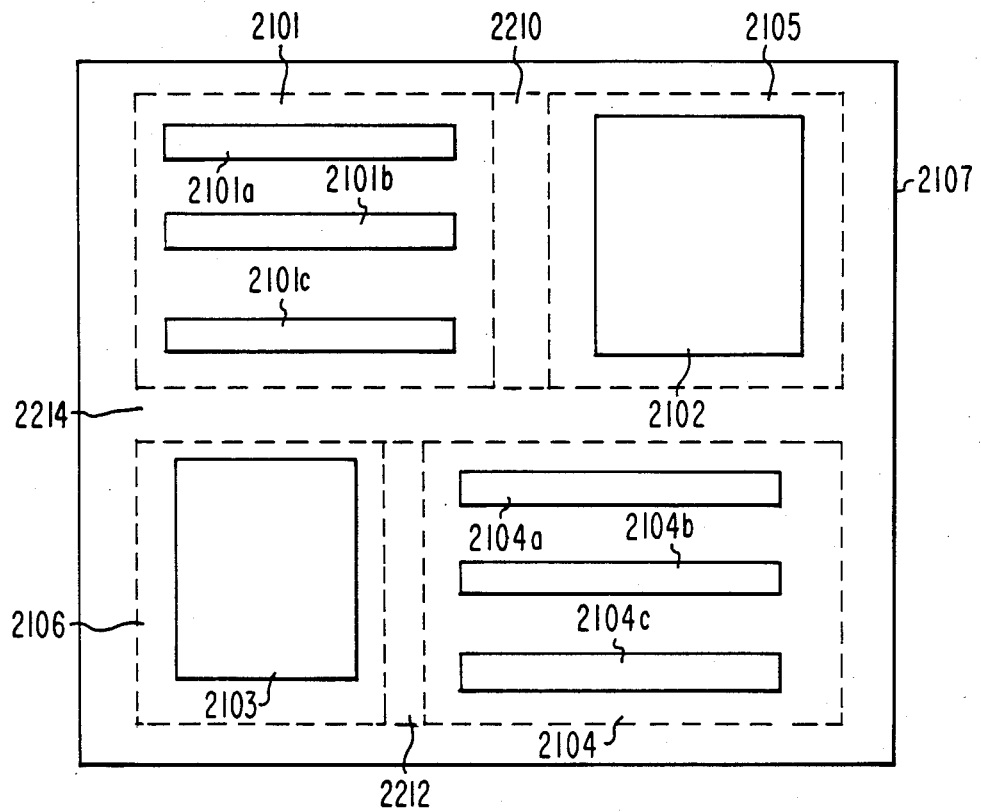
FIG. 22 represents the physical layout of circuit elements corresponding to the binary tree structure of FIG. 21, illustrating macrocells and standard cell domains formed into superdomains, with wire routing channels defined between superdomains and between adjacent daughter elements of superdomains.

From block 240, the logic flows to a further block 242, as mentioned previously, in which a mesh power bus structure is laid out or routed in accordance with the invention. FIG. 21 illustrates an example of a binary tree of standard cell domains and macrocells including leaf nodes 2101, 2102, 2103, and 2104, superdomains 2105 and 2106, and a root node 2107. Leaf nodes 2101 and 2104 represent standard cell domains, and leaf nodes 2102 and 2103 represent macrocells. The physical placement of macrocells and standard cell domains corresponding to the binary tree of FIG. 21 is illustrated in FIG. 22. In the arrangement of FIG. 22, standard cell domain 2101 includes three rows of standard logic cells, 2101a, 2101b, and 2101c and is to the left of macrocell 2102 to form superdomain 2105. A wiring or wire routing channel 2210 lies between standard cell domain 2101 and macrocell 2202. Macrocell 2103 is to the left of standard logic cell domain 2104, which also includes three rows of standard logic cells, and macrocell 2103 together with standard cell domain 2104 forms superdomain 2106. A wiring channel 2212 lies between standard cell domain 2103 and macrocell 2104. Superdomain 2105 is above superdomain 2106, and both together form root superdomain 2107. A further wiring channel 2214 lies between superdomains 2105 and 2106.

Figure 23:
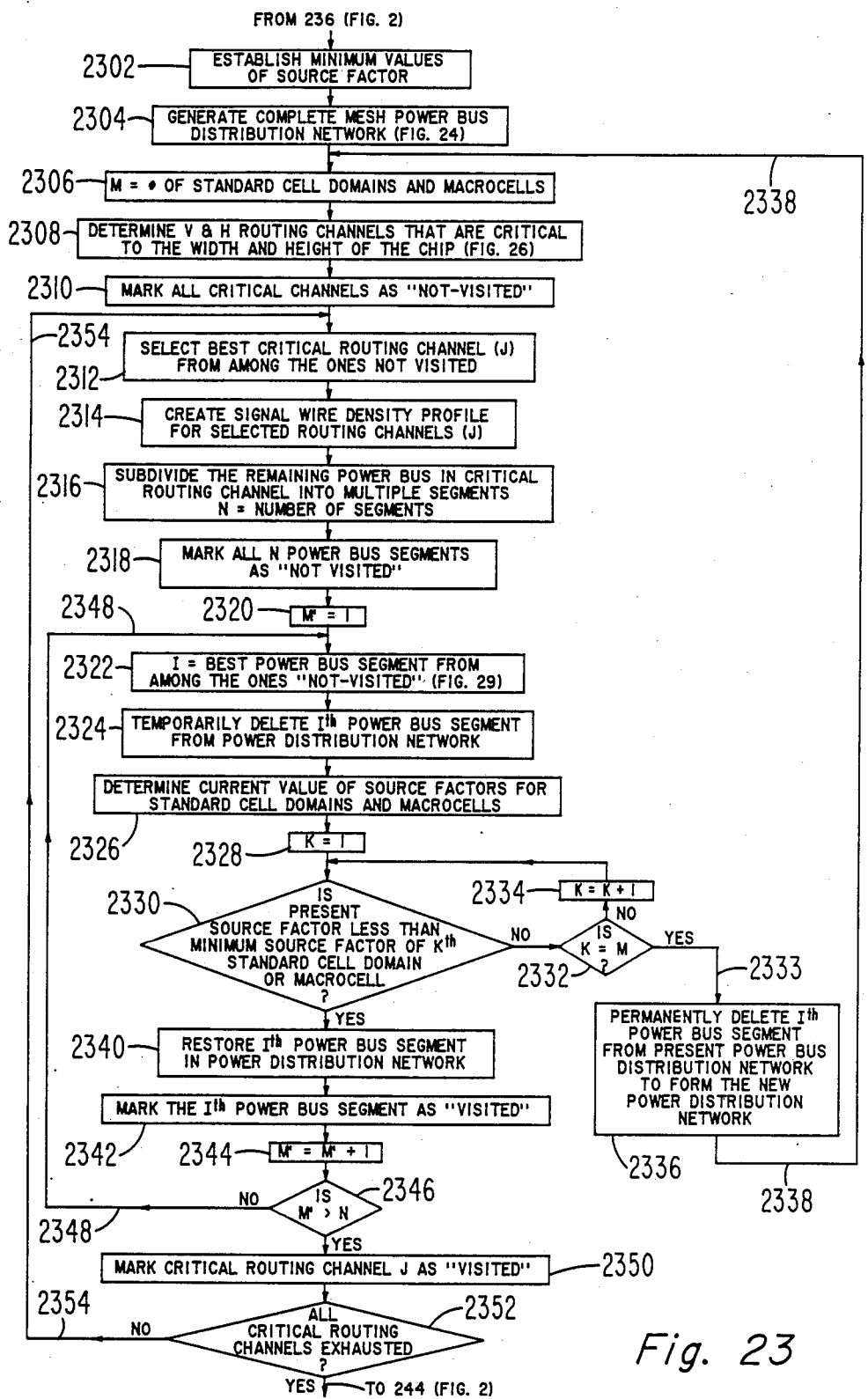
FIG. 23 is a detailed flowchart illustrating a method according to the invention for laying out a power distribution system.

FIG. 23 is a detailed flowchart of steps for the generation of a mesh power bus structure in accordance with the invention. In FIG. 23, the logic arrives from block 236 of FIG. 2 at a block 2302, which represents the establishing of minimum values of a source factor for standard cell domains and for macrocells. The source factors are established based upon the information originally supplied by the user and by technology information indicative of the current requirements of the macrocells and standard cells. This is described below in conjunction with FIG. 30. The next following block, block 2304, represents generation of the complete mesh power bus distribution structure or network. The order in which the steps of blocks 2302 and 2304 are performed is not material, and the description begins with the description of block 2304. Details of block 2304 are illustrated in FIG. 24.

Figure 24:
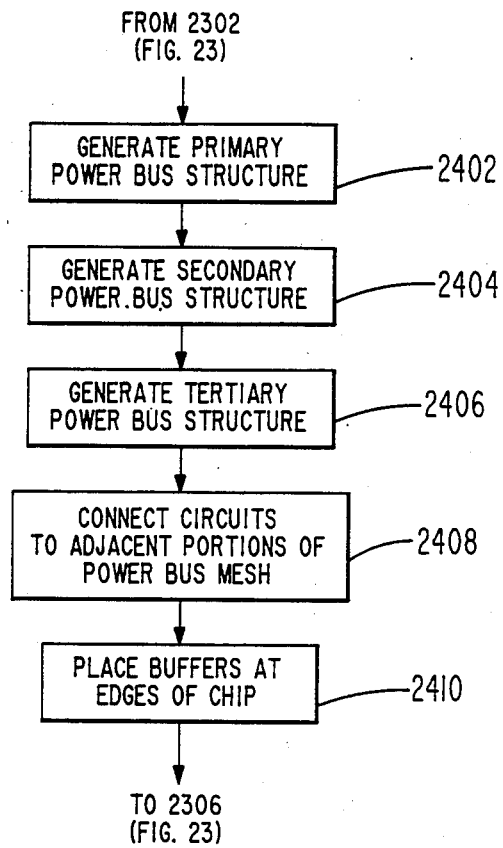
FIG. 24 is a detailed flowchart illustrating details of a portion of the flowchart of FIG. 23 relating to laying out a complete power bus distribution structure.
Figure 25:
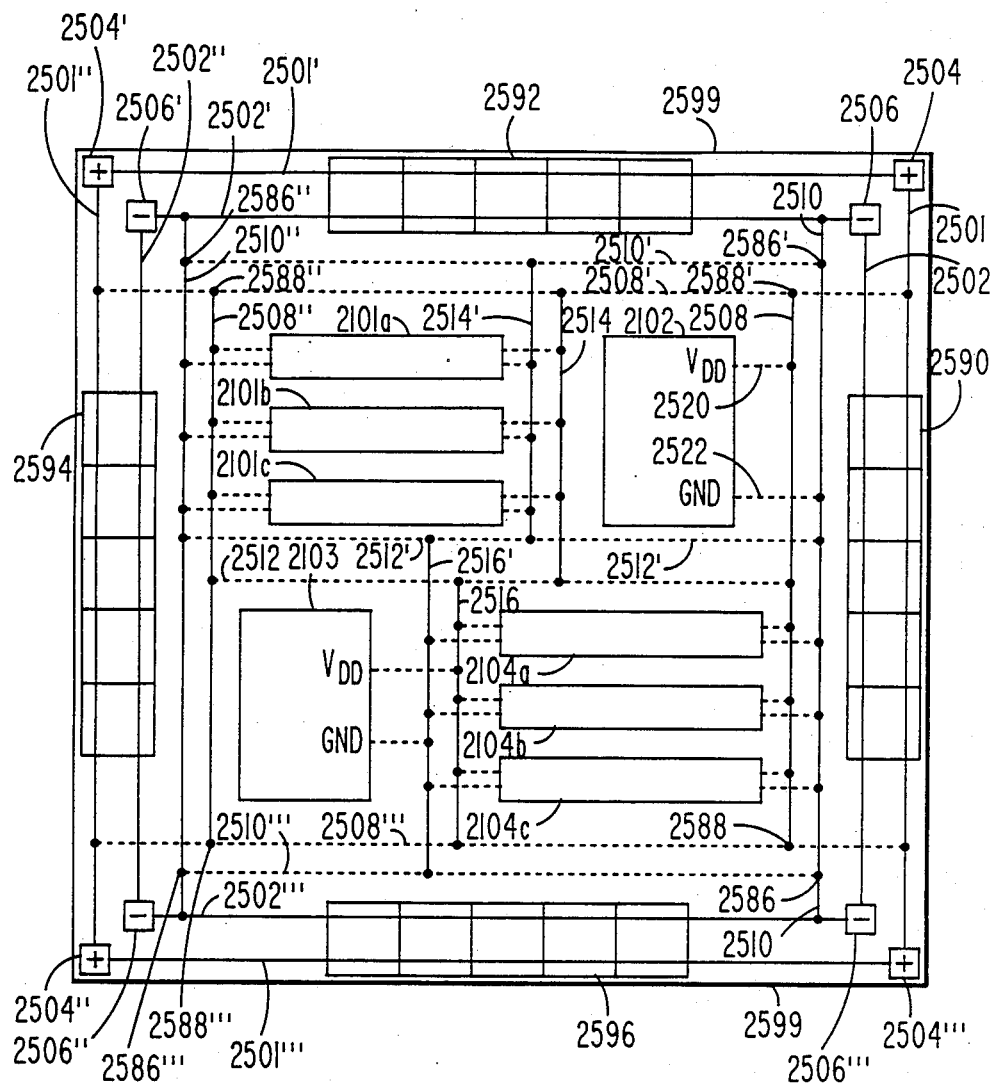
FIG. 25 represents the layout of FIG. 22 together with primary, secondary and tertiary power buses placed, according to the method described in conjunction with FIG. 24, within the wire routing channels.

The steps detailed in FIG. 24 generate the power bus structure illustrated in FIG. 25. It will be understood that FIG. 25 is highly simplified, having only two standard cell domains and two macrocells on the entire chip. Actual chips may have up to one hundred standard cell domains and macrocells at the present state of the art. FIG. 25 is based upon FIG. 21, and elements of FIG. 25 corresponding to those of FIG. 21 are designated by the same reference numerals. The generation of the power bus structure of FIG. 25 begins with block 2402 of FIG. 24, which represents the placing of the primary power bus structure. This involves placing an upper metallization level (represented by a solid line) positive power bus 2501 (FIG. 25) in parallel with a further upper metallization level negative power bus 2502 near the extreme right of the periphery 2599 of the chip surface. A further parallel set of upper metallization positive and negative power buses 2501' and 2502', respectively, is placed orthogonally thereto near the upper edge of the chip. The upper ends of buses 2501 and 2502 make electrical contact with buses 2501' and 2502', but the connections are hidden by power bonding pads described below. Further parallel bus pairs 2501' and 2502", and 2501''' and 2502''' are placed along the left and lower edges, respectively, of the chip, creating a nested pair of primary power buses extending around the inner periphery of the chip surface. At the intersection of each primary power bus such as 2501 with 2501', and at other corners, power bus bonding pads designated as 2504, 2506 provide locations to which off-chip bonding wires may be connected to the primary buses in known fashion, as by compression welding. Similar bonding pads 2504', 2506'; 2504"... 2506''' are provided at the other corners of the chip and are connected to buses 2501, 2502. As mentioned, primary power buses 2501 and 2502 are formed in an upper metallization level of the chip, as represented in FIG. 25 by solid lines. A lower metallization level is illustrated by a dashed line.

Next, block 2404 of FIG. 24 adds a second pair of circumferential secondary power buses within the region of FIG. 25 surrounded by primary power buses 2501, 2502. Unlike the primary power buses 2501, 2502, which are formed in the upper metallization level of the chip, the secondary power buses are formed in both upper (solid line) and lower (dashed line) metallization levels, depending upon the direction of the run. The positive secondary power bus is designated as 2508, and the negative secondary power bus is designated as 2510. As illustrated in FIG. 25, both the positive secondary power bus 2508 and the negative secondary power bus 2510 extend vertically, and are at the upper metallization level, as indicated by the solid line. Positive and negative secondary power buses 2508' and 2510', extending horizontally, are at the lower metallization level, as represented by the dashed lines. Vertically-extending portions 2508'' and 2510'' of the positive and negative secondary power buses, respectively, are at the upper metallization level, and horizontally-extending portions 2508''' and 2510''' are at the lower metallization level.

Negative secondary power bus 2510 at the upper metallization level extends to, intersects and makes contact and electrical connection at its ends to upper level negative primary power buses 2502' and 2502'''. Similarly, upper level negative secondary power bus 2510'' extends to, intersects and makes contact at its ends to upper level negative primary power bus 2502' and 2502'''. If one were to attempt to extend secondary positive power bus 2508 to intersect primary power bus portions 2501', 2501''', it would of necessity have to cross negative primary power bus 2502' and 2502'''. This is not possible without some kind of insulated bridge, because they are both at the same upper metallization level. Instead, lower level secondary power bus 2508' extends to a point directly under positive primary power bus 2501 at the right, and extends at the left to a point directly under positive primary power bus 2501''. Connection is made between positive primary power bus 2501'' and positive secondary power bus 2508' by through vias (vias) which pass from one power bus to the other (a direction orthogonal to the plane of the paper in FIG. 25). Positive secondary power bus 2508, which could not be extended to receive power from positive primary power bus 2501' or 2501''', can be connected at its upper end to positive secondary power bus 2508' and at its lower end to positive secondary power bus 2508'''. Similarly, upper metallization level positive secondary power bus 2508'' is connected by vias at its upper and lower ends to lower metallization level positive secondary power bus portions 2508' and 2508''', respectively. It will be noted that in the secondary power bus structure, the buses running in the vertical direction in the Figure are at the upper metallization layer, and the buses running in the horizontal direction in the Figure are at the lower metallization layer.

The primary and secondary power buses are the main current carrying conductors of the bus system, and are formed with a relatively large cross-section, so as to insure low IR voltage drop. Thus, the junctions of the secondary power buses, such as junctions 2586 and 2588, are electrically equivalent to power bonding pads 2504'' and 2506'''. Similarly, junctions 2588' and 2586' are electrically equivalent to power bonding pads 2504 and 2506, respectively, and the other corresponding junctions of the secondary buses are electrically equivalent to the nearby power bonding pads.

In the layout as generated by the binary tree structure, all superdomains are made up of at least two daughter elements. The daughter elements always have one routing channel therebetween. In the arrangement of FIGS. 22 and 25, horizontal routing channel 2214 lies between superdomains 5 and 6. Between domains 2201 and 2202, and between domains 2203 and 2204, there are vertically oriented channels 2210, 2212. Naturally, in a more complex structure, a multitude of channels would occur in each direction. The next logic step in FIG. 24 is represented by block 2406, and relates to placement of tertiary power bus pairs in all channels between superdomains, and between the daughter elements of the lowest level superdomains. Thus, tertiary power bus pairs pass through the routing channels between standard cell domains, between standard cell domains and macrocells, and between macrocells. As in the case of the secondary power buses, in the Figure vertical runs are at the upper metallization layer and horizontal runs are at the lower metallization layer. In FIG. 25, a tertiary power bus pair 2512, 2512' is routed horizontally through channel 2214 lying between superdomains 2205 and 2206. (The channels are not separately designated in FIG. 25, but their locations in FIG. 25 may be ascertained by reference to FIG. 22.) Positive tertiary power bus 2512 is at the lower level (dashed line), and terminates under positive secondary power buses 2508 and 2508''. Through vias make the connections therebetween. Negative tertiary power bus 2512' extends horizontally through channel 2214 at the lower metallization level and has its extreme ends ending under negative secondary power buses 2510'', 2510, and is connected thereto by vias.

Positive and negative upper-level (solid line) tertiary power buses 2514, 2514', respectively, extend vertically through channel 2210 lying between standard cell domain 2101 and macrocell 2102. The upper extreme end of positive tertiary power bus 2514 ends over secondary power bus 2508', and the lower end ends over tertiary power bus 2512. The connections at the extremes ends of bus 2514 are made by vias. Negative tertiary power bus 2514' has its extreme ends lying over negative secondary power bus 2510' and tertiary power bus 2512', and is also connected by vias. A pair of positive (2516) and negative (2516') tertiary power buses extend vertically at the upper metallization level (solid line) through channel 2212 (see FIG. 22) lying between macrocell 2103 and standard cell domain 2104. Negative tertiary power bus 2516 overlies, at its upper end, negative tertiary power bus 2512, and at its lower end overlies negative secondary power bus 2510'''. Connections are made by vias. Positive tertiary bus 2516 overlies positive tertiary power bus 2512 at its upper end, and at its lower end overlies positive secondary power bus 2508'''.

Generally speaking, all channels intersect, and the positive and negative power buses are routed therethrough with the vertically extending buses routed at the upper metallization layer and the horizontally extended buses extend routed at the lower metallization layer. The extreme ends of each bus extend to, and end, either at, over or under a bus of the same polarity. All buses are connected at their extreme ends to another bus, by way of vias if at the other metallization layer. It will be noted that many more connections exist than the minimum necessary to carry power to a bus. For example, positive tertiary bus 2516 is connected at both its ends to other positive buses, but actually requires only one such connection. The multiplicity of connections generates a mesh structure extending through all the channels, and provides a low resistance from any point to the source. The all-vertical routing at the upper metallization level and all-horizontal routing at the lower metallization level (except for the primary power buses) allows signal wire routing in either direction without blockage.

As so far described, a mesh power bus distribution structure has been generated which flows through all channels between domains and macrocells and the adjacent domains or macrocells. As represented by block 2408 of FIG. 24, connections must now be made between the mesh bus distribution structure and the circuits to be powered, which are the macrocells and the rows of standard cells of the standard cell domains. As illustrated in FIG. 25, macrocell 2102 is connected from its $V_{DD}$ terminal by way of a horizontally-extending lower metallization level connection 2520 to a point directly under positive secondary power bus 2508, and the connection is made by a via. The ground (GND) terminal of macrocell 2102 is connected by a lower level (horizontally extending) bus 2522 to a point under negative secondary power bus 2510. If macrocell 2102 had been oriented with the $V_{DD}$ and GND connections at the bottom, the connections 2520 and 2522 would have been vertically extending, and therefore would have been formed in the upper metallization level, and would have ended above tertiary power bus pair 2512. Some macrocells have power connections on a plurality of sides, and such connections are made to the appropriate adjacent buses by the appropriate level.

Each row of a standard cell domain is connected at its extreme ends to the adjacent power buses. For example, the upper row 2101a of standard cell domain 2101 is connected at its left and right extremes to positive and negative secondary power buses 2508″, 2510″ and 2514, 2514′, respectively. Since the rows of standard cells in standard cell domain 2101 are horizontal, the connections are made in a horizontal direction and therefore at the lower metallization level.

In order to make signal connections to the integrated circuit chip, it is common to use input/output buffers. Such buffers are advantageously placed near the outer periphery of the chip. The placing of buffers is represented in FIG. 24 by block 2410. As illustrated in FIG. 25, four sets of buffers 2590, 2592, 2594, and 2596 are placed at locations which appear to be astride the primary power buses. The circuitry of the buffers is either routed around the primary power buses, or an insulating layer such as an oxide is placed between the primary power buses and the circuitry of the input/output buffers to avoid any undesired contact. From block 2410 of FIG. 24, the logic flows to block 2306 of FIG. 23.

Figure 26:
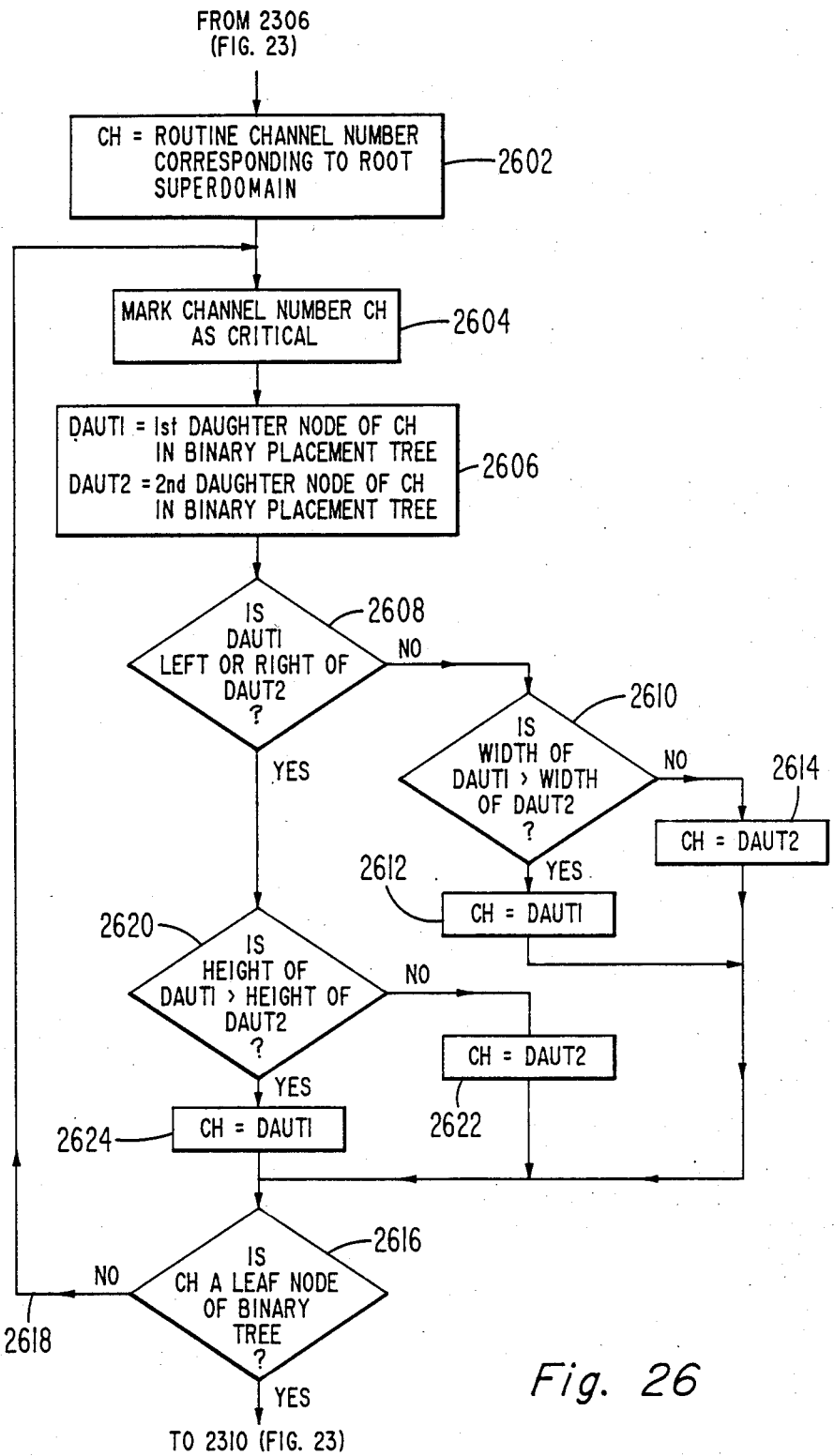
FIG. 26 is a flowchart illustrating details of a portion of the flowchart of FIG. 23, relating to determining which of the wire channels are critical to the size of the chip.

In block 2306, running variable M is set equal to the number of standard cell domains and macrocells which are the leaf nodes of the binary tree. Block 2308 represents determination of the vertical and horizontal routing channels which are critical to the width and height of the chip, respectively. Details of block 2308 are illustrated in the flowchart of FIG. 26 and are described below. In general, block 2308 determines which of the routing channels will, if reduced in width, result in a reduction in the overall width or height of the chip. From block 2308, the logic flows to a further block 2310. In block 2310, a flag is set for all critical channels indicating that they have not been visited or evaluated. During the following processing, as each such critical routing channel is evaluated, the flag is updated to a "visited" condition.

From block 2310, the logic flows to a further block 2312, which is the first block of a logic loop which attempts to minimize the size of the chip by attempting to delete the portion of the power bus running within the critical routing channel, so long as the deletion does not materially affect the powering of the standard cells and macrocells. Block 2312 represents the selection of the best critical routing channel (J) from among the ones flagged as not having been visited. The best critical routing channel is defined to be the longest routing channel from among those not visited. Block 2314 represents the creation of a signal wire density profile at each location along the routing channel. This is further illustrated and described in conjunction with FIG. 28.

Figure 27:
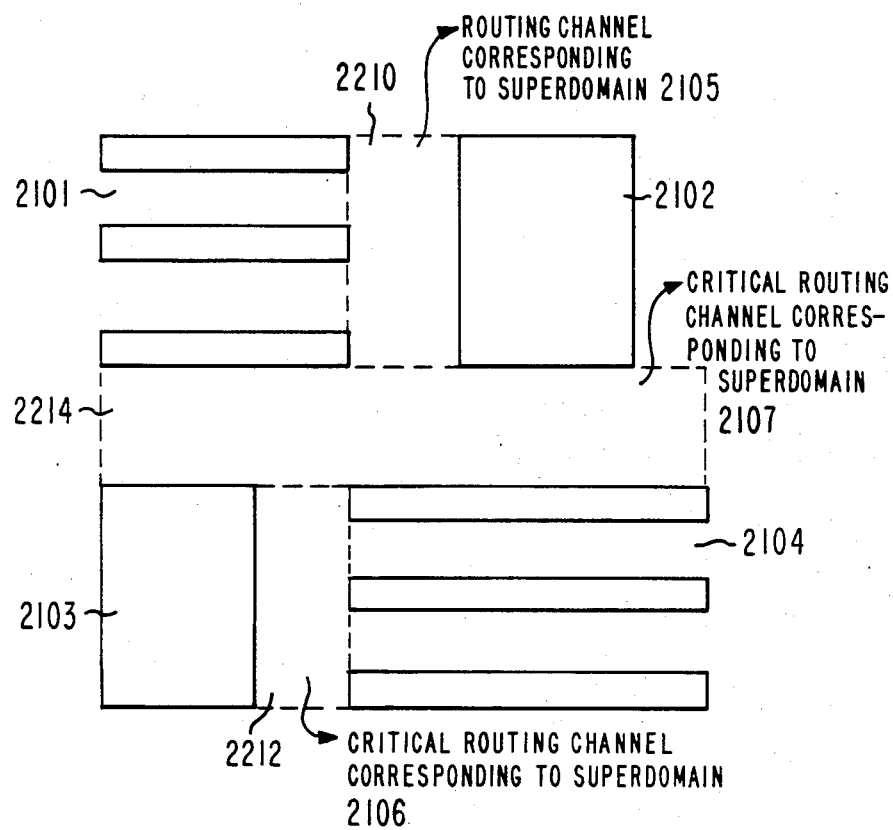
FIG. 27 represents the layout of FIG. 25, with different sizes of elements making up the nodes, to illustrate the reasons why certain wiring or routing channels are critical to the size of a chip.
Figure 28A:
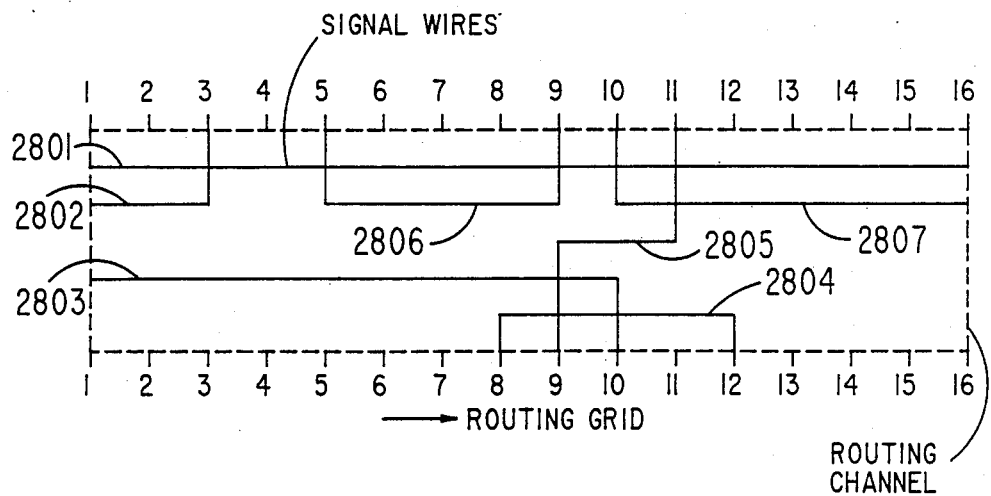
FIGS. 28a and 28b jointly referred to as FIG. 28, illustrate the principle of generation of a wiring density profile.
Figure 28B:
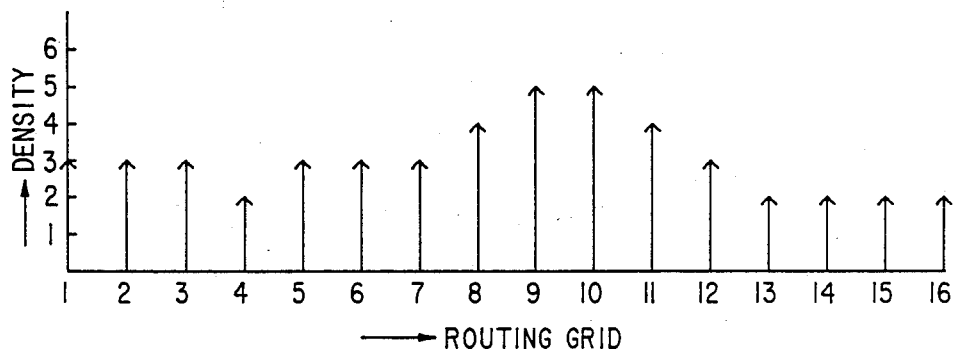

In FIG. 28a, a portion of a routing channel is illustrated and is surrounded by a dashed line. The routing channel includes portions of signal wires 2801–2807. A set of sixteen vertical grid lines (not explicitly illustrated) passes vertically through the routing channel at locations designated by the numbers 1–16 spaced along the upper and lower sides of the routing channel. Thus, each vertical gridline extends vertically from the numeral 1 below the routing channel of FIG. 27a to the numeral 1 above the routing channel. Grid line 1 intersects signal wires 2701, 2702, and 2703. FIG. 27b represents the signal wire density within the routing channel of FIG. 27a at the corresponding grid lines. Since grid line 1 of FIG. 27a intersects three signal wires in the routing channel, the density, illustrated by an arrow in FIG. 27b, has a length of three units at location 1. Similarly, grid line 2 of FIG. 27a also intersects wires 2701, 2702, 2703, and the signal wire density is also three at grid location 2. At grid line 4, only wires 2701 and 2703 are intersected, because wire 2702 terminates or leaves the wiring channel at grid line 3. Thus, the signal wire density at grid line 4, as illustrated in FIG. 27b decreases to the value 2. Continuing in this fashion, the density reaches a maximum at grid lines 9 intersects signal wires 2801, 2803, 2804, 2805, and 2806, and grid line 10 intersects signal wires 2801, 2803, 2804, 2805, and 2807.

From block 2314 of FIG. 23, the logic proceeds to block 2316. In block 2316, the power bus passing through the critical channel is evaluated to determine how many secondary or tertiary power buses terminate thereon along its length. This, in turn, determines the number of segments into which the power bus passing through the critical wiring channel is divided. A segment is defined as the portion of a power bus extending between connections to a secondary or tertiary power bus, or between the extremes of the bus and the intersection with a secondary or tertiary bus. Referring to FIG. 25, bus 2512′ extending horizontally includes three segments. Beginning at the left of bus 2512′, a first segment extends from the left-most extreme of the bus at the point at which it makes connection (by way of a through via) with secondary bus 2510″ to the point at which it is intersected by tertiary power bus 2516′. Those skilled in the art will understand that, strictly speaking, buses 2512′ and 2516′ do not intersect, because they are at different metallization levels. However, for purposes of understanding segmentation, the buses may be considered to be at the same metallization level, i.e., they appear to be in the same plane as illustrated in FIG. 25. A second segment of bus 2512′ is that portion lying between the intersections with buses 2516' and 2514'. The third and final segment of bus 2512' extends from the intersection with tertiary bus 2514' to the right-most end of bus 2512', which is the point of intersection with secondary power bus 2510. By way of further example, bus 2508''' has four segments, lying between intersections with buses 2501'', 2508'', 2516, 2508, and 2501. In the vertical direction, bus 2510 has four segments, between the intersections with buses 2502', 2510', 2512', 2502'''. The intersections of bus 2510 with connections to macrocells or rows of standard cells are not counted for purposes of segmentation. Thus, vertical bus 2514 has only one segment. In block 2316, the number of segments associated with the power bus running through the critical wiring channel is set equal to N.

From logic block 2316 of FIG. 23, the logic flows to block 2318. Block 2318 represents the marking of all N power bus segments as "not visited." The logic flows from block 2318 to block 2320, which sets a variable $M'=1$. $M'$ is a running variable representing the number of power bus segments in the $J^{th}$ critical routing channel which have been evaluated. From block 2320, the logic enters a loop which evaluates each of the N power bus segments one by one. Block 2322 represents the selection of the best power bus segment from among those power bus segments which have not been visited. This segment is designated I. Details of the processing of block 2322 are illustrated in FIG. 30. Block 2324 represents temporary deletion of the $I^{th}$ power bus segment from the power bus distribution network currently being considered. Block 2326 represents determination of the source factor of the standard cell domains and macrocells of the pruned power distribution network. The source factor is defined in the same fashion as described below in conjunction with FIG. 30. From block 2326, the logic flows to a further block 2328, in which a variable K is set equal to one. Variable K represents a running variable which is incremented on each pass through the loop toward the value M of the total number of macrocells and standard cell domains. From block 2328, the logic flows to a decision block 2330, which is part of a loop which, for each standard cell or macrocell, compares the present source factor with a standard minimum value to determine if any source factor is less than the minimum prescribed value. If the present source factor of any standard cell domain or macrocell is not less than its corresponding minimum, the logic proceeds by the NO output to a further decision block 2332, which compares the current value of K with M, the total number of macrocells and standard cell domains. If they have not all been evaluated, the logic flows by the NO output of decision block 2332 to a further block 2334, in which K is incremented, and then returns to decision block 2330. Eventually, if the source factors are all satisfactory, all macrocells and standard cell domains will have been evaluated, and K will equal M, whereupon the logic leaves block 2332 by the YES output and a path 2333, and flows to a further block 2336. Block 2336 represents permanent deletion of the $I^{th}$ power bus segment from the present power bus distribution system to form a pruned power distribution system. From block 2336, the logic returns by a path 2338 to block 2308, to once again establish the next critical routing channel and to continue the pruning process.

If the pruning of the $I^{th}$ power bus segment reduces the source factor for any macrocell or standard cell domain below the minimum, the logic flows by the YES output from decision block 2330 of FIG. 23 to a further block 2340, which represents restoration of the $I^{th}$ power bus segment to the power bus distribution system. Block 2342 updates the flag which identifies the $I^{th}$ power bus segment as having been visited. Block 2344 updates the value of $M'$, the number of power bus segments in the $J^{th}$ critical routing channel which have been evaluated. Decision block 2346 compares the current value of $M'$ with N, the total number of segments in the critical wiring channel. If all of the segments have not yet been evaluated, the logic proceeds by the NO output and a logic path 2348 back to logic block 2322 to begin consideration of the next power bus segment which has not been visited.

When all of the power bus segments in the critical wiring channel have been evaluated, the logic proceeds by the YES output of decision block 2346 to a further block 2350, which marks the currently evaluated critical routing channel J as having been visited. Decision block 2352 determines whether all critical routing channels have been evaluated. If they have not been evaluated, the logic proceeds by a path 2354 back to logic block 2312 to select the next critical routing channel. This causes the evaluation and pruning process to be completed in sequence for all of the critical routing channels. Eventually, all of the power bus segments of each critical routing channels have been processed by either pruning or determining that they cannot be pruned, and the logic leaves decision block 2352 by the YES output. At this point, the logic then flows to block 244 of FIG. 2, which represents detailed signal wire routing in accordance with the aforementioned Sangiovanni article.

FIG. 26 illustrates details of the logic flow represented by block 2308 of FIG. 23. Block 2308 of FIG. 23, and corresponding FIG. 26, represent the logic required to determine which vertical and horizontal routing channels are critical to the size of the chip. In FIG. 26, the logic arrives from block 2306 of FIG. 23 at a block 2602, which represents the identification as CH of the routing channel which corresponds to the root superdomain. This can be further better understood by reference to FIG. 27, which is similar to FIGS. 22 and 25. In FIG. 27, elements corresponding to those of FIGS. 22 and 25 are designated by the same reference numerals. In FIG. 27, the entirety of the FIGURE including macrocells 2102 and 2103, and standard cell domains 2101 and 2104, together constitute a root superdomain 2107. Since root superdomain 2107 (see FIG. 21) is made up of top-bottom placed daughter superdomains 2105 and 2106, the routing channel associated with the root superdomain is that routing channel, illustrated as 2214, which passes horizontally between top daughter superdomain 2105 and bottom daughter superdomain 2106. Thus, channel 2214 in FIG. 27 would be identified as CH in block 2602 of FIG. 26. Naturally, if the daughter superdomains of the root superdomain were placed left-right, the channel associated or corresponding to the root superdomain would be vertical rather than horizontal. Channel 2214 is critical to the vertical size of the chip, because reducing the width (the vertical dimension) of the channel reduces the vertical size of the chip.

From block 2602, the logic flows to a further block 2604, which is the first block of a logic loop which descends through the binary tree, and which during the descent identifies those channels which are critical. Block 2604 marks channel CH as critical, because the channel associated with the root superdomain is always critical, as mentioned.

From block 2604, the logic flows to a further block 2606, which arbitrarily identifies as DAUT1 the first daughter node of node CH in the binary tree, and identifies as DAUT2 the second daughter node of CH. Referring to FIG. 21, these correspond to superdomain 2105 and 2106. From block 2606 of FIG. 26, the logic flows to a decision block 2608, in which a decision is made as to whether DAUT1 is to the left or right of DAUT2. If DAUT1 and DAUT2 are not in a left-right configuration, by default, daughter node 1 must be in a top-bottom relation with daughter node 2. This is the configuration of FIGS. 21, 22, 25 and 27. For a top-bottom daughter node configuration, the logic flows by the NO output of decision block 2608 to a further decision block 2610, in which the width of daughter node 1 is compared with the width of daughter node 2. This is significant, because in a top-bottom configuration, the width of the nodes determines the next critical routing channel. For example, in FIG. 27, upper daughter node 2105 (DAUT2) consisting of standard cell domain 2101 and macrocell 2102, is narrower in width than daughter node 2106, (DAUT1) which includes macrocell 2103 and standard cell domain 2104. In the horizontal direction, therefore, the size of the chip is established by daughter node 2106, and not by daughter node 2105. Decreasing the width of channel 2210 passing vertically between domain 2101 and macrocell 2102 will not reduce the width of the chip, and therefore channel 2210 is not critical. On the other hand, lower daughter node 2106 (macrocell 2103 and domain 2104), being wider than upper daughter node 2105, determines the width of the chip. Reducing the width of daughter node 2106 by reducing the width (the horizontal dimension) of channel 2212 reduces the width of lower node 2106, and therefore reduces the width of the chip. Thus, vertical channel 2210 is not critical, and vertical channel 2212 is critical. If daughter node 1 is greater in width, then the identification of CH is updated in block 2612 to identify DAUT1 by designating it as CH. On the other hand, if the width of DAUT1 is less or equal to than the width of DAUT2, the logic leaves decision block 2610 by the NO output and flows to a further block 2614. In block 2614, CH is updated to identify DAUT2. The outputs of decision blocks 2612 and 2614 merge, and flow to a decision block 2616. Decision block 2616 decides if CH is a leaf node of the binary tree, which would mean that marking of all the critical channels has been completed. If CH is not a leaf node, the logic returns by a path 2618 to block 2604.

If decision block 2608 decides that DAUT1 is to the left or right of DAUT2, the logic flows by the YES output to a further decision block 2620, in which the height of DAUT1 is compared with the height of DAUT2. If the height of DAUT1 is not greater than the height of DAUT2, the logic flows by the NO output to a further block 2622, in which CH is updated to identify DAUT2. On the other hand, if DAUT1 is greater than the height of DAUT2, the YES output of decision block 2620 directs the logic to block 2624, in which CH is updated to identify DAUT1. The logic outputs of blocks 2622 and 2624 merge with the outputs of blocks 2612 and 2614 and flow to decision block 2616. So long as the last node to be evaluated is not a leaf node, decision block 2616 causes looping through the logic of FIG. 26. Eventually, all critical channels have been evaluated, and the logic leaves decision block 2616 by the YES output, and the logic returns to block 2310 of FIG. 23.

Figure 29:
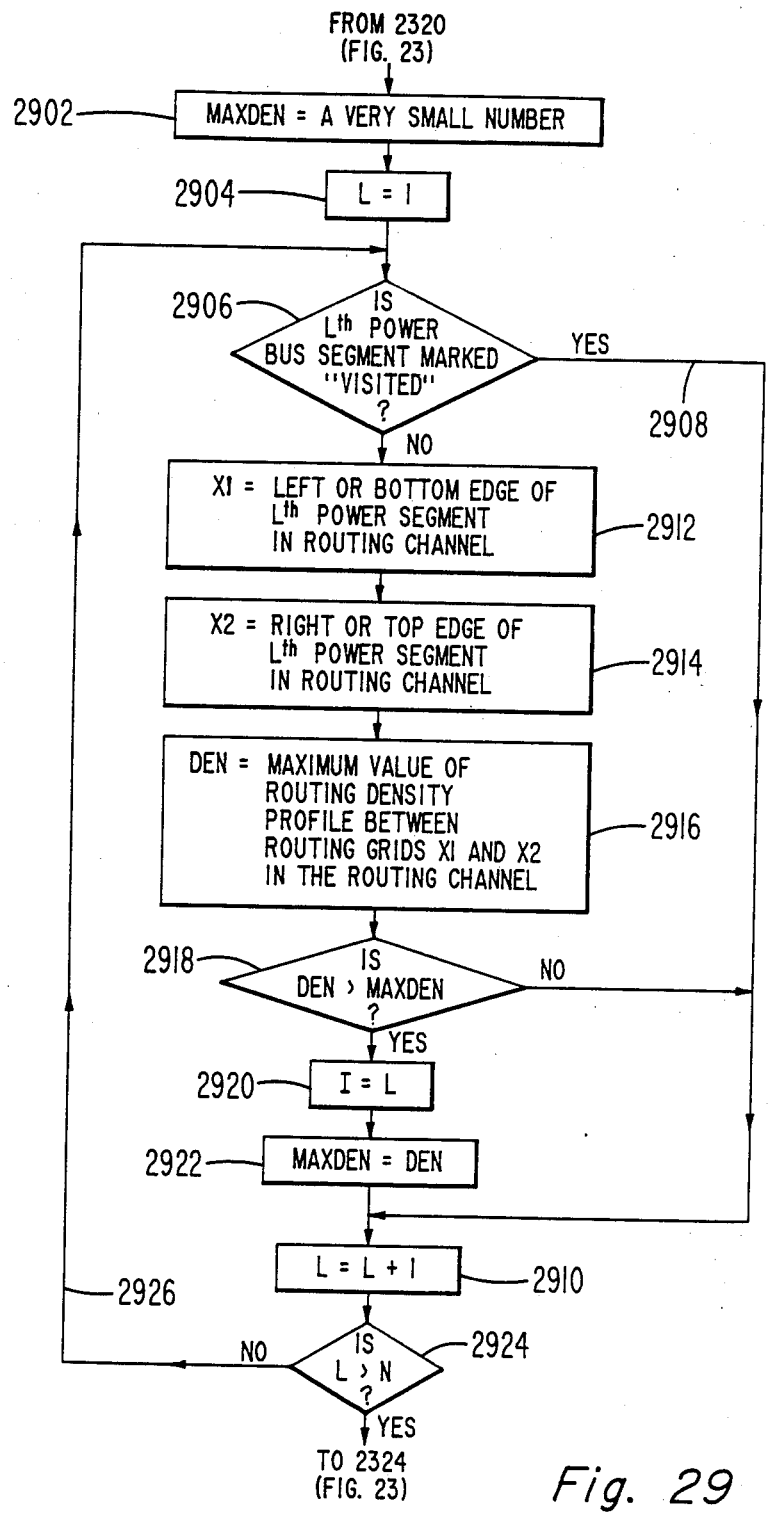
FIG. 29 illustrates details of a portion of the flowchart of FIG. 23, relating to selection for further evaluation of that segment of a power distribution bus within a critical wiring channel which contains the portion having the highest signal wiring density.

FIG. 29 represents details of the logic flow of logic block 2312 of FIG. 23. In general, the logic flow of block 2312 of FIG. 23 and of corresponding FIG. 29 represents selection of the segment of the critical routing channel having the highest signal wiring density (the "best" segment) from among the ones not yet visited. This allows the most critical portions of each critical wiring channel to be evaluated first. The logic arrives at a block 2902 of FIG. 29, in which a variable MAXDEN, representing the maximum density of signal wires in the routing channel, is set to a very small number. Block 2904 sets a variable L equal to 1. L is a running variable which counts the number of power bus segments in the $J^{th}$ critical routing channel. The logic flows to a decision block 2906 in which a decision is made as to whether the $L^{th}$ power bus segment has been visited. If it has been visited, the logic leaves decision block 2906 by the YES output and flows by a logic path 2908 to a block 2910, in which the value of L is incremented. On the other hand, if the $L^{th}$ power bus segment has not been visited, the logic leaves decision block 2906 by the NO output and flows to a further block 2912. Block 2912 represents the identification of the beginning of the power bus routing segment within the channel by identification of the grid point or points X1 as being the left-most end of horizontally-extending segments or the bottom end of vertically-extending power bus segments. Block 2914 identifies the end of the power bus segment as the grid point or grid points X2 corresponding to the right-most end of horizontally-extending segments or the top end of vertically-extending segments.

Once the ends of the power bus segment have been identified, the logic flows to a further block 2916. The variable DEN is set equal to the maximum value of the signal wiring density profile, as explained in conjunction with FIG. 28, between routing grids X1 and X2, i.e., between the beginning and ends of the segment of the power bus.

From block 2916, the logic flows to a further decision block 2918, in which variable DEN is compared with the variable MAXDEN, the preset value. On the first iteration, variable DEN will always be greater than the preset value MAXDEN, and the logic will leave block 2918 by the YES output to a block 2920, in which I, the segment of the power bus associated with the routing channel having the highest signal wire density, is set equal to L, the one segment currently being evaluated. On the other hand, if variable DEN is not greater than MAXDEN, which may occur on subsequent iterations, the logic leaves block 2918 by the NO output and proceeds by logic path 2908 to block 2910.

From block 2920 in which the $I^{th}$ power bus segment was identified as the one having the presently highest density, the logic flows to a further block 2922, in which the currently maximum density MAXDEN is updated to the current value of DEN. The logic flows from block 2922 to block 2910, and then to decision block 2924. Decision block 2924 compares the current value of L with variable N, which is the number of segments in the channel. If all segments in the channel have not been evaluated, the logic returns by the NO output of block 2924 and logic path 2926 to decision block 2906 to continue the evaluation. When all segments of the channel have been identified, the logic proceeds by the YES output of decision block 2924 to block 2324 of FIG. 23.

The description of the source factor determination for block 2302 of FIG. 23 and for block 2326 and 2330 of FIG. 23 is described in conjunction with FIG. 30. A macrocell or a standard cell domain is considered to be powerable from a power pad, such as power pads 2504′′′′ or 2506′′′′ of FIG. 25, if a direct path exists by way of the power bus distribution network, which is independent of another power pad. Independent means that the direct path does not pass through or under another power pad or the electrical equivalent of another power pad. Thus, a direct power path may be by way of one or more tertiary power buses, a second power bus and the associated vias, and the like. The number of power pads which can be reached in such a direct manner is termed the source factor of the particular standard cell domain or macrocell under consideration. It should be noted, however, that powering of any element requires a pair of buses, one positive and one negative. Therefore, it also requires at least one pair of power pads. The logic arrangements as described above handle these buses and power pads in pairs, so that powering is always available by a pair. The source factor may be handled and calculated by the number of discrete power pads, or by the number of discrete power pad pairs, these being equivalent measures.

Figure 30A:
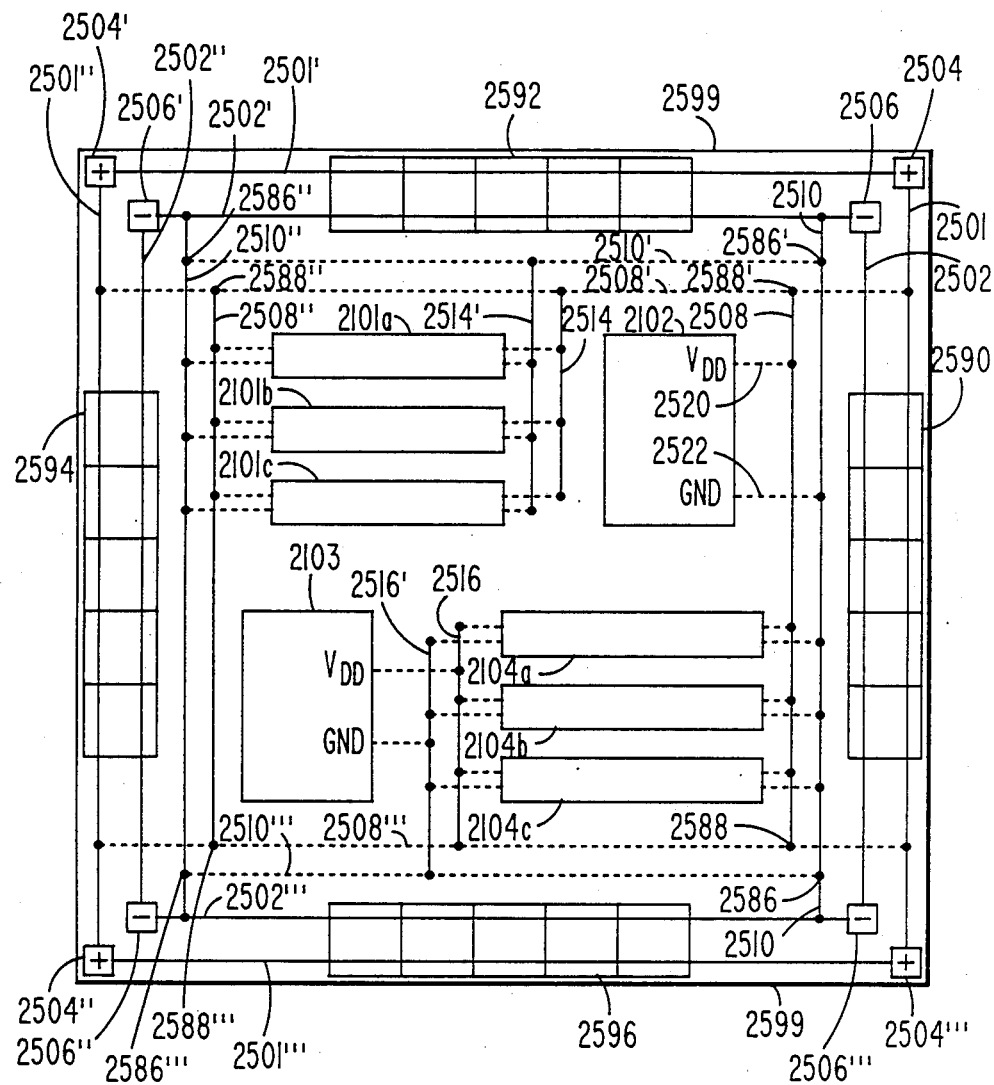
FIGS. 30a and 30b, referred to jointly as FIG. 30, represent the layout of FIG. 25 modified by pruning of bus segments, as an aid to understanding the source factor.
Figure 30B:
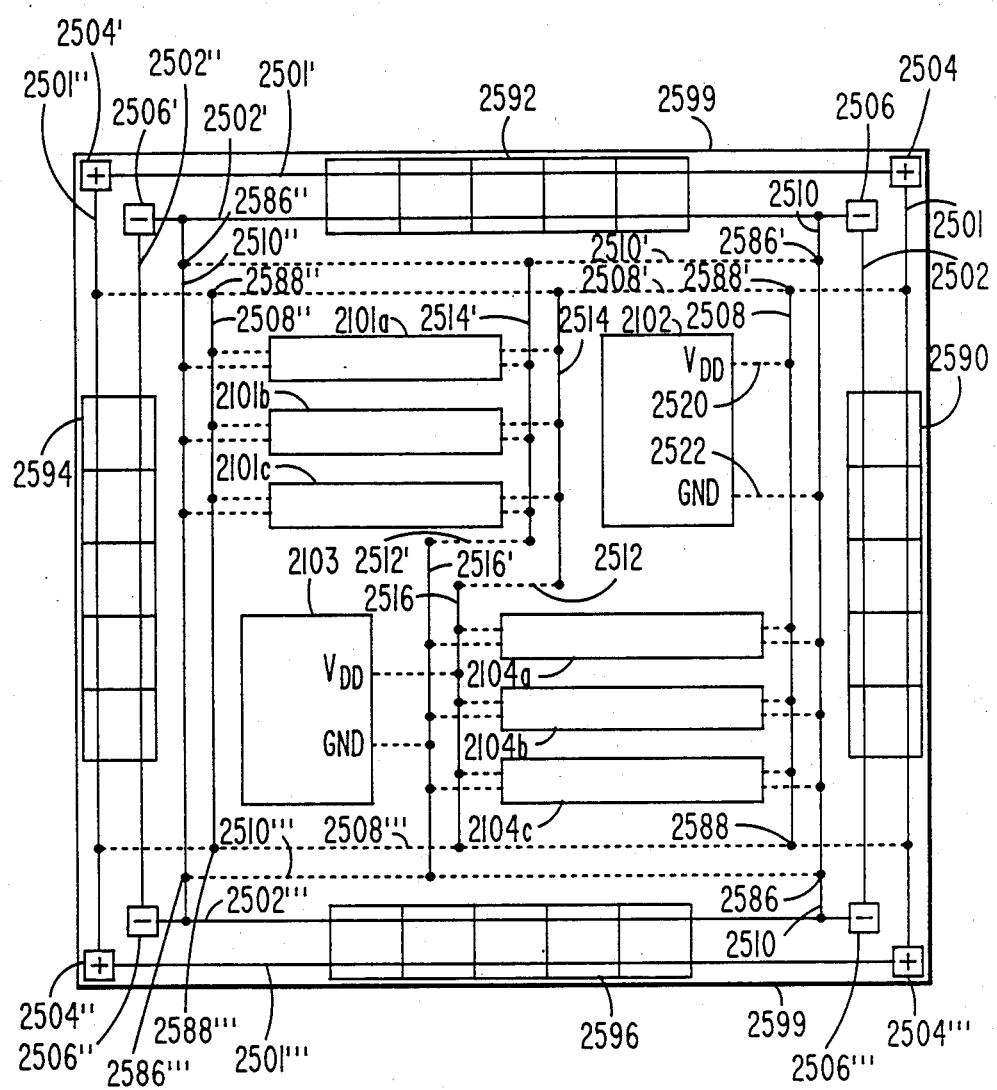

FIG. 30a represents the power bus distribution structure of FIG. 25 pruned of certain tertiary bus segments by the process described above. In FIGS. 30a and 30b, elements corresponding to those of FIGS. 22, 24 or 25 are designated by the same reference numerals. In FIG. 30a, macrocell domain 2103 is powered by positive and negative tertiary power buses 2516, 2516′, which in turn are connected at their lower ends to buses 2508′′′′ and 2510′′′′, respectively. Buses 2508′′′′ and 2510′′′′, in turn, are powered from nodes 2586 and 2588 at their right ends, and by nodes 2586′′′ and 2588′′′ at their left ends. As mentioned above, these node points are electrically equivalent to the nearby power bonding pads, because of the short path lengths and large conductors between the power bonding pads and the node points. Thus, macrocell 2103 is sourced from or receives power from two pairs of power pads, i.e., 2504′′, 2506′′, and 2504′′′ and 2506′′′. However, even though nodes 2586′ and 2588′ are connected to power bonding pads 2504, 2506, the resistances of the relatively long primary power buses 2508 2510 are such that these paths are relatively insignificant in supplying power to macrocell 2103 compared with power bonding pads 2504′′, 2506′′, 2504′′′, and 2506′′′. Thus, macrocell 2103 is effectively powered from only two pairs of power bonding pads, and its source factor is therefore two. In an arrangement such as that of FIG. 30a, having four pairs of power bonding pads, the maximum source factor is four. Obviously, the absolute minimum source factor is one. However, higher minimum values of source factor may be preestablished as described below, depending upon the current requirements of the circuits being powered.

FIG. 30b represents a slightly different pruned power bus distribution system than FIG. 30a. In the arrangement of FIG. 30b, macrocell 2103 is powered from nodes 2586, 2588 and 2586′′′, 2588′′′ as in FIG. 31a. However, in the arrangement of FIG. 30b, bus pair 2516, 2516′ is also connected by way of a segment of bus pair 2512, and by bus pair 2514, to secondary power pair 2508′, 2510′. Secondary power buses 2508′, 2510′ are, in turn, powered from nodes 2586′, 2588′, and 2586′′, 2588′′. Thus, macrocell 2103 is additionally powered independently from power bonding pad pairs 2504, 2506; 2504′, 2506′: Macrocell 2103 is therefore powered directly from all four power bonding pad pairs, and its source factor is therefore four.

In order to determine the minimum source factor for each standard cell domain or macrocell, the worst-case maximum transient current is determined or is specified by the supplier of the macrocell or standard cells, as part of the standard technology information. In the case of standard cell domains, the maximum current for each of the cells is summed for all the cells of the domain to produce the worst-case maximum current of the standard cell domain. A judgment factor must be applied to determine how many power bonding pads are required to supply power. For CMOS technology, the values which have been found to be satisfactory are up to 250 mA per bonding pad pair. Thus, a macrocell or standard cell domain requiring up to 250 mA requires only a source factor of unity, whereas a domain or macrocell requiring 500–750 mA requires a source factor of 3.

What is claimed is:

1. A method for layout of a power bus distribution structure for the target surface of a large scale integrated circuit which includes macrocells and domains of standard logic cells arranged in rows, comprising the steps of:

predetermining minimum values of source factor for all standard cell domains and macrocells to produce predetermined minimum values;

generating a complete power bus distribution structure including routing channels associated with elements of said complete power bus distribution structure, said routing channels being adjacent the sides of macrocells and standard cell domains, said routing channels being adapted for carrying signal wires and wires of said power bus distribution structure;

determining those routing channels which are critical to the size of said target area to identify critical routing channels;

selecting one of said critical routing channels to identify a selected critical routing channel;

creating, if not already created, a profile of signal wire routing density for at least said selected critical routing channel;

subdividing into segments at least that portion of said power bus distribution structure routed through said selected critical routing channel, said segments having ends intersecting orthogonal portions of said power bus distribution structure;

identifying as a highest density segment, from among said segments of said power bus distribution system routed through said selected critical routing channel, that one segment not yet processed which is associated with the largest of said signal wire routing densities;

temporarily deleting said highest density segment of said power bus distribution structure from said power bus distribution structure to form a temporarily segment pruned power bus distribution structure;

calculating the present source factors for the macrocells and standard cell domains of said temporarily segment pruned power bus distribution structure;

comparing said present source factors of said macrocells and standard cell domains of said temporarily segment pruned power bus distribution structure with said predetermined minimum values, and if any one of the present source factors is less than the corresponding predetermined minimum value, restoring said temporarily deleted highest density segment, and if said present source factors of said macrocells and standard cell domains are all greater than their corresponding predetermined minimum values, permanently deleting said highest density segment to produce a segment pruned power bus distribution structure;

repeating said step of (a) identifying as a highest density segment, (b) temporarily deleting, (c) calculating and (d) comparing, until all power bus segments within said selected critical routing channel have been processed to form a routing channel pruned bus distribution structure; and repeating said steps of (a) determining those routing channels which are critical, (b) selecting one of said critical routing channels, (c) creating a profile, (d) subdividing into segments, (e) identifying as a highest density segment, (f) temporarily deleting, (g) calculating, (h) comparing, and (i) repeating, until no further pruning is possible.

2. A method according to claim 1 wherein said large scale integrated circuit is provided with at least first and second different metallization levels, and wherein said step of generating a complete power bus distribution structure comprises the steps of:

grouping together standard logic cells to produce standard cell domains;

identifying macrocells as domains;

generating lower level superdomains by grouping together standard cell domains with other standard cell domains, standard cell domains with macrocells, and macrocells with macrocells;

generating higher level superdomains by grouping lower level superdomains with standard cell domains, macrocells or other lower level superdomains;

placing macrocells and standard cell domains on said target surface in a right-left, top-bottom topological configuration, with vertical and horizontal interdomain channels between adjacent domains, between adjacent superdomains, between superdomains and domains, between superdomains and macrocells, and between macrocells and domains, whereby said interdomain channels may be vertical or horizontal;

inscribing within the outermost boundary of said target area with a pair of parallel first metallization level positive and negative primary power buses to form a primary portion of said power bus distribution structure;

placing input-output signal buffer circuits adjacent said outermost boundary of said target area, and connecting said signal buffer circuits to said pair of first metallization level positive and negative primary power buses;

providing at least one pair of power bonding pads, at each of first and second locations about said outermost boundary of said target area, each of said pairs of power bonding pads including a positive power bonding pad connected at a positive power supply node to said positive primary power bus, and also including a negative power bonding pad connected at a negative power supply node to said negative primary power bus;

identifying a secondary region of said target area surrounded by said primary buses;

inscribing within the outermost boundary of said secondary region a pair of parallel positive and negative secondary power buses, those portions of said secondary power buses directed vertically being at one of said first and second metallization levels, and those portions of said secondary power buses directed horizontally being at the other one of said first and second metallization levels;

connecting said positive and negative primary power buses to those of said positive and negative secondary power buses, respectively, which are at the same one of said first and second metallization levels;

connecting said positive and negative secondary power buses at the other one of said first and second metallization levels, by way of through vias, to said positive and negative secondary power buses, respectively, which are at said one of said first and second metallization levels;

defining a complete tertiary power bus distribution structure within the region bounded by said secondary power buses, said tertiary power bus distribution structure including a pair of tertiary positive and negative buses routed at said one of said first and second metallization levels through each of said vertical interdomain channels, and a pair of tertiary positive and negative power buses routed at said other one of said first and second levels through each of said horizontal interdomain channels;

interconnecting said tertiary power buses at said other level by way of through vias with said secondary and tertiary power buses at said one level only at locations which are at the extreme end of at least one of said secondary and tertiary power buses, said tertiary positive power buses being interconnected with secondary positive buses and also being interconnected with other tertiary positive power buses, and tertiary negative power buses being interconnected with secondary negative power buses, and also being interconnected with other tertiary negative power buses;

routing quarternary conductors from said secondary and tertiary buses to said macrocells and to the rows of said standard logic cells in said standard logic cell domains.

3. A method according to claim 2 wherein said quarternary conductors running vertically are formed at said one of said first and second metallization levels, and said quarternary conductors running horizontally are formed at the other one of said first and second metallization levels.

4. A method according to claim 3 wherein said rows of standard logic cells in said standard cell domains are all oriented horizontally, and said quarternary conductors coupled to said standard cell domains are horizontal runs to at least one end of each of said rows of standard logic cells.

5. A method according to claim 2, wherein said step of calculating the present source factors for the macrocells and standard cell domains comprises the further step of:

counting the number of said positive and negative power bonding pad pairs which can supply power to the one of said macrocells and standard cell domains under consideration directly and not by way of one of a further power bonding pad pair and equivalents of a further power bonding pad pair.

6. A method according to claim 1, wherein said step of predetermining minimum values of source factor comprises the steps of:
   determining the maximum current drain of each macrocell and standard cell domain;
   for each macrocell and standard cell domain, establishing the number N of whole or partial increments of A amperes of current which are included in said maximum current drain; and
   assigning N as the source factor of the circuit under consideration.

7. A method according to claim 6 wherein said increment of A amperes is 1/4 ampere.

8. A method according to claim 1, wherein said step of creating a profile of signal routing density is performed for all routing channels preceding said step of determining those routing channels which are critical to the size of said target area.

9. A method according to claim 8, wherein said target area is subdivided by a coordinate system of orthogonal grid lines, and wherein said step of creating a profile of said routing density comprises the step of counting the number of wires within each routing channel intersecting each grid line orthogonal to the length of each segment of said routing channel.

10. A method according to claim 1 wherein said step of subdividing into segments is performed preceding said step of determining those routing channels which are critical to the size of said target area, and said step of subdividing into segments is performed for all critical routing channels.

11. A method according to claim 10 wherein said step of subdividing into segments includes the further steps of:
   for each critical routing channel, determining the locations of the intersections with orthogonal routing channels; and
   identifying as a segment (a) that portion of each wiring channel lying between two adjacent intersections and (b) tat portion of each routing channel lying between an end of each routing channel and an adjacent intersection.

12. A method according to claim 1, wherein said large scale integrated circuit is laid out as an assemblage of left-right, top-bottom combinations of nodes of progressive order defining a binary tree, each parent node of which is formed from only two daughter elements, and wherein said step of determining those routing channels which are critical to the size of said target area comprises the further steps of:
   determining the height and width of said target area;
   determining the height and width of each of said routing channels;
   identifying as the root critical routing channel that routing channel lying between the daughter nodes of the root node of said binary tree;
   determining which daughter node includes the next lower order critical routing channel by selecting that daughter node which is widest for top-bottom placed daughter nodes, and by selecting that daughter node which is tallest for right-left placed daughter nodes, to produce a selected daughter node;
   identifying as another critical routing channel that channel associated with said selected daughter node; and
   repeating said steps of (a) determining which daughter node and (b) said identifying as another critical routing channel, steps until said selected daughter node is a leaf node of said binary tree.

13. A method according to claim 1 wherein said step of selecting one of said routing channels which is critical to the size of said target area comprises the further step of:
   ordering said routing channels according to length; and
   identifying as said selected critical routing channel that one routing channel having the greatest length, and if a plurality have said greatest length, identifying as said selected critical routing channel that one having the greatest number of segments.

14. A method according to claim 1, wherein said target area is subdivided by a coordinate system of orthogonal grid lines, and wherein said step of creating a profile of said routing density comprises the step of counting the number of wires within each routing channel intersecting each grid line orthogonal to the length of each segment of said routing channel.

15. A method according to claim 1 wherein said step of subdividing into segments includes the further steps of:
   for each critical routing channel, determining the locations of the intersections thereof with orthogonal routing channels; and
   identifying as a segment (a) that portion of each wiring channel lying between two adjacent intersections and (b) that portion of each routing channel lying between an end of each routing channel and an adjacent intersection.

16. A method according to claim 1, wherein said target area is subdivided by a coordinate system of orthogonal grid lines, and wherein said step of identifying as a highest density segment comprises the further steps of:
   counting the number of wires within each segment intersecting each of said grid lines which is orthogonal to the length of said segment of said routing channel;
   for each segment of said routing channel, identify that one segment containing the maximum number of wires intersecting a grid line as said highest density segment; and
   selecting that one power bus segment associated with said highest density routing channel segment as a highest density segment.

* * * * *